(12) United States Patent
Shimizu et al.

(10) Patent No.: US 7,535,310 B2
(45) Date of Patent: May 19, 2009

(54) DISTORTION COMPENSATION CIRCUIT

(75) Inventors: Yoshito Shimizu, Kanagawa (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 11/569,970

(22) PCT Filed: Jun. 27, 2005

(86) PCT No.: PCT/JP2005/011770

§ 371 (c)(1),
(2), (4) Date: Dec. 4, 2006

(87) PCT Pub. No.: WO2006/001433

PCT Pub. Date: Jan. 5, 2006

(65) Prior Publication Data

US 2007/0229180 A1    Oct. 4, 2007

(30) Foreign Application Priority Data

Jun. 29, 2004 (JP) .............................. 2004-191342
Dec. 14, 2004 (JP) .............................. 2004-361591
Apr. 28, 2005 (JP) .............................. 2005-132398

(51) Int. Cl.
H03C 3/00 (2006.01)
H03F 1/32 (2006.01)
H03F 3/24 (2006.01)
H04B 1/04 (2006.01)
H04L 27/20 (2006.01)

(52) U.S. Cl. ...................................... 332/103; 375/308

(58) Field of Classification Search ......... 332/103–105; 375/302, 308

See application file for complete search history.

(56) References Cited

U.S. PATENT DOCUMENTS

| 6,194,963 | B1 | 2/2001 | Camp, Jr. et al. |
| 6,624,712 | B1 | 9/2003 | Cygan et al. |
| 7,274,748 | B1 * | 9/2007 | Khlat .......................... 375/296 |
| 2002/0177420 | A1 | 11/2002 | Sander et al. |

(Continued)

FOREIGN PATENT DOCUMENTS

JP        61-214843        9/1986

(Continued)

OTHER PUBLICATIONS

Kenington, "High Linearity RF Amplifier Design", Artech House Publishers, p. 162, 1978.

(Continued)

*Primary Examiner*—David Mis
(74) *Attorney, Agent, or Firm*—Pearne & Gordon LLP

(57) ABSTRACT

A distortion compensating circuit is provided in which, in the polar modulation system, while suppressing increase of compensation data and increase of the circuit scale, a modulated signal can be correctly expressed, or low-distortion characteristics of a power amplifier can be realized.

Based on a steady characteristic compensating circuit 11 which stores an output signal amplitude and output phase characteristics with respect to a control voltage in a steady state, amplitude adjustment is executed on amplitude information $r11(t)$ on which amplitude correction is performed, by a first amplitude information adjusting portion 13, whereby the output-response characteristics of an output signal amplitude of an amplifier with respect to a change of the control voltage can be improved.

39 Claims, 32 Drawing Sheets

U.S. PATENT DOCUMENTS

2004/0037364 A1  2/2004  Gagey et al.

FOREIGN PATENT DOCUMENTS

| JP | 5-152977 | 6/1993 |
| JP | 07 307631 A | 11/1995 |
| JP | 10-150393 A | 6/1998 |
| JP | 2001-268144 A | 9/2001 |
| JP | 2001-339253 A | 12/2001 |
| JP | 2001-345645 A | 12/2001 |
| JP | 2002-152060 A | 5/2002 |
| JP | 2002-530992 | 9/2002 |
| JP | 2003-152563 | 5/2003 |
| JP | 2004-501527 | 1/2004 |
| WO | 03-021767 A1 | 3/2003 |

OTHER PUBLICATIONS

"3GPP TS 05.05 version 8.9.0 Release", ETSI, 1999, pp. 10-13.

European Search Report.

* cited by examiner

| POWER CLASS | POWER CONTROL LEVEL | OUTPUT POWER (dBm) |
|---|---|---|
| E1 | 5 | 33 |
| -- | 6 | 31 |
| -- | 7 | 29 |
| E2 | 8 | 27 |
| -- | 9 | 25 |
| E3 | 10 | 23 |
| -- | 11 | 21 |
| -- | 12 | 19 |
| -- | 13 | 17 |
| -- | 14 | 15 |
| -- | 15 | 13 |
| -- | 16 | 11 |
| -- | 17 | 9 |
| -- | 18 | 7 |
| -- | 19-31 | 5 |

DISTORTION COMPENSATION CIRCUIT

TECHNICAL FIELD

The present invention relates to a distortion compensating circuit which compensates distortion of an output signal of an amplifier that drives a control voltage to control the amplitude of the output signal with respect to a predetermined amplitude of an input high-frequency signal.

BACKGROUND ART

In a recent mobile phone service, a demand for data communication in addition to a voice call is increasing, and hence improvement of the transmission speed is important. In the GSM (Global System for Mobile communications) system which is in widespread use mainly in Europe and Asia, for example, a voice call is conventionally performed by the GMSK modulation in which the phase of a carrier is shifted in accordance with transmission data. However, the EDGE (Enhanced Data rates for GSM Evolution) system has been proposed in which also data communication is performed by $3\pi/8$ rotating 8-PSK modulation (hereinafter, abbreviated to 8-PSK modulation) in which bit information per symbol is enhanced by three times as compared with the GMSK modulation by shifting the phase and amplitude of a carrier in accordance with transmission data.

In a linear modulation system involving amplitude variation, such as the 8-PSK modulation, a request for linearity of a power amplifier of a transmitting portion of a radio apparatus is severe. Usually, the power efficiency in a linear region of a power amplifier is lower than that in a saturation region. When the related quadrature modulation system is applied to a linear modulation system, therefore, it is difficult to improve the power efficiency.

Therefore, a system which is called the EER method (Envelope Elimination & Restoration) or the polar modulation system, and in which improvement of the power efficiency of a power amplifier is realized by a linear modulation system is known (for example, see Non-patent Reference 1). In the system, a transmission signal is separated into a constant-amplitude phase signal and an amplitude signal, phase modulation is applied by a phase modulator on the basis of the constant-amplitude phase signal, a constant-amplitude phase-modulated signal having a level at which a power amplifier operates in saturation is input, and a control voltage of the power amplifier is driven at high speed, thereby synthesizing amplitude modulation. Hereinafter, in order to clarify that the modulation system is different from the quadrature modulation system, the system is referred to as polar modulation system.

FIG. 26 is a view which is obtained by extracting and plotting a 200 to 400 [μs] portion in one time slot (577 [μs]) of the GSM relating to an amplitude signal in the 8-PSK modulation. In FIG. 26, the abscissa indicates the time elapsed after the start of the time slot, and the ordinate indicates the amplitude of the amplitude signal.

FIG. 27 is a view which is obtained by plotting passing phase characteristics in the case where a control voltage which is gradually changed (monotonically increased or decreased) with respect to the elapse of time is applied to a power amplifier. In FIG. 27, the abscissa indicates the normalized control voltage, and the ordinate indicates the passing phase rotation amount with reference to the normalized control voltage of 1. The solid line in the figure shows passing phase characteristics in the case where the normalized control voltage is gradually changed in monotonic increase from a low voltage (0) to a high voltage (1) (rising characteristic), and the broken line in the figure shows passing phase characteristics in the case where the normalized control voltage is gradually changed in a monotonic decrease from the high voltage (1) to the low voltage (0) (falling characteristic). Both the solid and broken lines show the case where an input high-frequency signal amplitude (the same value) having a level at which the power amplifier operates in saturation is supplied.

In the polar modulation system, a constant-amplitude phase-modulated signal is input to a power amplifier, and hence the power amplifier can be used at the saturation operating point. This is advantageous from the viewpoint of the power efficiency. In order to express an amplitude signal such as shown in FIG. 26 in which a point of pole inflection of the maximum value and the minimum value of the amplitude exists within 2 [μs], however, the control voltage of the power amplifier must be driven at high speed. Because of differences in charging and discharging tomes with respect to the capacitance (including the parasitic capacitance) in a control-voltage input portion of the power amplifier, even when the change width of the control voltage has the same value, the phase change amount is different in the cases where, as shown in FIG. 27, the conditions of application of the control voltage change from the low voltage to the high voltage, and where the conditions change from the high voltage to the low voltage. Namely, the phase characteristics change at the signal change point. Therefore, a technique for improving the output-response characteristics of the power amplifier with respect to the input control voltage (a technique for linearizing an output) is required.

Next, in the GSM system, the radius of a cell to be covered by a base station is large, and hence the specified value of the maximum transmission power for a mobile station transmitting apparatus is high. In order to reduce the power consumption of the mobile station transmitting apparatus, therefore, the transmission power of the mobile station transmitting apparatus is controlled in accordance with the distance between a base station and a mobile station. For example, FIG. 28 is a view showing a transmission power regulation for a mobile station transmitting apparatus. In the figure, the power control levels 5 to 31 in the case where a mobile station transmitting apparatus corresponding to the GSM 900 MHz band transmits an 8-PSK modulated wave are excerpt from power control levels of a transmission power regulation in uplink to a mobile station transmitting apparatus stipulated in GSM standard "Digital cellular telecommunications system (Phase 2+); Radio transmission and reception (3 GPP TS 05.05 version 8.9.0 Release 1999)". In the 8-PSK modulation, power classes E1 to E3 are maximum output powers, and a power control is performed on an output power which is equal to or lower than them.

In the polar modulation system, as means for performing the power control, usually, the control voltage of the power amplifier is adjusted so as to attain a desired output power.

In the polar modulation system, however, the amplitude of an input high-frequency signal to the power amplifier is set to be large so that the operating point of the power amplifier is in the saturation region. In the case where the output signal amplitude is suppressed by adjusting the control voltage, therefore, the depletion layer capacitance between the base and collector terminals of a transistor constituting the power amplifier is increased, and leakage components of the input high-frequency signal are increased. Due to the leakage components, there arise problems in that the output signal amplitude cannot be reduced to a predetermined value or smaller, and that the passing phase amount is largely changed.

Therefore, also a technique for linearizing the output of the power amplifier when the transmission power is reduced is required.

From the above, in the polar modulation system, a technique for compensating the nonlinearity of a power amplifier due to that the control voltage is driven at high speed, and that the transmission power is controlled by using a saturation power amplifier is required. Next, the related art relating to the compensating technique will be described.

(Related Art 1: Predistortion Type Distortion Compensating Technique in Quadrature Modulation System)

As a related art example of a technique for linearizing the output of a power amplifier in which a control voltage has a constant value and is in a steady state, there is a predistortion type in which amplitude and phase distortions occurring in the power amplifier under the above-mentioned conditions are previously measured, and correction using inverse characteristics of the distortion is previously performed on an input signal of the power amplifier, thereby obtaining an output signal amplitude and passing phase characteristics which are desired (for example, see Patent Reference 1).

FIG. 29 is a view showing output signal amplitude characteristics (AM-AM: Amplitude Modulation to Amplitude Modulation conversion) and passing phase characteristics (AM-PM: Amplitude Modulation to Phase Modulation conversion) with respect to an input high-frequency signal amplitude of a power amplifier in which a control voltage has a constant value and is in a steady state, and FIG. 30 is a block diagram showing a schematic configuration of a related predistortion type modulating apparatus described in Patent Reference 1. Hereinafter, irrespective of the kind of an input signal, for a change of an output signal occurring in accordance with a change of the input signal amplitude, a change of the output signal amplitude is referred to as AM-AM characteristics, and a change of the output signal phase is referred to as AM-PM characteristics.

In FIG. 29, the abscissa indicates the amplitude of the input high-frequency signal, the ordinate (left) indicates the amplitude of the output signal, and the ordinate (right) indicates the phase rotation amount (passing phase) of the output signal with reference to the input high-frequency signal. The solid line in the FIG. shows a graph which is obtained by plotting the AM-AM characteristics with respect to the input high-frequency signal amplitude, and the broken line in the figure shows a graph which is obtained by plotting the AM-PM characteristics with respect to the input high-frequency signal amplitude.

As shown in FIG. 30, the related predistortion type modulating apparatus has a memory 2901, IQ-signal correcting means 2902, and a quadrature modulator 2903.

The memory 2901 stores the AM-AM and AM-PM characteristics with respect to the input IQ-signal amplitude.

Here, correspondence relationships between the AM-AM and AM-PM characteristics as shown in FIG. 29 with respect to the input high-frequency signal amplitude of the power amplifier, and the AM-AM and AM-PM characteristics with respect to the input IQ-signal amplitude will be described.

The output amplitude of the quadrature modulator 2903, i.e., the input high-frequency signal amplitude of the power amplifier which is not shown is changed in accordance with the input IQ signal (not restricted to have a constant amplitude) transmitted from a baseband signal generating portion which is not shown. Therefore, correspondence relationships between the input IQ-signal amplitude and the output signal amplitude of the quadrature modulator 2903 (the input high-frequency signal amplitude of the power amplifier) are obtained. Furthermore, the AM-AM and AM-PM characteristics as shown in FIG. 29 with respect to the input high-frequency signal amplitude of the power amplifier in which the control voltage has a constant value and is in a steady state are obtained. Such characteristics of a power amplifier can be easily acquired by using a network analyzer and the like, as described in "Measurement of AM/AM and AM/PM Characteristics" p. 63, paragraph 2.13.4 of Non-patent Reference 1.

Next, based on the AM-AM characteristics of the quadrature modulator 2903 with respect to the thus acquired input IQ signal amplitude, and the AM-AM and AM-PM characteristics of the power amplifier with respect to the input high-frequency signal amplitude which are acquired as described above, the AM-AM and AM-PM characteristics with respect to the input IQ signal are acquired. Then, the AM-AM and AM-PM characteristics are stored as the absolute values, or as a predetermined value (difference value) which is acquired by multiplying or dividing the input IQ-signal amplitude by a predetermined value and then normalizing the resulting value with the input IQ-signal amplitude so as to attain the absolute values.

In accordance with the input IQ signal, then, an amplitude/phase correction signal which becomes inverse characteristics of the AM-AM and AM-PM characteristics is output to the IQ-signal correcting means 2902. In the data stored in the memory 2901, the input IQ signal may be normalized with the maximum value of the amplitude component after polar coordinate conversion, and an address number may be assigned to each of predetermined amplitude steps.

The IQ-signal correcting means 2902 executes correction on the input IQ signal based on the amplitude/phase correction signal.

The quadrature modulator 2903 executes quadrature modulation based on a signal output from the IQ-signal correcting means 2902.

In this way, a modulated signal which is previously distorted in consideration of inverse characteristics of the input/output characteristics of a power amplifier is affected by actual amplitude and phase distortions occurring in the power amplifier so as to have an output amplitude and a phase which are desired, whereby the linearity can be improved.

(Related Art 2: Predistortion Type Distortion Compensating Technique in Polar modulation System)

As a related art example of a technique for linearizing the output of a power amplifier in the polar modulation system in which the control voltage of a power amplifier does not have a constant value and is not in a steady state, and amplitude modulation is executed by driving the control voltage of a saturation power amplifier at high speed, there is a technique in which the anti-control voltage characteristics of the output signal amplitude and passing phase in a predetermined saturation power amplifier which are previously acquired, with respect to a predetermined input high-frequency signal amplitude are accumulated in a memory, and the memory is referred to execute predistortion type distortion compensation (for example, see Patent Reference 2).

FIG. 31 is a block diagram showing a related polar modulating apparatus to which the predistortion type distortion compensation described in Patent Reference 2 is applied.

As shown in FIG. 31, the polar modulating apparatus comprises: a power amplifier 3000; polar coordinate converting means 3001; a memory 3002; an amplitude controller 3005 which has amplitude information correcting means 3003 and amplitude modulating means 3004; and a phase-modulated signal generator 3008 which has phase information correcting means 3006 and phase modulating means 3007.

The polar coordinate converting means 3001 separates an IQ signal input from a baseband signal generating portion which is not shown, into an amplitude signal r(t) and a phase signal θ(t) having a constant amplitude.

The memory 3002 stores output signal amplitude characteristics and passing phase characteristics with respect to an input control signal of the power amplifier 3000 at a predetermined input high-frequency signal amplitude, and outputs an amplitude correction signal and a phase correction signal which become inverse characteristics of the power amplifier 3000, in accordance with the input amplitude signal r(t).

The amplitude information correcting means 3003 performs correction on the input amplitude signal r(t) based on the amplitude correction signal output from the memory 3002.

The amplitude modulating means 3004 drives at high speed the control voltage of the power amplifier 3000 based on an output signal of the amplitude information correcting means 3003.

The phase information correcting means 3006 executes correction on the input phase signal based on the phase correction signal output from the memory 3002.

The phase modulating means 3007 performs phase modulation based on an output signal from the phase information correcting means 3006.

Although not described in the specification of Patent Reference 2, the data to be stored in the memory 3002 are data in the absolute value format of the AM-AM and AM-PM characteristics in which the input high-frequency signal amplitude of the power amplifier in the abscissa of FIG. 29 is replaced with the input control signal amplitude, or a predetermined value (data in the format of a difference value) which, after the input control signal amplitude is multiplied or divided by the above-mentioned predetermined value, is normalized with the input control signal so as to attain the absolute value.

In this way, an amplitude-modulated signal and a phase-modulated signal which are previously distorted in consideration of inverse characteristics of the output characteristics of a power amplifier with respect to an input control signal are affected by actual amplitude and phase distortions occurring in the power amplifier so as to have an output amplitude and a phase which are desired, whereby the output-response characteristics (linearity) with respect to an input control voltage can be improved.

(Related Art 3: Technique for Improving Output-response Characteristics with Respect to Input Control Voltage in Power Amplifier)

As a related art example of a technique for improving the output-response characteristics with respect to an input control voltage in a power amplifier, there is a technique in which the level of an input high-frequency signal to the power amplifier is controlled in conjunction with adjustment of the control voltage of the power amplifier, thereby suppressing overshoot of an output signal with respect to the control voltage (for example, see Patent Reference 3).

FIG. 32 is a view showing output signal amplitude characteristics of a power amplifier with respect to an input control voltage, and FIG. 33 is a block diagram showing means (transmission power controlling circuit) for improving output-response characteristics with respect to the control voltage in the related power amplifier described in Patent Reference 3.

In FIG. 32, the abscissa indicates the control voltage, and the ordinate indicates the output amplitude. As indicated by the broken line in the figure, when, at the same output amplitude, the amplitude of an input of the power amplifier is suppressed in the direction of the arrow, the sensitivity (inclination) of the output signal amplitude with respect to the control voltage is moderated.

As shown in FIG. 33, the transmission power controlling circuit comprises a variable-output amplifier 3201, a power amplifier 3202, a signal input terminal 3203, a signal output terminal 3204, a control terminal 3205 of the variable-output amplifier 3201, and a control terminal 3206 of the power amplifier 3202.

When, under conditions that the amplitude of an input high-frequency signal of the input terminal 3203 and an input voltage of the control terminal 3206 are constant, an input voltage of the control terminal 3205 is adjusted so that the amplitude of an output signal from the variable-output amplifier 3201 is suppressed, the sensitivity of the output amplitude of the power amplifier 3202 with respect to the control voltage can be suppressed because of the relationship of FIG. 32. When the input voltages of the control terminals 3205, 3206 are simultaneously adjusted, therefore, the sensitivity of the output signal amplitude with respect to the control voltage, for example, overshoot can be suppressed.

(Related Art 4: Technique for Compensating AM-PM Characteristics at Signal Change Point)

As a related art example of a phase compensating technique for compensating a change of the AM-PM characteristics at a signal change point of an input control signal of a power amplifier, there is a technique in which the output signal amplitude of the power amplifier is detected, the detection signal is differentiated to obtain a signal change point, and thereafter a synchronizing timing between an amplitude signal and a phase signal is adjusted in order to compensate a change of the AM-PM characteristics at the signal change point.

FIG. 34 is a block diagram showing a related apparatus for phase-compensating at a signal change point described in Patent Reference 4.

As shown in FIG. 34, the phase compensating apparatus comprises: the power amplifier 3000, digital-analog converting circuits 3301, 3302, a reference clock 3303, amplitude modulating means 3304, phase modulating means 3305, a change-point detecting circuit 3306, and delaying means 3307.

The digital-analog converting circuit 3301 converts an IQ signal (I, Q) in a digital format input from a baseband signal generating portion which is not shown, to an IQ signal in an analog format.

The digital-analog converting circuit 3302 converts an amplitude signal (r) in a digital format extracted from the IQ signal (I, Q) in a digital format by polar coordinate converting means which is not shown, into an amplitude signal in an analog format.

The reference clock 3303 supplies a clock signal which serves as a reference of the converting operation, to the digital-analog converting circuits 3301, 3302.

The amplitude modulating means 3304 drives at high speed the power source voltage of the power amplifier 3000 based on the amplitude signal in an analog format.

The phase modulating means 3305 produces a phase-modulated signal based on the IQ signal in an analog format, and outputs the signal to the power amplifier 3000.

The change-point detecting circuit 3306 differentiates the output signal of the power amplifier 3000, and then detects a signal change point based on the sign of the differentiation value.

The delaying means 3307 adjusts, at the signal change point detected by the change-point detecting circuit 3306, converting timings of the digital-analog converting circuits 3301 and 3302, i.e., synchronization between the amplitude signal and the phase signal which are extracted from the IQ signal.

In this way, synchronization between the amplitude signal and the phase signal is adjusted at the signal change point, whereby the phase change amount can be controlled.

When the delay amount is adjusted based on the sign of the differentiation value, therefore, the phase change amount at the signal change point can be controlled.

(Related Art 5: Technique for Improving Output-response Characteristics of Power Amplifier when Transmission Power is Reduced, with Respect to Input Control Voltage)

As a related art example of a technique for linearizing the output of a power amplifier when the transmission power is reduced, there is a technique in which a variable-output amplifier is connected to a front stage of the power amplifier, and, when the output signal amplitude of the power amplifier is to be reduced, also the gain of the variable-output amplifier is reduced, so that the amplitude of an input high-frequency signal of the power amplifier is suppressed (for example, see Patent Reference 5).

FIG. 33 is a block diagram showing low-output linearizing means in the related power amplifier described in Patent Reference 5.

FIG. 35 is a view showing passing phase characteristics of a usual power amplifier with respect to a control voltage (steady state). In FIG. 35, the abscissa indicates the normalized control voltage, and the ordinate indicates the passing phase rotation amount with reference to the normalized control voltage of 1. The solid line in the figure shows passing phase characteristics in the case where an input high-frequency signal amplitude Pin of the power amplifier is Pin=P1, and the broken line in the figure shows passing phase characteristics in the case where input high-frequency signal amplitude Pin of the power amplifier is Pin=P2 (<P1). During measurement of the passing phase characteristics, Pin has a constant value.

As shown in FIG. 35, in order to suppress a change of the passing phase characteristics in a region where the control voltage is low, it is effective to reduce the amplitude of the input high-frequency signal of the power amplifier. Furthermore, reduction of the amplitude of the input high-frequency signal of the power amplifier is effective in suppression of a power of input high-frequency signal components leaking to the output terminal in the region where the control voltage is low.

Therefore, for example, a case where the input voltage of the control terminal 3206 is reduced and the output power of the power amplifier 3202 is reduced will be considered.

When the input voltage of the control terminal 3206 is lowered, it is possible to suppress the amplitude of the output signal from the variable-output amplifier 3201, i.e., the amplitude of the input high-frequency signal of the power amplifier 3202, and reduce leakage components of the input high-frequency signal, i.e., suppress the output signal amplitude to a predetermined value or less. Because of the relationship of FIG. 34, the change width of the passing phase amount during a low-output power period of the power amplifier when the control voltage is low can be suppressed.

Patent Reference 1: JP-A-61-214843 (FIGS. 3 and 10)
Patent Reference 2: JP-T-2004-501527 (FIG. 11)
Patent Reference 3: JP-A-5-152977 (FIGS. 1 and 4)
Patent Reference 4: JP-T-2002-530992 (FIG. 2)
Patent Reference 5: US 2002-0177420 A1 (FIG. 2)
Non-patent Reference 1: Kenington, Peter B, "High-Linearity RF Amplifier Design", Artech House Pulishers (p. 162, FIG. 4.18)

DISCLOSURE OF THE INVENTION

Problems that the Invention is to Solve

In the polar modulation system, in order that a control voltage of a power amplifier is driven at high speed and an amplitude signal of a transmission signal is correctly expressed, it is required to consider transient response characteristics in a period from switching of the control voltage to a timing when the output level of the power amplifier becomes to a desired level.

Moreover, in the polar modulation system, in order that a control voltage of a power amplifier is driven at high speed and an amplitude signal of a transmission signal is correctly expressed, it is required to compensate a change of the AM-PM characteristics at a signal change point of the control voltage.

Furthermore, in the polar modulation system, a saturation power amplifier is used. In order that, when the transmission power is reduced, the change width of the passing phase amount with respect to the output signal amplitude is suppressed, therefore, it is required to reduce leakage components of the input high-frequency signal.

For items which are required for realizing such a polar modulation system, problems which remain to be solved in the related art will be described.

In the output linearizing technique for the related power amplifier which is shown in related art 1, and in which the control voltage has a constant value and is in a steady state, the case where the control voltage is in a steady state is assumed. In order to apply the technique to the polar modulation system, it is required to store in the memory an output signal amplitude and passing phase characteristics with respect to the time elapsed after switching of the control voltage, and a change amount of the passing phase corresponding to increase or decrease of the control voltage, in addition to the output signal amplitude and the passing phase characteristics with respect to an input high-frequency signal in the case where the related control voltage is in a steady state. Therefore, there is a possibility that compensation data are largely increased.

In the output linearizing technique for the related power amplifier which is shown in related art 2, and in which the control voltage of the power amplifier does not have a constant value and is not in a steady state, and amplitude modulation is executed by driving the control voltage of a saturation power amplifier, a distortion compensating method which can suppress increase of compensation data while considering the output signal amplitude and the passing phase characteristics with respect to the time elapsed after switching of the control voltage, and a change amount of the passing phase corresponding to increase or decrease of the control voltage is not disclosed. In the same manner as the case where related art 1 is applied to the polar modulation system, therefore, there is a possibility that distortion compensation data are largely increased.

In the technique shown in related art 3 and for improving the output-response characteristics with respect to an input control voltage in a power amplifier, the variable-output amplifier and the power amplifier must be controlled simultaneously and adequately, a method of adjusting and controlling a delay between control signals of the two amplifiers is complicated, and a very rapid control is required in order to correctly express amplitude signal components of a modulated signal. In the case where this technique is applied to the polar modulation system to realize linearization of the output of the power amplifier with respect to the control voltage, therefore, a delay adjusting circuit and a controlling circuit must be added, with the result that the circuit scale is greatly increased.

As described above, in any combination of related arts 1 to 3, when linearization of the output of the power amplifier with respect to the control voltage is to be realized in the polar modulation system, it is impossible to suppress increase of the circuit scale due to increase of distortion compensation data, or increase of the circuit scale due to the addition of a delay adjusting circuit and a controlling circuit.

Furthermore, in any combination of related arts 1 to 3, when stable and rapid starting characteristics are to be acquired in a power amplifier which performs a burst operation, it is impossible to suppress increase of the circuit scale due to the addition of a controlling circuit.

Next, in the technique for compensating AM-PM characteristics at a signal change point shown in related art 4, a system of feedbacking the output signal of the power amplifier 3000 is required, the delaying means 3307 is required, and therefore the circuit scale is increased. In the case where a transmitting apparatus is configured by using the phase compensating apparatus shown in related art 4, the feedback system has a configuration in which the output signal of the power amplifier 3000 branches from an interval between stages or the power amplifier 3000 and an antenna connected to the subsequent stage of the power amplifier 3000. The feedback of the output signal of the power amplifier 3000 increases a loss of an output portion of the power amplifier 3000. Therefore, the transmission efficiency of the transmitting apparatus is lowered. In the case where the highest priority is given to the transmission efficiency of the transmitting apparatus, consequently, the feedback system in which the output signal of the power amplifier 3000 branches off is not preferable.

Finally, in the technique for linearizing the output of a power amplifier during a low-output power shown in related art 5, the means for controlling the amplitude of an input high-frequency signal of the power amplifier includes a circuit which operates in the high-frequency band, and hence there is a possibility that the control accuracy is lowered.

The invention has been conducted in view of the above-discussed related circumstances. It is an object of the invention to provide a distortion compensating circuit in which, in the polar modulation system, while suppressing increase of compensation data and increase of the circuit scale, a modulated signal can be correctly expressed, or low-distortion characteristics of a power amplifier can be realized.

Means for Solving the Problems

First, the distortion compensating circuit of the invention is a distortion compensating circuit for compensating distortion of an output signal of an amplifier in a polar modulation system in which phase modulation is performed based on a signal having at least a phase component of a baseband quadrature signal, the phase-modulated signal is input as an input high-frequency signal into the amplifier, and amplitude modulation corresponding to an amplitude component of the quadrature signal is synthesized by driving a control voltage of the amplifier, wherein the distortion compensating circuit comprises a steady characteristic compensating circuit which, based on output signal characteristics with respect to a control voltage value in a steady state after an input of the control voltage, for each predetermined input high-frequency signal amplitude, linearizes the output signal of the amplifier in the steady state, and a transient characteristic compensating circuit which adjusts the control voltage to compensate transient response characteristics of the output signal during driving of the control voltage.

According to the configuration, in the polar modulation system, response characteristics of the output signal with respect to an amplitude-modulated signal input to the amplifier can be improved while suppressing increase of compensation data.

Second, the distortion compensating circuit of the invention is the first distortion compensating circuit wherein the steady characteristic compensating circuit stores compensation data based on output signal amplitude characteristics with respect to the control voltage value, in a case where an unmodulated signal is input as an input high-frequency signal into the amplifier.

According to the configuration, in addition to the effect of the first distortion compensating circuit, the compensation data can be easily obtained.

Third, the distortion compensating circuit of the invention is the second distortion compensating circuit wherein the input high-frequency signal is an unmodulated one-carrier signal, and the output signal amplitude characteristics are for a fundamental wave component of the input high-frequency signal.

According to the configuration, in addition to the effects of the second distortion compensating circuit, the amount of the compensation data can be further reduced.

Fourth, the distortion compensating circuit of the invention is any one of the first to third distortion compensating circuits wherein the transient characteristic compensating circuit has a first amplitude information adjusting portion which performs the adjustment on the control voltage after correction by the steady characteristic compensating circuit.

According to the configuration, in addition to the effects of any one of the first to third distortion compensating circuits, the configuration can be more simplified.

Fifth, the distortion compensating circuit of the invention is any one of the first to third distortion compensating circuits wherein the transient characteristic compensating circuit has a second amplitude information adjusting portion which performs the adjustment on the control voltage before correction by the steady characteristic compensating circuit, to produce a control signal, and the steady characteristic compensating circuit refers the control signal which has been adjusted by the transient characteristic compensating circuit, to read out the compensation data.

According to the configuration, in addition to the effects of any one of the first to third distortion compensating circuits, the configuration can be more simplified.

Sixth, the distortion compensating circuit of the invention is the fourth or fifth distortion compensating circuit wherein the amplitude information adjusting portion is a multiplying circuit which multiplies a first coefficient.

According to the configuration, in addition to the effects of the fourth or fifth distortion compensating circuit, the configuration can be more simplified.

Seventh, the distortion compensating circuit of the invention is the sixth distortion compensating circuit wherein the multiplying circuit sets the first coefficient in accordance with step response characteristics with respect to the control voltage of the amplifier.

According to the configuration, in addition to the effects of the sixth distortion compensating circuit, the compensation accuracy can be further improved.

Eighth, the distortion compensating circuit of the invention is the seventh distortion compensating circuit wherein, in a case where the step response characteristics with respect to the control voltage of the amplifier are overshoot, the first coefficient is set so as to be compressed with respect to an input signal, and, in a case where the step response characteristics are not overshoot, the first coefficient is set so as to be expanded with respect to the input signal.

According to the configuration, in addition to the effects of the seventh distortion compensating circuit, the compensation accuracy can be further improved.

Ninth, the distortion compensating circuit of the invention is the fourth distortion compensating circuit wherein the steady characteristic compensating circuit further stores compensation data which, in a case where an unmodulated one-carrier signal is input as an input high-frequency signal into the amplifier, are based on passing phase characteristics of a fundamental wave component of the input high-frequency signal with respect to the control voltage value, and refers a control signal output from the first amplitude information adjusting portion, to read out compensation data based on the passing phase characteristics for phase-correction of the phase component.

According to the configuration, in addition to the effects of the fourth distortion compensating circuit, the compensation accuracy can be further improved by correcting a phase-modulated signal in consideration of transient characteristics.

Tenth, the distortion compensating circuit of the invention is the fifth distortion compensating circuit wherein the steady characteristic compensating circuit further stores compensation data which, in a case where an unmodulated one-carrier signal is input as an input high-frequency signal into the amplifier, are based on passing phase characteristics of a fundamental wave component of the input high-frequency signal with respect to the control voltage value, and refers the control signal after correction by the steady characteristic compensating circuit, to read out compensation data based on the passing phase characteristics for phase-correction of the phase component.

According to the configuration, in addition to the effects of the fifth distortion compensating circuit, the compensation accuracy can be further improved by correcting a phase-modulated signal in consideration of transient characteristics.

Eleventh, the distortion compensating circuit of the invention is a distortion compensating circuit for compensating distortion of an output signal of an amplifier in a polar modulation system in which phase modulation is performed based on a signal having at least a phase component of a baseband quadrature signal, the phase-modulated signal is input as an input high-frequency signal into the amplifier, and amplitude modulation corresponding to an amplitude component of the quadrature signal is synthesized by driving a control voltage of the amplifier, wherein the distortion compensating circuit comprises a steady characteristic compensating circuit which stores compensation data based on passing phase characteristics with respect to a control voltage value in a steady state after an input of the control voltage, for each predetermined input high-frequency signal amplitude, and linearizes the output signal of the amplifier in the steady state, and a phase compensating circuit which multiplies a reference signal for reading out the compensation data in the steady characteristic compensating circuit by a second coefficient.

According to the configuration, AM-PM characteristics can be adjusted by a simple configuration.

Twelfth, the distortion compensating circuit of the invention is the eleventh distortion compensating circuit wherein the second coefficient is multiplied with reference to a reference signal which is maximum among reference signals for reading out the compensation data in the steady characteristic compensating circuit.

According to the configuration, in addition to the effect of the eleventh distortion compensating circuit, the compensation accuracy of the AM-PM characteristics can be further improved.

Thirteenth, the distortion compensating circuit of the invention is the twelfth distortion compensating circuit wherein the distortion compensating circuit further comprises an amplitude determining portion which calculates an instantaneous amplitude value of the control voltage sampled at constant intervals, the amplitude determining portion has a function of setting a predetermined threshold based on the plural instantaneous amplitude values and determining increase or decrease of a control signal from a previous sampling timing, and, based on increase or decrease of the control signal determined by the amplitude determining portion, the second coefficient which is to be set during decrease of the control signal is reduced with respect to the second coefficient which is to be set during increase of the control signal.

According to the configuration, in addition to the effects of the twelfth distortion compensating circuit, it is possible to compensate a change of the AM-PM characteristics at a signal change point.

Fourteenth, the distortion compensating circuit of the invention is the twelfth distortion compensating circuit wherein the phase compensating circuit switches over the second coefficient, thereby performing adjustment of synchronization between the phase component and the amplitude component.

According to the configuration, in addition to the effects of the twelfth distortion compensating circuit, adjustment of synchronization between the phase signal and the amplitude signal can be performed by a simple configuration.

Fifteenth, the distortion compensating circuit of the invention is any one of the sixth to thirteenth distortion compensating circuits wherein the distortion compensating circuit further comprises an amplitude determining portion which calculates an instantaneous amplitude value of the control voltage sampled at constant intervals, and switches over the first or second coefficient in accordance with the instantaneous amplitude value.

According to the configuration, in addition to the effects of any one of the sixth to thirteenth distortion compensating circuits, the compensation accuracy can be further improved.

Sixteenth, the distortion compensating circuit of the invention is any one of the sixth to thirteenth distortion compensating circuits wherein the distortion compensating circuit further comprises an amplitude determining portion which calculates an instantaneous amplitude value of the control voltage sampled at constant intervals, the amplitude determining portion has a function of setting a predetermined threshold based on the plural instantaneous amplitude values and determining increase or decrease of the control signal from a previous sampling timing, and the distortion compensating circuit sets the first or second coefficient in accordance with increase or decrease of the control signal determined by the amplitude determining portion.

According to the configuration, in addition to the effects of any one of the sixth to thirteenth distortion compensating circuits, the compensation accuracy can be further improved.

Seventeenth, the distortion compensating circuit of the invention is any one of the first to sixteenth distortion compensating circuits wherein the information stored in the steady characteristic compensating circuit is an approximation polynomial of an output signal amplitude or passing phase characteristics with respect to the control voltage value in the steady state after input of the control voltage, in a predetermined input high-frequency signal amplitude.

According to the configuration, in addition to the effects of any one of the first to sixteenth distortion compensating circuits, the amount of the compensation data can be further reduced.

Eighteenth, the distortion compensating circuit of the invention is a distortion compensating circuit for compensating distortion of an output signal of an amplifier in a polar modulation system in which phase modulation is performed based on a signal having at least a phase component of a baseband quadrature signal, the phase-modulated signal is input as an input high-frequency signal into the amplifier, and amplitude modulation corresponding to an amplitude component of the quadrature signal is synthesized by driving a control voltage of the amplifier, wherein the distortion compensating circuit further comprises an amplitude adjusting portion which multiplies the signal having at least the phase component of the baseband quadrature signal, by a third coefficient, and adjusts an amplitude of the signal.

According to the configuration, the accuracy of the compensation of the phase-modulated signal can be further improved by adjusting the amplitude of the input high-frequency signal of the amplifier.

Nineteenth, the distortion compensating circuit of the invention is any one of the sixth to eighteenth distortion compensating circuits wherein the distortion compensating circuit switches over the first, second, or third coefficient in accordance with a transmission output power.

According to the configuration, in addition to the effects of any one of the sixth to eighteenth distortion compensating circuits, an adequate coefficient according to the transmission power can be selected, and the compensation accuracy can be further improved.

Twentieth, the distortion compensating circuit of the invention is the eighteenth distortion compensating circuit wherein the distortion compensating circuit further comprises a variable-band low-pass filter, and, in accordance with the transmission output power, switches over the third coefficient and a band of the low-pass filter.

According to the configuration, in addition to the effects of the eighteenth distortion compensating circuit, noises in an output of the amplifier can be reduced.

Twenty-first, the distortion compensating circuit of the invention is the twentieth distortion compensating circuit wherein the distortion compensating circuit further comprises a steady characteristic compensating circuit which stores compensation data based on passing phase characteristics with respect to a control voltage value in a steady state after an input of the control voltage, for each predetermined input high-frequency signal amplitude, and which linearizes the output signal of the amplifier in the steady state, and a phase compensating circuit which multiplies a reference signal for reading out the compensation data in the steady characteristic compensating circuit, by a second coefficient, and the phase compensating circuit multiplies the second coefficient with reference to a reference signal which is maximum among reference signals for reading out the compensation data in the steady characteristic compensating circuit, and switches over the second coefficient in accordance with the switching of the band of the low-pass filter, thereby performing adjustment of synchronization between the phase component and the amplitude component.

According to the configuration, in addition to the effects of the twentieth distortion compensating circuit, a loss of synchronization between the amplitude signal and the phase signal due to switching of the band of the low-pass filter can be compensated by a simple configuration.

Twenty-second, the distortion compensating circuit of the invention is any one of the sixth, eleventh, twelfth, or eighteenth distortion compensating circuit wherein the distortion compensating circuit switches over the first, second, or third coefficient on the basis of a detection signal which is obtained by detecting an environmental temperature, thereby compensating temperature characteristics of the output signal.

According to the configuration, in addition to the effects of any one of the eleventh, twelfth, or eighteenth distortion compensating circuit, even when the environmental temperature varies, response characteristics of the output signal of the amplifier can be improved while suppressing increase of the compensation data.

Twenty-third, the distortion compensating circuit of the invention is any one of the sixth, eleventh, twelfth, or eighteenth distortion compensating circuit wherein the distortion compensating circuit switches over the first, second, or third coefficient in accordance with a frequency input into the amplifier, thereby compensating frequency characteristics of the output amplitude.

According to the configuration, in addition to the effects of any one of the eleventh, twelfth, or eighteenth distortion compensating circuit, even when a change occurs in the transmission frequency, response characteristics of the output signal of the amplifier can be improved while suppressing increase of the compensation data.

First, the transient characteristic compensating circuit of the invention is a transient characteristic compensating circuit for speeding up starting characteristics of a transistor circuit which controls an output signal amplitude by adjusting a control voltage, wherein the transient characteristic compensating circuit is a multiplying circuit which multiplies the control voltage by a fourth coefficient, and the multiplying circuit sets the fourth coefficient in accordance with step response characteristics with respect to the control voltage of the amplifier.

According to the configuration, the starting characteristics of the transistor circuit are speeded up by a simple configuration.

Second, the transient characteristic compensating circuit of the invention is the first transient characteristic compensating circuit wherein, in a case where the step response characteristics are not overshoot, the fourth coefficient is set so as to be expanded with respect to the input signal.

According to the configuration, in addition to the effect of the first transient characteristic compensating circuit, the starting characteristics of the transistor circuit are speeded up by a simpler configuration.

The ramp controlling circuit comprises the first or second transient characteristic compensating circuit.

According to the configuration, it is possible to realize a ramp controlling circuit in which the starting characteristics of the transistor circuit are speeded up by a simple configuration.

The radio communication apparatus of the invention comprises any one of the first to twenty-third distortion compensating circuits, the first or second transient characteristic compensating circuit, or the ramp controlling circuit.

According to the configuration, it is possible to realize a highly efficient low-distortion transmitting apparatus.

Effects of the Invention

According to the invention, a distortion compensating circuit can be provided in which, in the polar modulation system, while suppressing increase of compensation data and increase of the circuit scale, a modulated signal can be correctly expressed, or low-distortion characteristics of a power amplifier can be realized.

Figure 1:
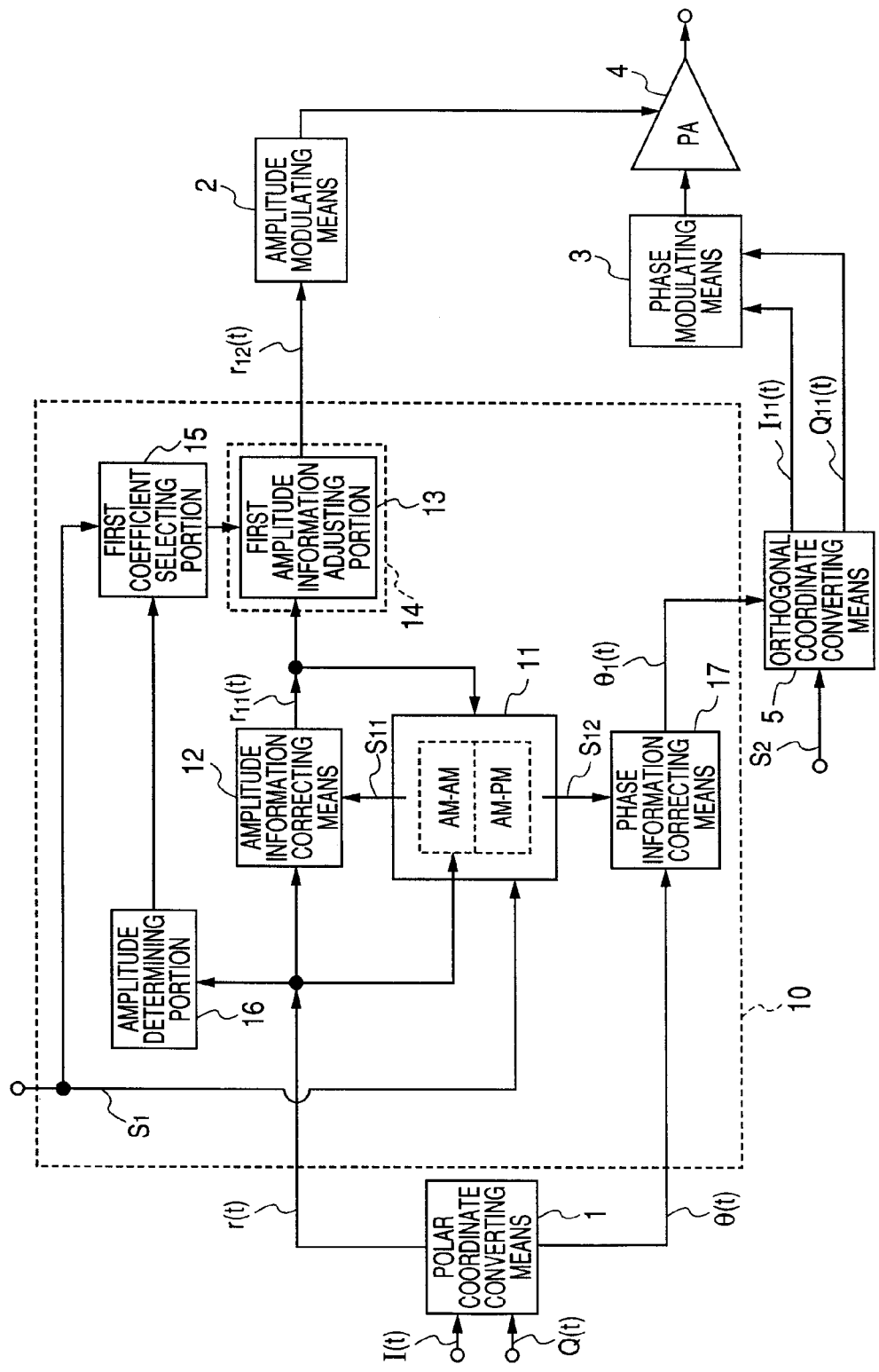
FIG. 1 A view showing an example of a schematic configuration of a polar modulating circuit of a first embodiment of the invention.

DESCRIPTION OF REFERENCE NUMERALS AND SIGNS 1 polar coordinate converting means
2 amplitude modulating means
3 phase modulating means
4 power amplifier
5, 5b orthogonal coordinate converting means
6 quadrature modulating means
10, 20, 30, 40, 50, 60, 70, 80, 90 distortion compensating circuit
11, 11b, 11c, 11d steady characteristic compensating circuit
12 amplitude information correcting means
13 first amplitude information adjusting portion
14, 34 transient characteristic compensating circuit
15 first coefficient selecting portion
16 amplitude determining portion
17 phase information correcting means
33 second amplitude information adjusting portion
35 second coefficient selecting portion 43 third amplitude information adjusting portion
44 phase compensating circuit
45 third coefficient selecting portion
53 fourth amplitude information adjusting portion
54 transient characteristic/phase compensating circuit
55 fourth coefficient selecting portion
71 multiplying circuit
81 amplitude adjusting portion
82 fifth coefficient selecting portion
53b fifth amplitude information adjusting portion
55b sixth coefficient selecting portion
91 low-pass filter
92 band selecting portion

BEST MODE FOR CARRYING OUT THE INVENTION

First Embodiment

A first embodiment of the invention describes a method which has not been solved by any combination of related arts 1 to 3, and which, in the polar modulation system, realizes linearization of an output of a power amplifier with respect to a control voltage without producing increase of the circuit scale due to increase of distortion compensation data.

As another technique for realizing linearization of an output of a power amplifier with respect to a control voltage, there is a method which performs a process of comparing transmission data with demodulated data of an output signal from a power amplifier, and updating compensation data so as to reduce an error (hereinafter, referred to as adaptive process). A method will be described which realizes linearization of an output of a power amplifier with respect to a control voltage without using a feedback system in order to avoid lowering of the transmission efficiency of a transmitting apparatus caused by a branching portion for an output signal of the power amplifier that is required in the configuration a circuit for performing the adaptive process.

FIG. 1 is a view showing an example of a schematic configuration of a polar modulating circuit of the first embodiment of the invention.

As shown in FIG. 1, the polar modulating circuit of the first embodiment of the invention comprises polar coordinate converting means 1, a distortion compensating circuit 10, amplitude modulating means 2, phase modulating means 3, a power amplifier 4, and orthogonal coordinate converting means 5.

In the case where the polar modulating circuit of the invention is used in a transmitting apparatus, the polar coordinate converting means 1 separates an orthogonal coordinate signal (IQ signal) input from a baseband signal generating portion of the transmitting apparatus which is not shown, into amplitude information r(t) and phase information θ(t) having a constant amplitude. The polar coordinate converting means 1 normalizes r(t) so that the maximum value is 1.

The distortion compensating circuit 10 performs a predetermined distortion compensating process on the amplitude information r(t) and the phase information θ(t). The detailed operation of the distortion compensating circuit 10 will be described later.

The amplitude modulating means 2 drives a control voltage of the power amplifier 4 on the basis of the amplitude information output from the distortion compensating circuit 10.

In the case where the polar modulating circuit of the invention is used in a transmitting apparatus, the orthogonal coordinate converting means 5 converts the phase information output from the distortion compensating circuit 10 to an IQ signal (I11(t), Q11(t)) having a constant amplitude on the basis of output amplitude information S2 transmitted from a controlling portion of the transmitting apparatus which is not shown. That is, the output amplitude information S2 determines the amplitude value of the constant-amplitude IQ signal. The output amplitude information S2 is set to a value at which the phase modulating means 3 is not saturated, and may be stored in the orthogonal coordinate converting means 5 instead of being transmitted from the controlling portion of the transmitting apparatus. For example, the output amplitude information S2 may be set to 1, and an attenuating circuit may be disposed in an IQ signal inputting portion of the phase modulating means 3 so that the phase modulating means 3 is not saturated.

The phase modulating means 3 performs phase modulation on the basis of the IQ signal (I11(t), Q11(t)) output from the orthogonal coordinate converting means 5. The phase modulating means 3 may include also phase modulating means which is configured so as to have quadrature modulating means, and which is called an offset PLL system. The phase modulating means 3 may include phase modulating means which is configured so as to have a fractional frequency divider, and which is called a fractional-N PLL system. In case of the fractional-N PLL system, the phase modulating means 3 performs phase modulation on the basis of the phase information θ output from the distortion compensating circuit 10 instead of the IQ signal (I11(t), Q11(t)) output from the orthogonal coordinate converting means 5.

The power amplifier 4 synthesizes amplitude modulation on a phase-modulated signal output from the phase modulating means 3, on the basis of an output signal of the amplitude modulating means 2 serving as a control signal.

Figure 2:
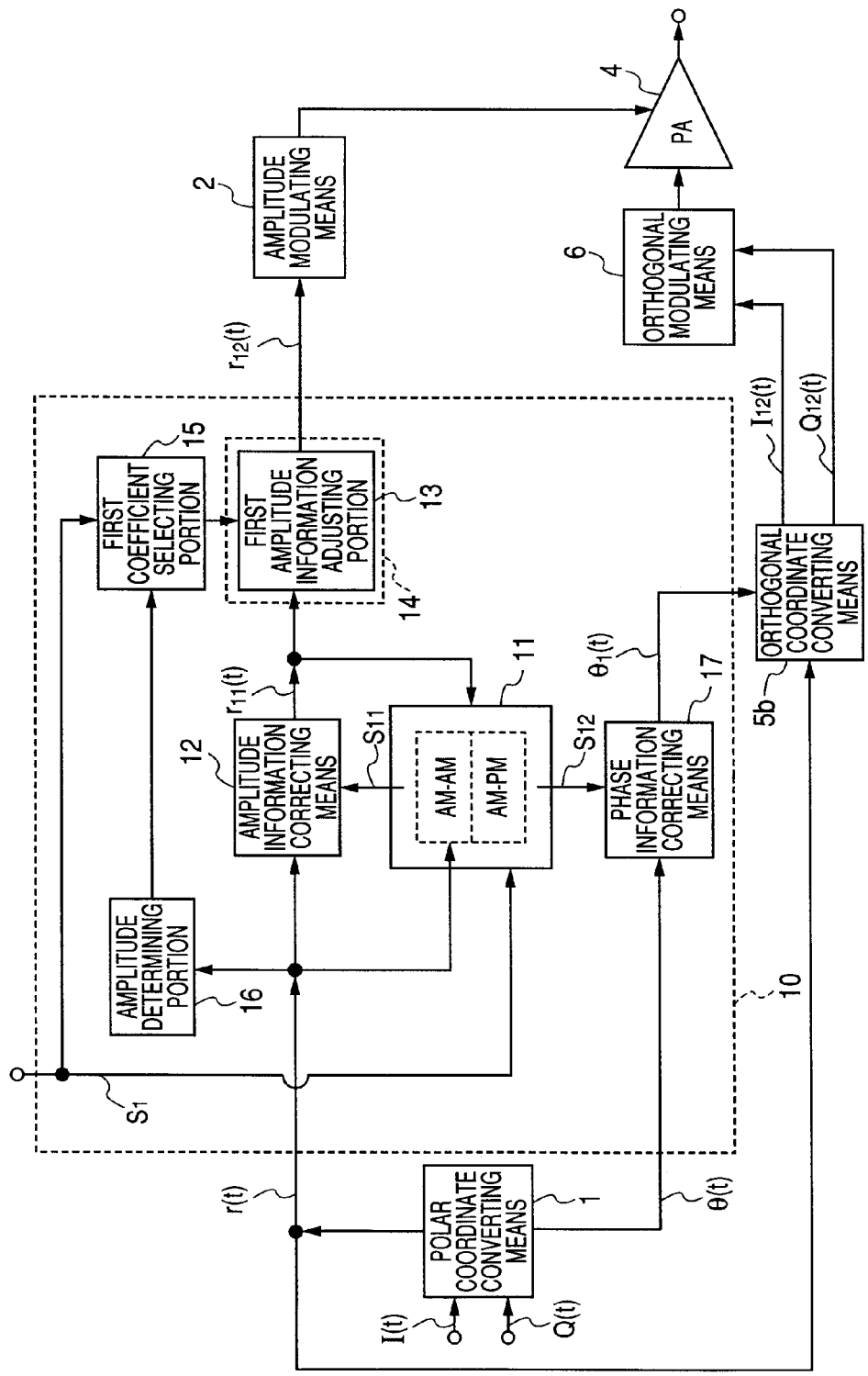
FIG. 2 A view showing another example of the schematic configuration of the polar modulating circuit of the first embodiment of the invention.

Another example of the polar modulating circuit of the first embodiment of the invention may comprise the configuration shown in FIG. 2.

FIG. 2 is a view showing another example of the schematic configuration of the polar modulating circuit of the first embodiment of the invention. In the polar modulating circuit of this example, quadrature modulating means 6 and orthogonal coordinate converting means 5b are disposed in place of the phase modulating means 3 and the orthogonal coordinate converting means 5.

The orthogonal coordinate converting means 5b synthesizes the amplitude information r(t) output from the polar coordinate converting means 1 with the phase information output from the distortion compensating circuit 10, to output an IQ signal (I12(t), Q12(t)).

The quadrature modulating means 6 performs quadrature modulation based on the IQ signal (I12(t), Q12(t)) output from the orthogonal coordinate converting means 5. A high-frequency signal having an amplitude component which is quadrature-modulated by the quadrature modulating means 6 becomes as an input signal of the power amplifier 4. An attenuating circuit may be disposed in an IQ signal inputting portion of the quadrature modulating means 6 so that the quadrature modulating means 6 is not saturated.

Next, the distortion compensating circuit 10 will be described in detail. As shown in FIGS. 1 and 2, the distortion compensating circuit 10 has a steady characteristic compensating circuit 11, amplitude information correcting means 12, a transient characteristic compensating circuit 14 having a first amplitude information adjusting portion 13, a first coefficient selecting portion 15, an amplitude determining portion 16, and phase information correcting means 17.

Figures 28, 29:
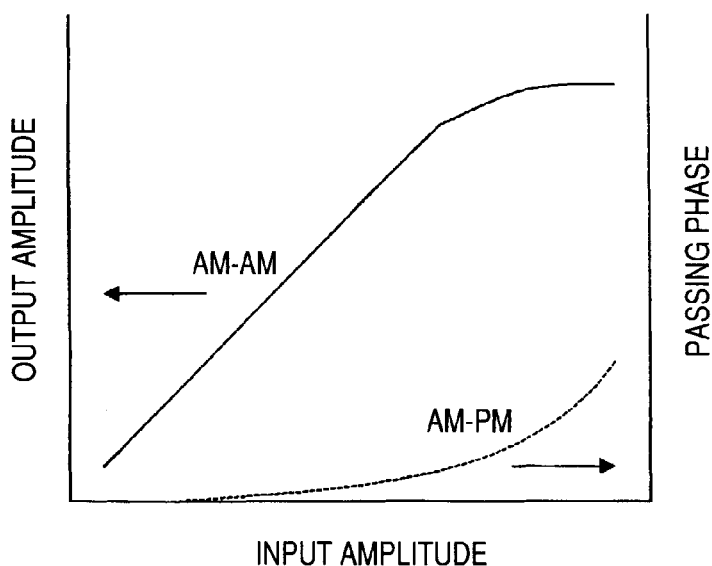
FIG. 28 A view showing a transmission power regulation for a mobile station.
FIG. 29 A view showing an output amplitude and passing phase characteristics with respect to an input high-frequency signal amplitude of a power amplifier (a control voltage is in a steady state).
Figure 30:
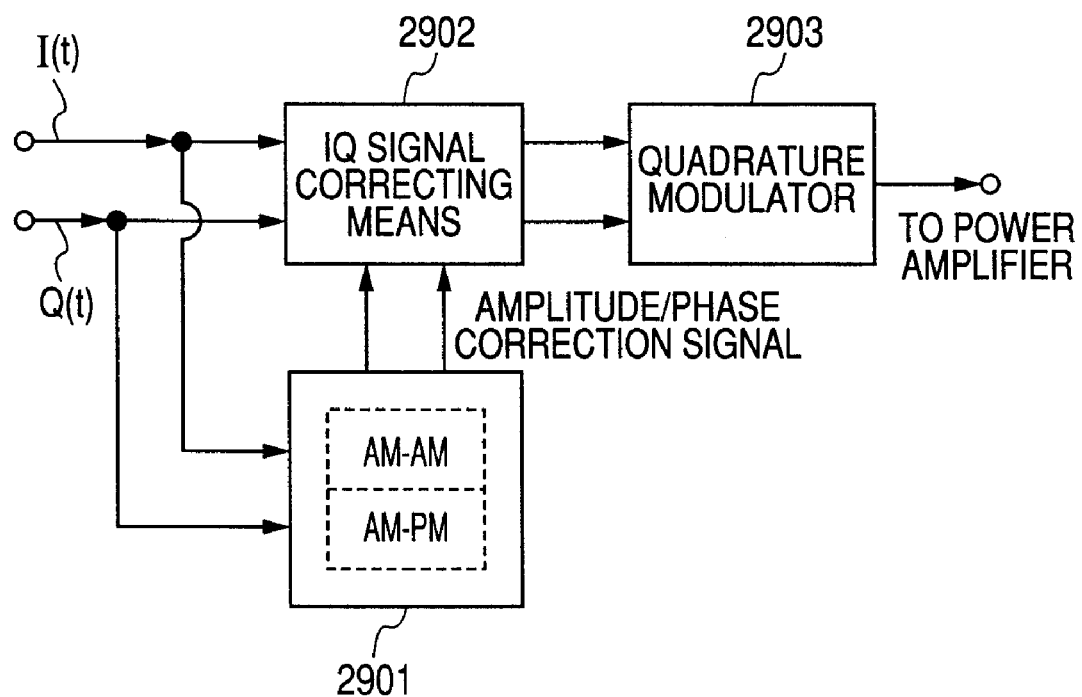
FIG. 30 A block diagram showing a related predistortion system.
Figure 31:
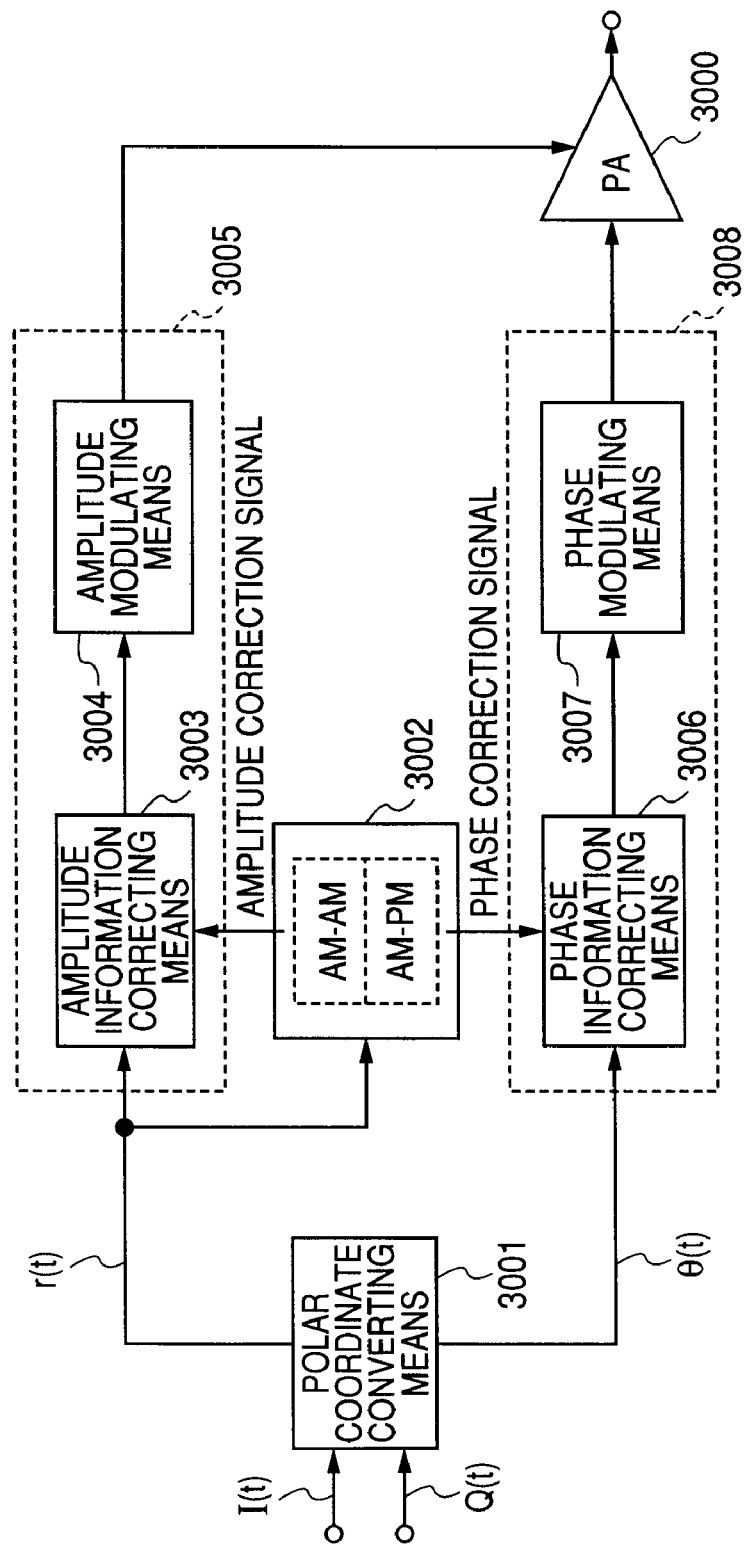
FIG. 31 A block diagram showing a related polar modulation system to which predistortion type distortion compensation is applied.
Figure 32:
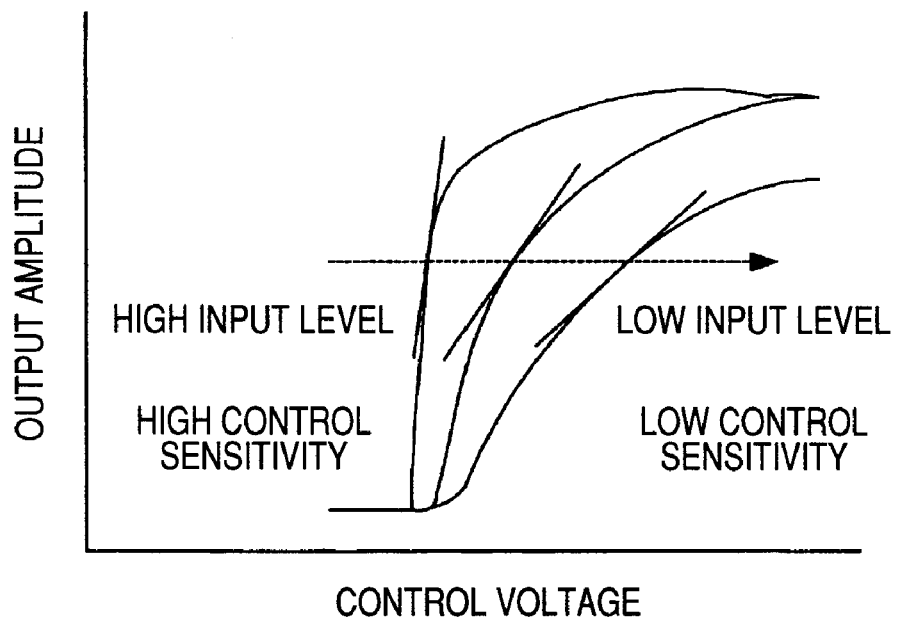
FIG. 32 A view showing output signal amplitude characteristics of a power amplifier with respect to a control voltage.
Figure 33:
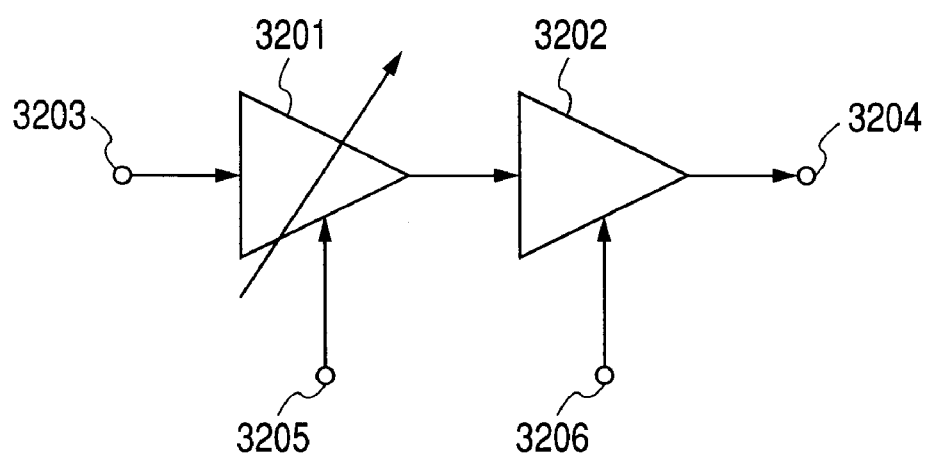
FIG. 33 A block diagram showing means for improving output-response characteristics with respect to the control voltage in a related power amplifier, and low-output linearizing means in the related power amplifier.
Figure 34:
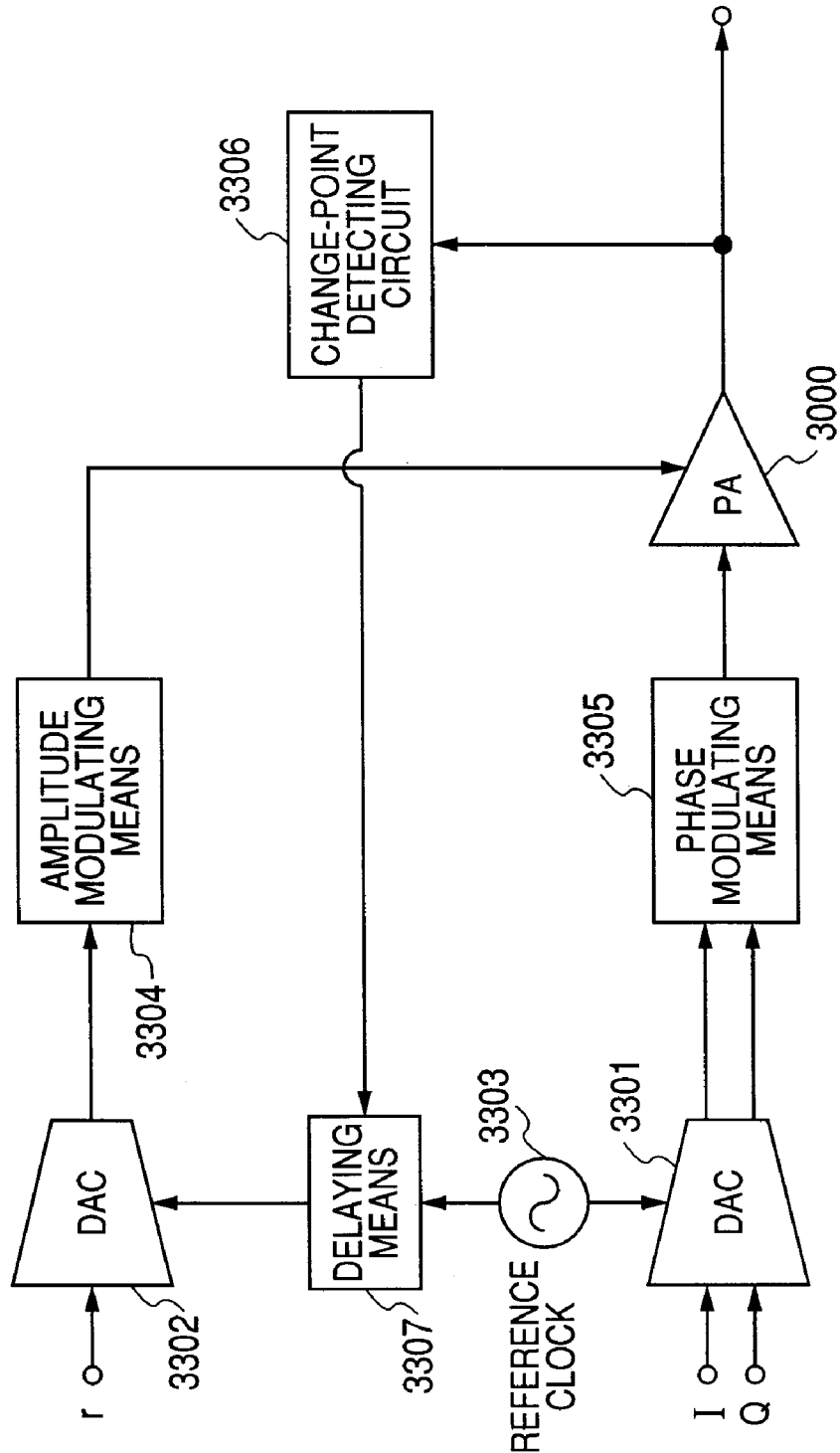
FIG. 34 A block diagram showing a related apparatus for phase-compensating at a signal change point.
Figure 35:
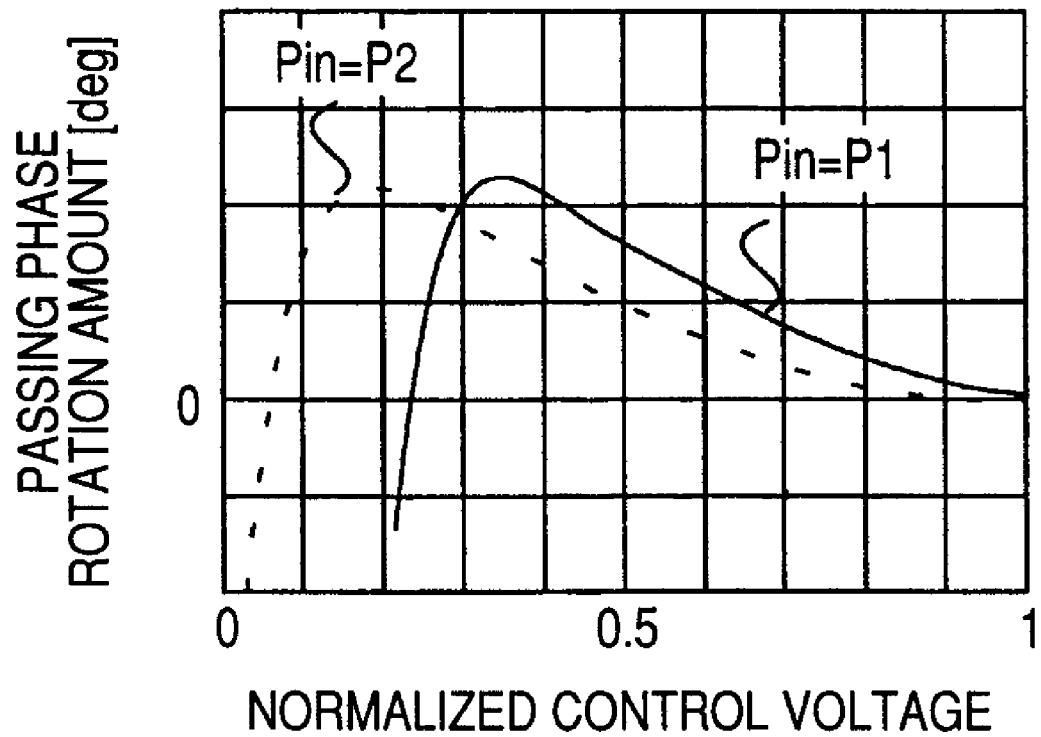
FIG. 35 A view showing passing phase characteristics of a power amplifier with respect to a control voltage (steady state).

Transmission level information S1 is transmission level information of the power amplifier 4 which, in the case where the polar modulating circuit of the invention is used in a transmitting apparatus, is transmitted from a controlling portion of the transmitting apparatus which is not shown. The information is input into the steady characteristic compensating circuit 11 and the first coefficient selecting portion 15. For the transmission level information S1, specifically, the case where the polar modulating circuit of the invention is applied to a mobile station transmitting apparatus which performs transmission in 8-PSK modulation in the 900 MHz GSM band will be described. At the output end of an antenna which is connected to a rear stage of the power amplifier 4, and which is not shown, the information is defined between 33 dBm and 5 dBm in steps of 2 dB. Namely, the transmission level information S1 is determined on the basis of the transmission power regulation in uplink for a mobile station transmitting apparatus such as shown in FIG. 28.

For output signal amplitude characteristics and passing phase characteristics of a fundamental wave component from the power amplifier 4, the steady characteristic compensating circuit 11 stores, as the AM-AM characteristics, data in the absolute value format of the control voltage with respect to the output signal amplitude, or a predetermined value (data in the format of a difference value) which, after the input control signal amplitude is multiplied or divided by the above-mentioned predetermined value, is normalized with the input control signal so as to attain the absolute value, and stores in the memory passing phase characteristic data with respect to the control voltage as the AM-PM characteristics.

The output signal amplitude characteristics and passing phase characteristics of a fundamental wave component from the power amplifier 4 are characteristics that are acquired in the case where an unmodulated one-carrier which can be obtained by using a network analyzer and the like, and which has a predetermined level (constant value) is input as a high-frequency input signal to the power amplifier 4.

The AM-AM and AM-PM characteristics are characteristics which, during the acquisition time of the output signal amplitude characteristics and the passing phase characteristics, are acquired at each switching of the control voltage that is set to the constant value (hereinafter, referred to as steady control voltage).

The relationships of input and output signals in the steady characteristic compensating circuit 11 respectively output an amplitude correction signal S11 and a phase correction signal S12 while, as address designation signals, using the input amplitude information r(t) and an output signal r11(t) from the amplitude information correcting means 12. The steady characteristic compensating circuit 11 performs a process of normalizing the AM-AM characteristics based on the transmission level information S1. Specifically, based on the maximum transmission power in which the maximum value—the average value (peak factor) of amplitude information corresponding to the modulation system is considered, normalization of an output signal amplitude in stored AM-AM data is executed on a desired output level (average power), whereby correction is performed for each desired output level. As a result of the normalization, access to AM-AM data with using the input amplitude information r(t) as an address designation signal is enabled.

Such a circuit is referred to as a steady characteristic compensating circuit, in order to show that, because the stored AM-AM and AM-PM characteristics are characteristics at a timing when the characteristics settle into a steady state after the control voltage is input, i.e., characteristics with respect to the steady control voltage, characteristic compensation which is executed based on the characteristics is for steady characteristics.

The amplitude information correcting means 12 performs correction on the amplitude information r(t) output from the polar coordinate converting means 1, on the basis of the amplitude correction signal S11 output from the steady characteristic compensating circuit 11.

The first amplitude information adjusting portion 13 multiplies the amplitude information r11(t) output from the amplitude information correcting means 12 by predetermined coefficient information (func1) to output amplitude information r12(t).

The first coefficient selecting portion 15 stores a table of coefficient information corresponding to the transmission level information S1, in order to set the coefficient information (func1) of the first amplitude information adjusting portion 13.

The amplitude determining portion 16 has a function of calculating an instantaneous amplitude value (|r(t)|) of the amplitude information r(t) sampled at constant intervals, and a function of setting a predetermined threshold based on plural instantaneous amplitude values and determining increase or decrease (Δr(t)) of the amplitude value of the amplitude information r(t) from a previous sampling timing, thereby calculating a signal change point.

The phase information correcting means 17 performs correction on the phase information θ(t) on the basis of the phase correction signal S12 output from the steady characteristic compensating circuit 11.

Figure 3:
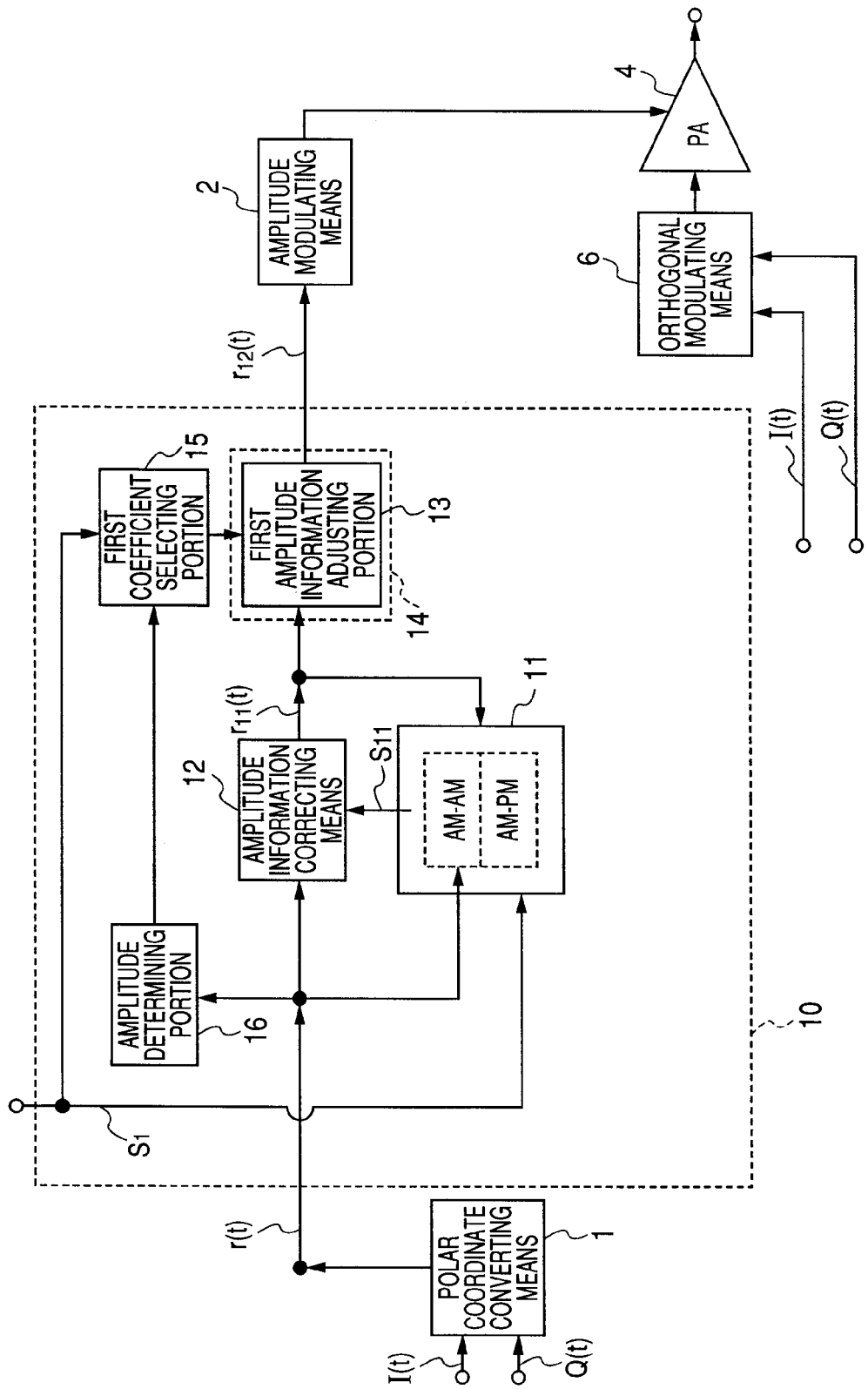
FIG. 3 A view showing a further example of the schematic configuration of the polar modulating circuit of the first embodiment of the invention.

A further example of the polar modulating circuit of the first embodiment of the invention may comprise the configuration shown in FIG. 3.

FIG. 3 is a view showing the further example of the schematic configuration of the polar modulating circuit of the first embodiment of the invention. The polar modulating circuit of this example is configured so that the orthogonal coordinate converting means 5b and the phase information correcting means 17 are removed away from the polar modulating circuit of FIG. 2, and the input IQ signal of the quadrature modulating means 6 are changed from I12(t), Q12(t) to an IQ signal (I(t), Q(t)) input from the baseband signal generating portion of the transmitting apparatus which is not shown, thereby omitting the phase correction of the phase-modulated signal.

In the case where the polar modulating circuit of the invention is used in a transmitting apparatus, a digital-analog converting circuit (hereinafter, abbreviated to DA converter) which is not shown is placed between, in FIG. 1, stages of the first amplitude information adjusting portion 13 and the amplitude modulating means 2, and stages of the orthogonal coordinate converting means 5 and the phase modulating means 3, between, in FIG. 2, stages of the first amplitude information adjusting portion 13 and the amplitude modulating means 2, and stages of the orthogonal coordinate converting means 5b and the quadrature modulating means 6, and between, in FIG. 3, stages between the first amplitude information adjusting portion 13 and the amplitude modulating means 2, and in front of the quadrature modulating means 6.

Next, the operation of the distortion compensating circuit 10 of the first embodiment of the invention will be described. First, prior to the description of the operation of the distortion compensating circuit, step response characteristics with respect to the control voltage of the power amplifier will be described.

Figure 4:
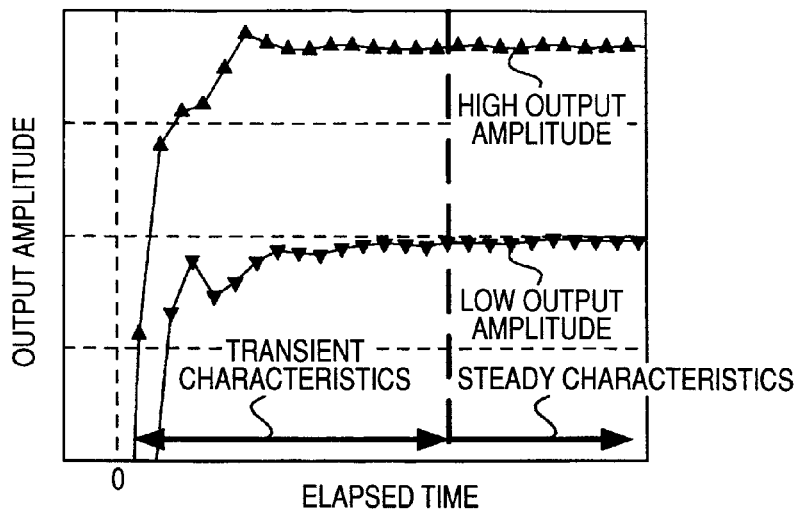
FIG. 4 A view showing step response characteristics of an output amplitude with respect to a control voltage in a state where an input high-frequency signal having a level at which a power amplifier operates in saturation is given.

FIG. 4 is a view showing step response characteristics of an output signal amplitude with respect to a control voltage in a state where an input high-frequency signal amplitude having a level at which a power amplifier operates in saturation is given. In FIG. 4, the abscissa indicates the time elapsed after inputting of the control signal into the power amplifier, and the ordinate indicates the amplitude of the output signal of the power amplifier.

As shown in FIG. 4, when the control voltage supplied to the power amplifier is changed from 0 v to a predetermined level (step response), in a state where an input high-frequency signal having a level at which the power amplifier operates in saturation is given, transient response characteristics are exhibited before a steady state where the output amplitude is stabilized is attained. In the example of FIG. 4, step response characteristics with respect to two different control voltage values (steady control voltage values) are shown, and the output amplitudes from the power amplifier in steady characteristics are different. The amplitude of the input high-frequency signal during acquisition of the step response characteristics is at a level at which the power amplifier operates in saturation, and a constant value. In the two step response characteristics shown in FIG. 4, the steady control voltage value of the higher output amplitude is higher than that of the lower output amplitude.

Next, a method and procedure of feeding back an error of the above-mentioned transient response portion from a predetermined level after the output signal from the power amplifier 4 is branched, and correcting the error without performing the adaptive process will be described.

The data (AM-AM characteristics, AM-PM characteristics) stored in the steady characteristic compensating circuit 11 are anti-control voltage (steady state) characteristics of the output signal amplitude and passing phase rotation amount of the power amplifier 4 which can be acquired by using a network analyzer while giving the priority to easiness of data acquisition, and switching over plural steady control voltage values that have a constant value during data acquisition. When distortion compensation is executed with referring the data which are characteristics in the steady state, a desired output amplitude cannot be expressed by the output signal $r11(t)$ from the amplitude information correcting means 12 because of influence of the transient response shown in FIG. 4.

Therefore, step response characteristics of the power amplifier 4 during supply of a control voltage having a constant value at which the average output level of a modulated signal becomes a desired level are previously measured for each transmission output power defined in a standard of a radio system (for example, the GSM standard which has been described as an example in the paragraph of the background art). In the case where transient response characteristics in the step response characteristics are in an overshoot state as in the high output amplitude in FIG. 4, the first coefficient selecting portion 15 outputs the coefficient information (func1) indicated by Expression (2) to the first amplitude information adjusting portion 13 so that $r11(t)$ and $r12(t)$ have the relationship indicated by Expression (1)

$$r11(t) > r12(t) \quad (1)$$

$$func1 < 1 \quad (2)$$

By contrast, in the case where the response converges without exceeding a predetermined value during the transient response period as in the low output amplitude in FIG. 4, the first coefficient selecting portion 15 outputs the coefficient information (func1) indicated by Expression (4) to the first amplitude information adjusting portion 13 so that $r11(t)$ and $r12(t)$ have the relationship indicated by Expression (3).

$$r11(t) \leq r12(t) \quad (3)$$

$$func1 \geq 1 \quad (4)$$

Namely, in the case where a control voltage having a constant value at which the average output amplitude in the transmission modulated signal is obtained is given, when the starting characteristics of the power amplifier 4 are overshoot, the amplitude information $r11(t)$ on which correction has been executed by the steady characteristics is compressed, and, in case of the inverse characteristics, $r11(t)$ is expanded, whereby a desired output amplitude can be obtained in consideration of the transient response.

In the GSM system, for example, a period when a modulated signal is not transmitted exists between time slots, it is required that a power amplifier is activated with the start of one time slot period, and stopped with the end of the one time slot period, and the transmission output power in one time slot is constant. When the distortion compensating circuit of the first embodiment of the invention is applied to the GSM system, therefore, coefficient information can be output on the basis of the transmission level information S1 for each time slot.

In this way, in the distortion compensating circuit of the first embodiment of the invention, distortion compensation in consideration of influence of the transient response can be performed simply by adding the first coefficient selecting portion 15 storing the table of the coefficient information (func1) corresponding to the transmission level information S1, and the transient characteristic compensating circuit 14 which multiplies the coefficient information (func1), to a related polar modulating circuit.

Namely, enormous compensation data in the time axis, a control circuit for performing a complex control, and a delay adjusting circuit which are necessary in the case where transient response characteristics are to be compensated based on related arts 1 to 3 are not required, and the circuit scale can be reduced.

Figure 5:
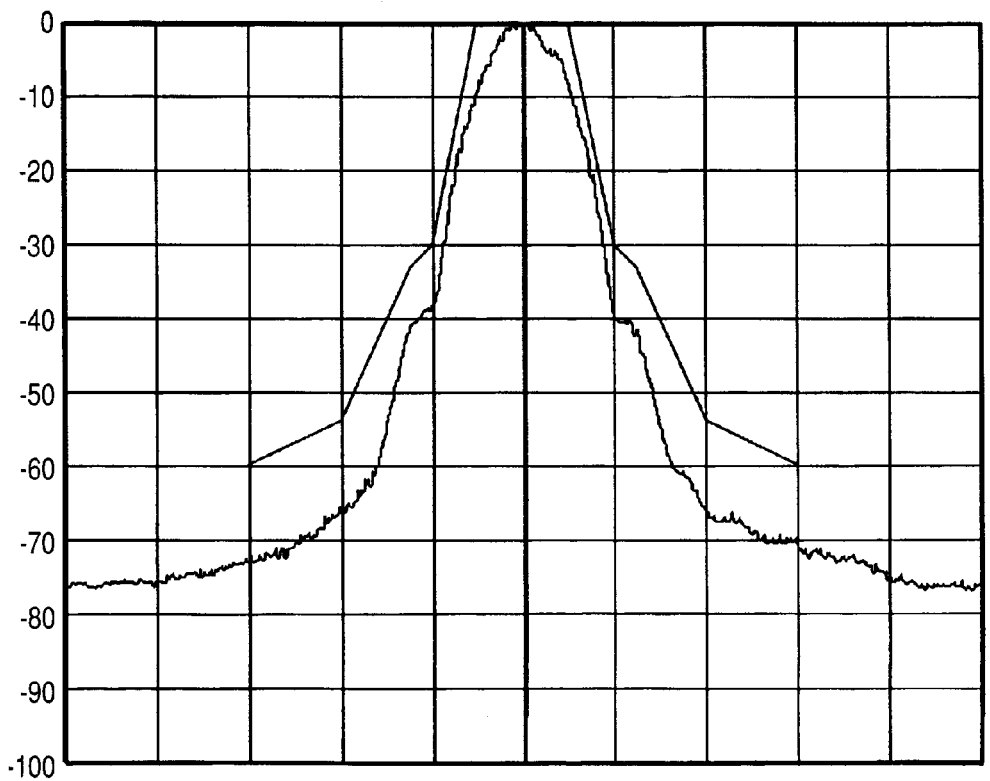
FIG. 5 A frequency spectrum of a power amplifier output in a case where the first embodiment is applied to the polar modulation system using an 8-PSK modulated wave.

FIG. 5 shows a frequency spectrum of a power amplifier output in the case where the first embodiment of the invention is applied to the polar modulation system using an 8-PSK modulated wave. In FIG. 5, the abscissa indicates the frequency, and the ordinate indicates the power level. When the distortion compensating circuit of the first embodiment of the invention is used, it is possible to realize the spectrum shown in FIG. 5.

As described referring to FIG. 4, transient response characteristics are different in accordance with the absolute value of the output amplitude of the power amplifier 4. Therefore, not only in the case where the transmission output power (average power) is controlled based on the transmission level information S1, but also under conditions that the same output power is set, there is a possibility that the transient response characteristics are different depending on the absolute value of the amplitude of the output signal from the amplitude modulating means 2.

Therefore, it is preferable to have a configuration where step response characteristics of the power amplifier 4 in the case where the steady control voltage level is set more finely than a set value of the steady control voltage satisfying the transmission output power regulation are previously measured, and the first coefficient selecting portion 15 prepares a table corresponding to an input signal ($|r(t)|$), and switches over the coefficient information (func1) which is output in accordance with the input signal.

In the first embodiment of the invention, the method of, in order to avoid lowering of the transmission efficiency of a transmitting apparatus, realizing linearization of the output of the power amplifier 4 with respect to a change of the control voltage without branching the output signal from the power amplifier 4 has been described.

In the case where lowering of the transmission efficiency of the transmitting apparatus is allowed, or where a circuit for branching the output signal from the power amplifier 4 is already connected to the polar modulating circuit, however, the same effects can be attained also in a configuration where a table corresponding to the transmission level information S1 is not disposed, and the coefficient information (func1) is adequately switched over while an adjacent-channel leakage power of the output spectrum of the power amplifier 4 is directly monitored by means which is not shown, or a baseband signal after demodulation of the spectrum is monitored, or so as to minimize an error between the baseband signal and the transmission data.

Also in the cases where the frequency of the input high-frequency signal of the power amplifier 4 is different, and where the environmental temperature is changed, there is a possibility that the transient response characteristics are different. In the case where the polar modulating circuit of the invention is used in a transmitting apparatus, therefore, it is further preferable to have a configuration where a table corresponding to the transmission frequency and the environmental temperature is prepared in the first coefficient selecting portion 15, and the output coefficient information (func1) is switched over in accordance with transmission frequency information transmitted from the controlling portion of the transmitting apparatus which is not shown, temperature information from a temperature sensor which is not shown, or consumption current information from a circuit which monitors, for example, the consumption current (the collector current and the like) of the power amplifier that is equivalent to the temperature information.

In the case where lowering of the transmission efficiency of the transmitting apparatus is allowed, or where a circuit for branching the output signal from the power amplifier 4 is already connected to the polar modulating circuit, the same effects can be attained also in a configuration where the table corresponding to the transmission frequency and the environmental temperature, and the temperature sensor are not disposed, and the coefficient information (func1) is adequately switched over while an adjacent-channel leakage power of the output spectrum of the power amplifier 4 is directly monitored by means which is not shown, or a baseband signal after demodulation of the spectrum is monitored, or so as to minimize an error between the baseband signal and the transmission data.

As described above, in the distortion compensating circuit of the first embodiment of the invention, relating to distortion compensation using the AM-AM and AM-PM characteristics in steady characteristics to be stored in the steady characteristic compensating circuit 11, amplitude information after amplitude correction is multiplied with the coefficient information (func1) expressing the transient response. In the polar modulation system, while suppressing increase of compensation data, therefore, amplitude information relating to a modulated signal can be correctly expressed, or namely low-distortion characteristics of the power amplifier can be realized.

In the first embodiment of the invention, the case where a network analyzer is used has been described as the method of acquiring data which are origins of the data to be stored in the steady characteristic compensating circuit 11. However, it is a matter of course that characteristics of the power amplifier 4 may be acquired by other measuring means.

It is supposed that the steady characteristic compensating circuit 11 stores the AM-AM and AM-PM characteristics as table data. Alternatively, polynomial approximation may be conducted based on the acquired data, and, with respect to the input terminal, a correction signal may be output based on the approximation function.

In the first embodiment of the invention above, the effect that amplitude information relating to a modulated signal in data transmission is correctly expressed has been described. Alternatively, the coefficient information (func1) expressing the transient response may be adjusted with respect to a time elapsed from the starting, so that it is possible to obtain another effect that starting characteristics (ramp control) of a power amplifier which performs a burst operation is speeded up while ensuring stability.

Specifically, in the case where, although rapid starting characteristics are requested, the response converges without exceeding a predetermined value during the transient response period as in the low output amplitude in FIG. 4, the coefficient information (func1) indicated by Expression (5) is output to the first amplitude information adjusting portion 13 based on step response characteristics with respect to the control voltage which are previously acquired, in an early stage of starting (0 to t1), so that a control voltage that is higher than a control voltage at which a predetermined level is obtained is applied to the amplifier. In the subsequent period (after t1), the coefficient information (func1) indicated by Expression (6) is output to the first amplitude information adjusting portion 13. For example, the coefficient information (func1) can be set in correspondence with the transmission level information S1 indicative of the output amplitude of the amplifier.

In this way, the level adjustment of the control voltage using the coefficient information (func1) is executed for the time elapsed from the starting, whereby the starting characteristics of the power amplifier can be speeded up. Furthermore, a circuit for feeding back the output signal of the amplifier is not required. Therefore, oscillation due to addition of a feedback circuit can be avoided, and also stability is ensured.

$$func1 > 1 \tag{5}$$

$$func1 = 1 \tag{6}$$

Therefore, a ramp controlling circuit for a power amplifier may be configured by using the distortion compensating circuit of the first embodiment of the invention.

In order to conduct high-speed communication, for example, a cellular system such as the GSM, a wireless LAN system such as IEEE 802.11a/b/g, or the UWB (Ultra Wide Band), the circuit can be applied to a system in which rapid starting characteristics for a pulse signal are requested.

In the above, starting characteristics of a power amplifier have been described. It is a matter of course that, even when the circuit is applied to an amplifier located in a front stage of a power amplifier, or an oscillator, the effect that starting characteristics is speeded up is similarly attained.

Second Embodiment

A second embodiment of the invention describes a method which has been described in the first embodiment of the invention, and in which, in the polar modulation system, while suppressing increase of compensation data, amplitude/phase information relating to a modulated signal is correctly expressed by performing phase compensation based on a signal to which transient characteristic compensation is reflected.

Figure 6:
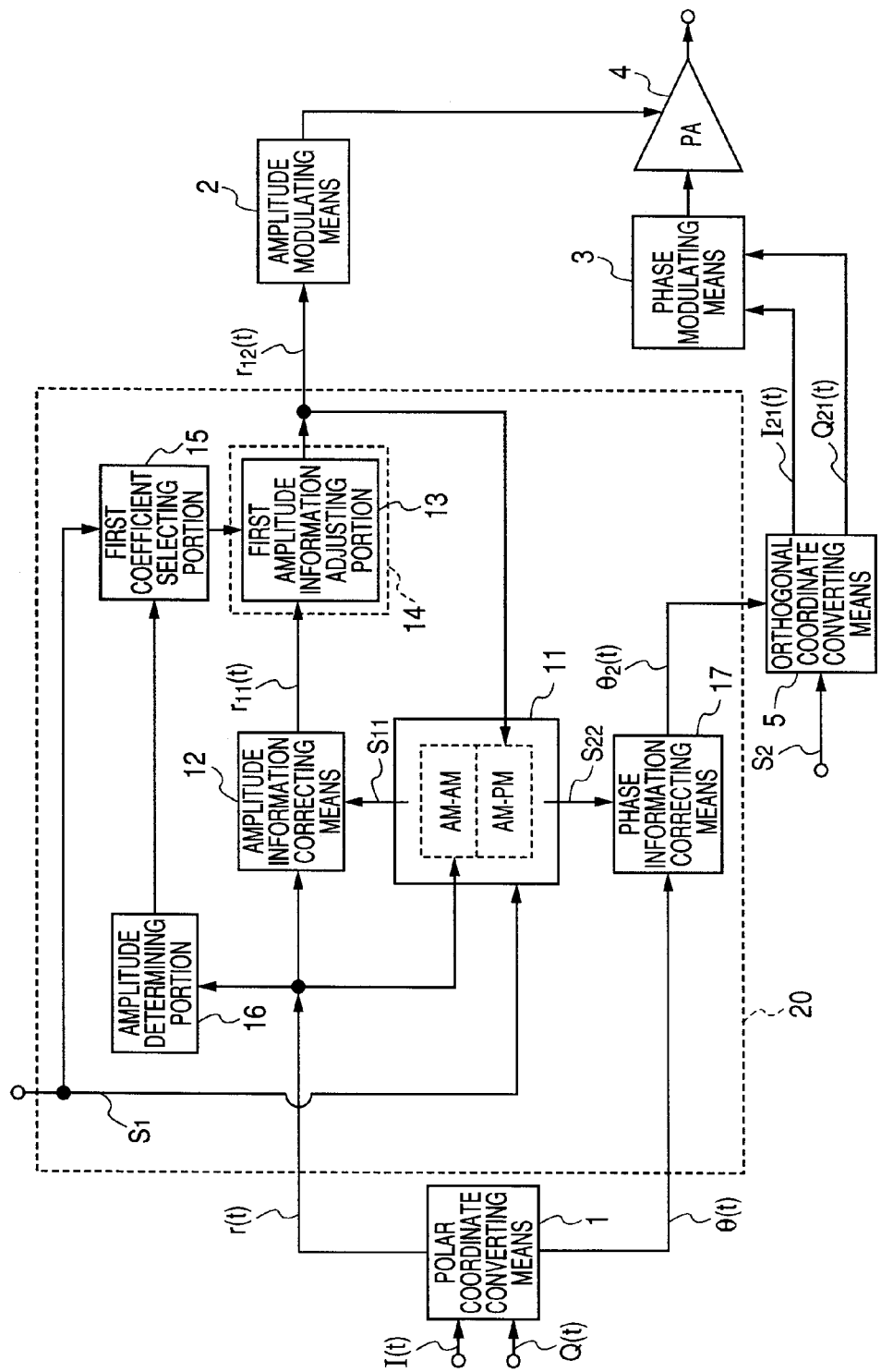
FIG. 6 A view showing an example of a schematic configuration of a polar modulating circuit of a second embodiment of the invention.
Figure 7:
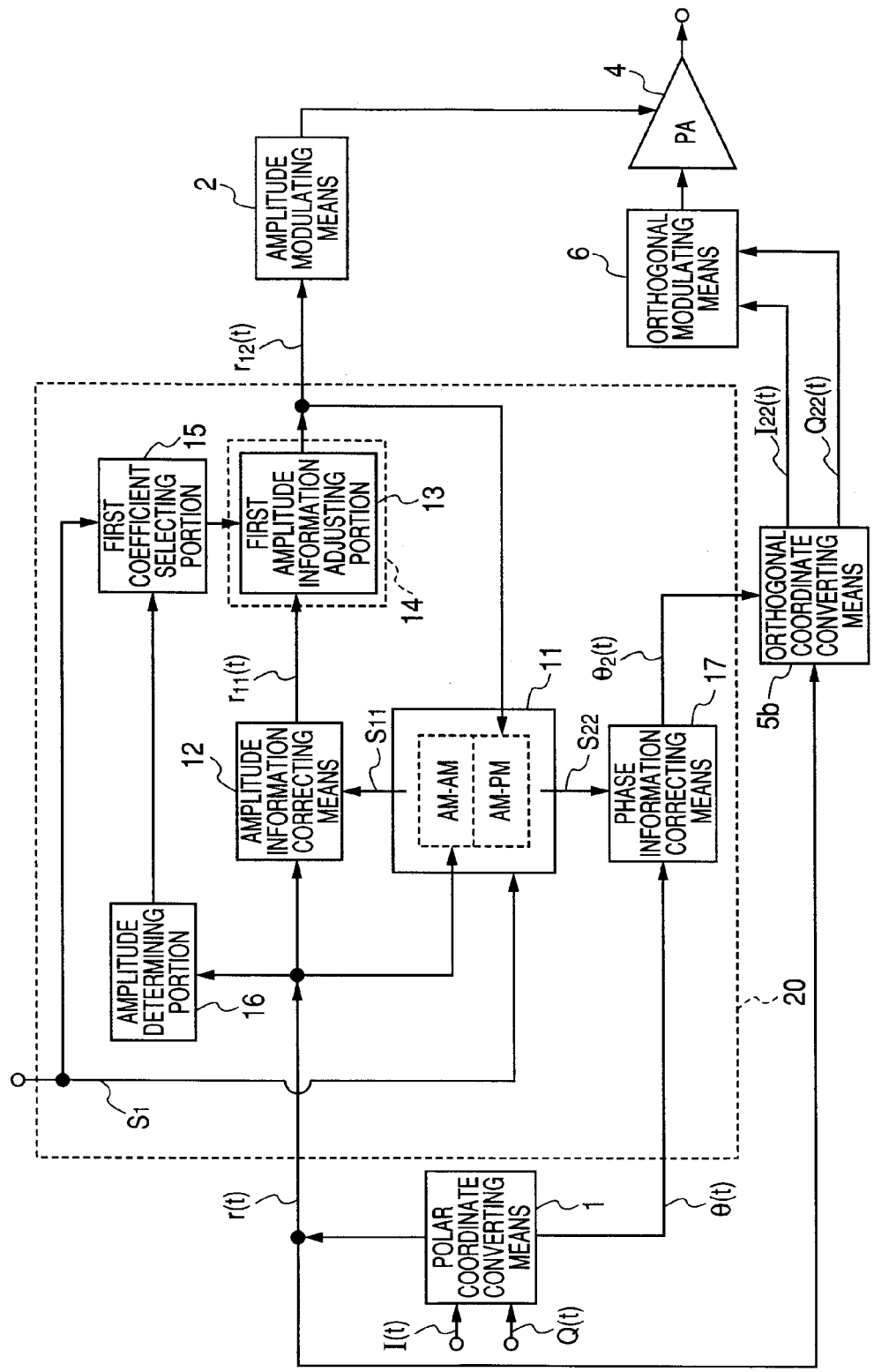
FIG. 7 A view showing another example of the schematic configuration of the polar modulating circuit of the second embodiment of the invention.

FIG. 6 is a view showing an example of a schematic configuration of a polar modulating circuit of the second embodiment of the invention, and FIG. 7 is a view showing another example of the schematic configuration of the polar modulating circuit of the second embodiment of the invention. The portions which are duplicated with those of the polar modulating circuit of FIG. 1 or 2 which has been described in the first embodiment of the invention are denoted by the same reference numerals.

As shown in FIGS. 6 and 7, in a distortion compensating circuit 20 of the second embodiment of the invention, the steady characteristic compensating circuit 11 stores in the same memory the AM-AM and AM-PM characteristics in the same data format as the first embodiment of the invention, and outputs a phase correction signal S22 while setting the output signal r12(t) from the first amplitude information adjusting portion 13 as an address designation signal. The method of producing the amplitude correction signal S11 is identical with the first embodiment of the invention, and its description is omitted.

The phase information correcting means 17 performs correction on the phase information θ(t) on the basis of the phase correction signal S22 output from the steady characteristic compensating circuit 11, and outputs phase information θ2(t) after correction to the orthogonal coordinate converting means 5 or the orthogonal coordinate converting means 5b.

In the same operation as the first embodiment of the invention, the orthogonal coordinate converting means 5 of FIG. 6 outputs I21(t) and Q21(t) to the phase modulating means 3.

In the same operation as the first embodiment of the invention, the orthogonal coordinate converting means 5b of FIG. 7 outputs I22(t) and Q22(t) to the quadrature modulating means 6.

Namely, as compared with the distortion compensating circuit 10 shown in FIGS. 1 and 2, the distortion compensating circuit is different in that, when accessing AM-PM data, the steady characteristic compensating circuit 11 of the distortion compensating circuit 10 sets r11(t) as the address designation signal, and by contrast the steady characteristic compensating circuit 11 of the distortion compensating circuit 20 sets r12(t) as an address designation signal.

In the case where the polar modulating circuit of the invention is used in a transmitting apparatus, a DA converter which is not shown is placed between, in FIG. 6, stages of the first amplitude information adjusting portion 13 and the amplitude modulating means 2, and stages of the orthogonal coordinate converting means 5 and the phase modulating means 3, and between, in FIG. 7, stages of the first amplitude information adjusting portion 13 and the amplitude modulating means 2, and stages between the orthogonal coordinate converting means 5b and the quadrature modulating means 6.

According to the configuration, when the address designation signal in the case where the AM-PM data stored in the steady characteristic compensating circuit 11 are to be accessed is set to the amplitude information r12(t) in which transient response characteristics of the output signal when the control voltage fluctuates are considered, it is possible to consider transient response characteristics during control voltage fluctuation, also in phase correction data.

As described above, in the distortion compensating circuit of the second embodiment of the invention, relating to distortion compensation using the AM-AM and AM-PM characteristics in steady characteristics to be stored in the steady characteristic compensating circuit 11, a signal which is obtained by multiplying amplitude information after amplitude correction by the coefficient information (func1) expressing the transient response is set as the address designation signal when the phase correction signal is to be produced. In the polar modulation system, while suppressing increase of compensation data, therefore, amplitude/phase information relating to a modulated signal can be correctly expressed, or namely low-distortion characteristics of the power amplifier can be realized.

Third Embodiment

A third embodiment of the invention describes a method different from the first embodiment of the invention, relating to a method which, in the polar modulation system, realizes linearization of an output of a power amplifier with respect to a control voltage without using a feedback system, in order to avoid lowering of the transmission efficiency of a transmitting apparatus caused by a branching portion for an output signal of the power amplifier that is required in the configuration a circuit for performing a process of comparing transmission data with demodulated data of an output signal from the power amplifier, and updating compensation data so as to reduce an error (hereinafter, referred to as adaptive process).

Furthermore, the embodiment describes a method of easily adjusting the inclination of the AM-AM characteristics of the power amplifier in order to compensate frequency and temperature characteristics of the power amplifier, and the like.

Figure 8A:
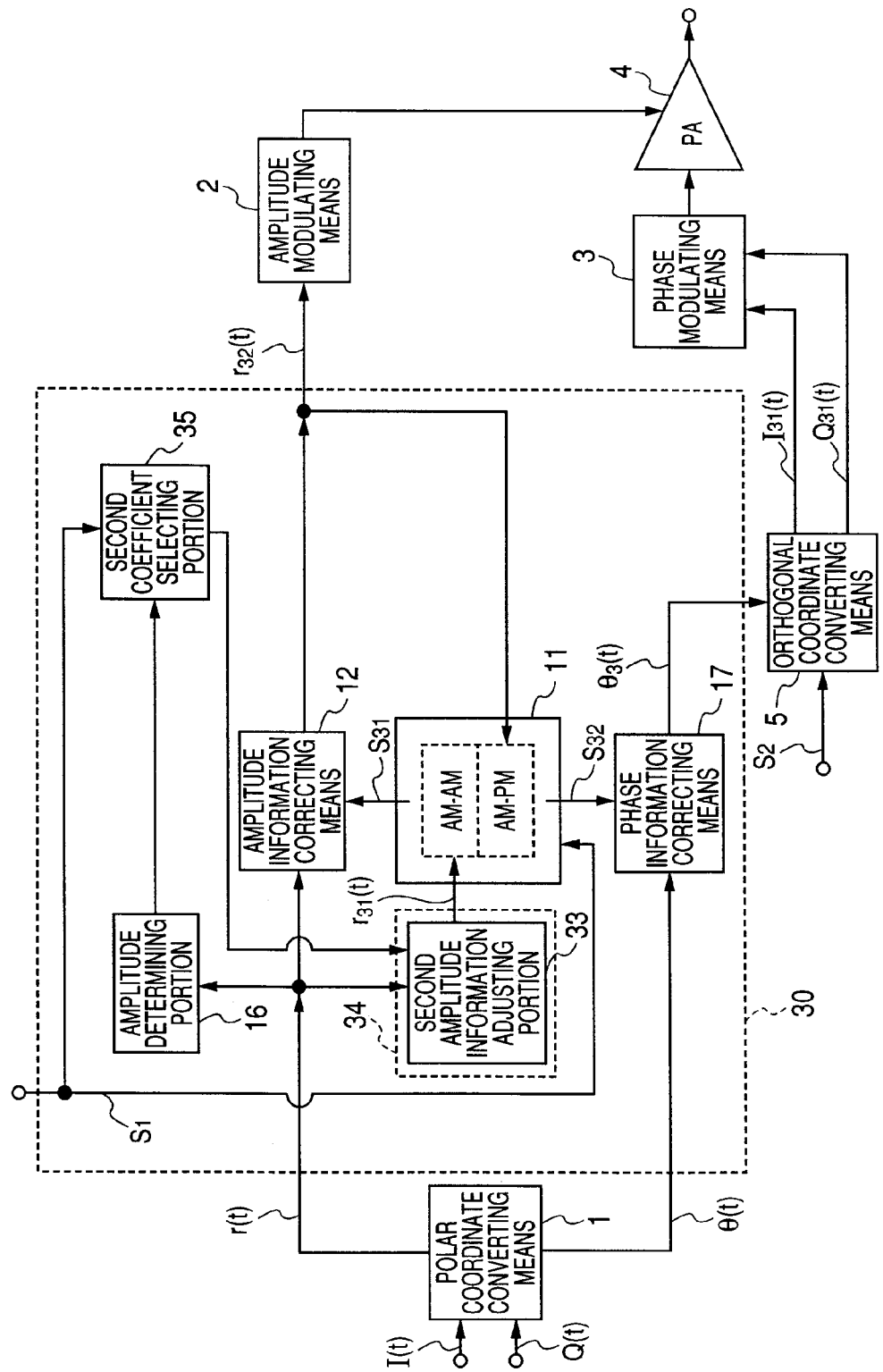
FIG. 8a A view showing an example of a schematic configuration of a polar modulating circuit of a third embodiment of the invention.
Figure 8B:
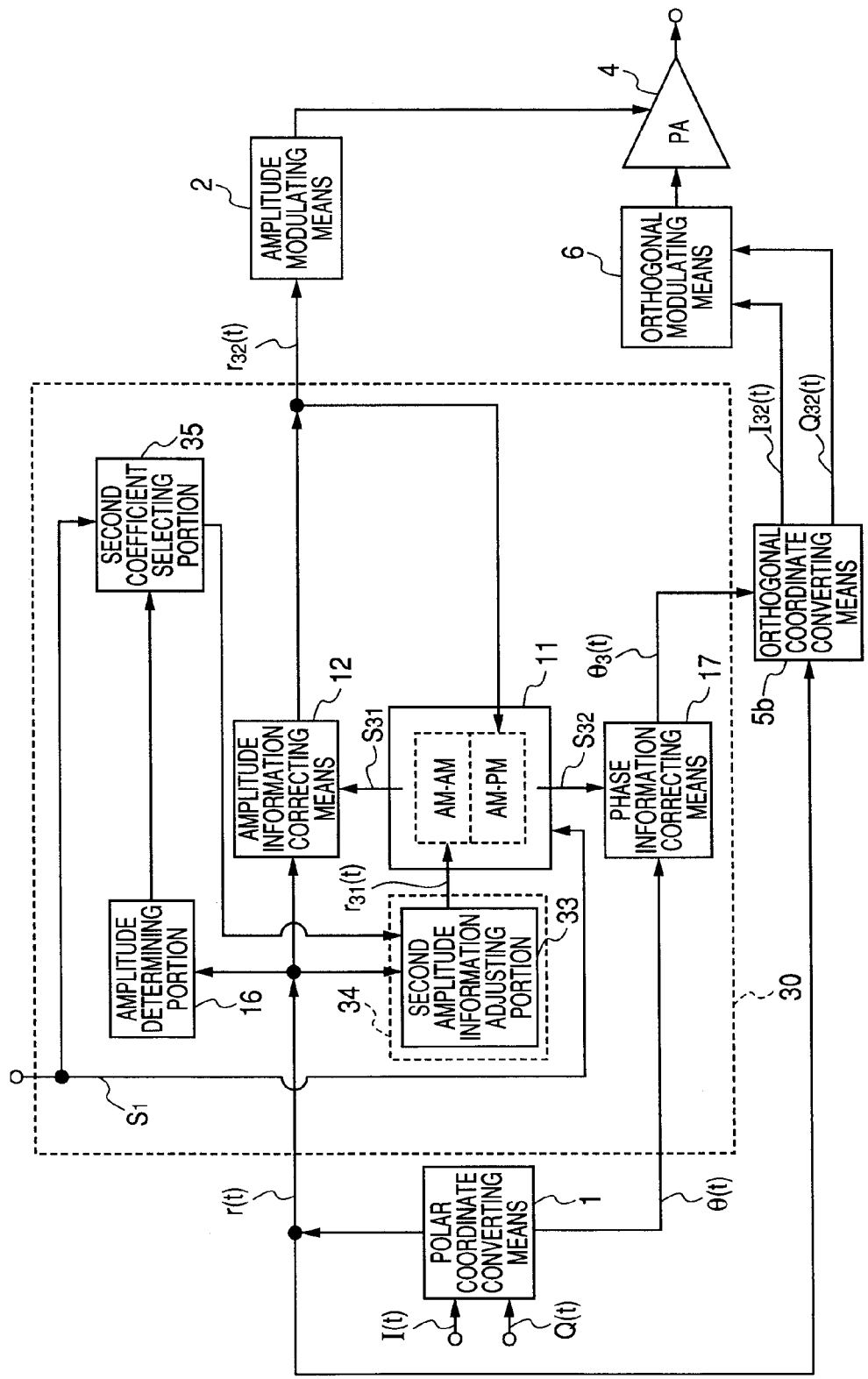
FIG. 8b A view showing another example of the schematic configuration of the polar modulating circuit of the third embodiment of the invention.

FIG. 8(a) is a view showing an example of a schematic configuration of a polar modulating circuit of the third embodiment of the invention, and FIG. 8(b) is a view showing another example of the schematic configuration of the polar modulating circuit of the third embodiment of the invention. The portions which are duplicated with those of the polar modulating circuit of FIG. 1 or 2 which has been described in the first embodiment of the invention are denoted by the same reference numerals.

As shown in FIGS. 8(a) and 8(b), a distortion compensating circuit 30 of the third embodiment of the invention comprises a second amplitude information adjusting portion 33, a transient characteristic compensating circuit 34 having the second amplitude information adjusting portion 33, and a second coefficient selecting portion 35, in place of the first amplitude information adjusting portion 13, the transient characteristic compensating circuit 14 having the first amplitude information adjusting portion 13, and the first coefficient selecting portion 15 in the distortion compensating circuit 10 of FIG. 1 or FIG. 2.

The second amplitude information adjusting portion 33 multiplies the amplitude information r(t) by predetermined coefficient information (func2) to output amplitude information r31(t).

The second coefficient selecting portion 35 stores a table of coefficient information corresponding to the transmission level information S1, in order to set the coefficient information (func2) of the second amplitude information adjusting portion 33.

The steady characteristic compensating circuit 11 stores in the memory the AM-AM and AM-PM characteristics in the same data format as the first embodiment of the invention, and outputs an amplitude correction signal S31 and a phase correction signal S32 while setting the output signal r31(t) from the second amplitude information adjusting portion 33, and an output signal r32(t) from the amplitude information correcting means 12 as address designation signals.

The phase information correcting means 17 performs correction on the phase information θ(t) on the basis of the phase correction signal S32 output from the steady characteristic compensating circuit 11, and outputs phase information θ3(t) after correction to the orthogonal coordinate converting means 5 or the orthogonal coordinate converting means 5b.

In the same operation as the first embodiment of the invention, the orthogonal coordinate converting means 5 of FIG. 8(*a*) outputs I31(*t*) and Q31(*t*) to the phase modulating means 3.

In the same operation as the first embodiment of the invention, the orthogonal coordinate converting means 5 *b* of FIG. 8(*b*) outputs I32(*t*) and Q32(*t*) to the quadrature modulating means 6.

Next, a correcting method and procedure in which the transient response in the case where the control voltage is driven at high speed is considered will be described.

The second coefficient selecting portion 35 previously measures step response characteristics of the power amplifier 4 during supply of a control voltage, and outputs the coefficient information (func2) indicated by Expression (8) to the second amplitude information adjusting portion 33 so that r(t) and r31(*t*) have the relationship indicated by Expression (7), in the case where transient response characteristics are in an overshoot state as in the high output amplitude in FIG. 4. By contrast, in the case where the response converges without exceeding a predetermined value during the transient response period as in the low output amplitude in FIG. 4, the second coefficient selecting portion outputs the coefficient information (func2) indicated by Expression (10) to the second amplitude information adjusting portion 33 so that r(t) and r31(*t*) have the relationship indicated by Expression (9).

$$r(t) > r31(t) \tag{7}$$

$$func2 < 1 \tag{8}$$

$$r(t) \leq r31(t) \tag{9}$$

$$func2 \geq 1 \tag{10}$$

In this way, when the address designation signal in the case where the AM-AM data stored in the steady characteristic compensating circuit 11 are to be accessed is set to the amplitude information r31(*t*) in which transient response characteristics of the output signal when the control voltage fluctuates are considered, it is possible to obtain a desired output of the power amplifier 4 even when the control voltage is driven at high speed.

Here, the meaning of the multiplication of the coefficient information (func2) with the address designation signal will be described with using AM-AM characteristics of the power amplifier 4.

Figure 9:
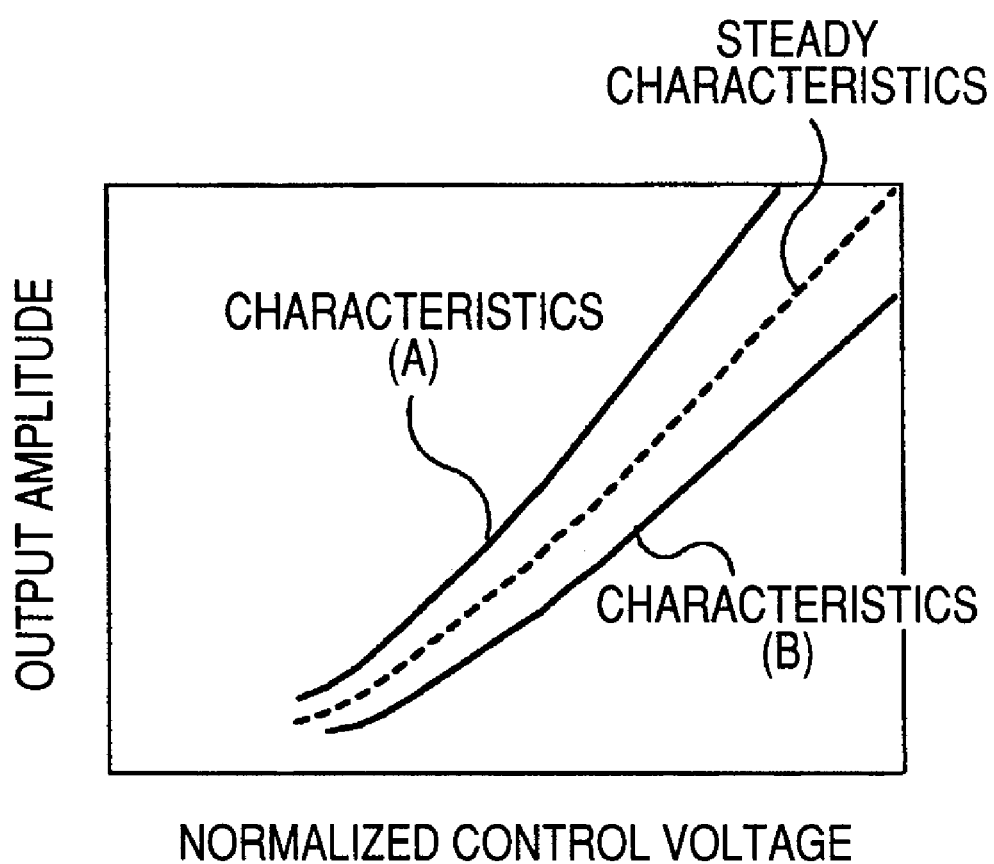
FIG. 9 A view showing AM-AM characteristics of a power amplifier.

FIG. 9 is a view showing an example of the AM-AM characteristics of the power amplifier 4. The characteristics are varied depending on the device configuration and structure of the power amplifier 4.

In FIG. 9, the abscissa indicates a normalized control voltage which is normalized with a steady control voltage at which the maximum value of the output amplitude is obtained, and the ordinate indicates the output amplitude voltage of the power amplifier 4. The characteristics of the broken line in FIG. 9 are output amplitude characteristics with respect to the steady control voltage, and the characteristics (A) and (B) shown by the solid lines in FIG. 9 are characteristics that are obtained by executing correction in which transient response characteristics are considered.

Figure 26:
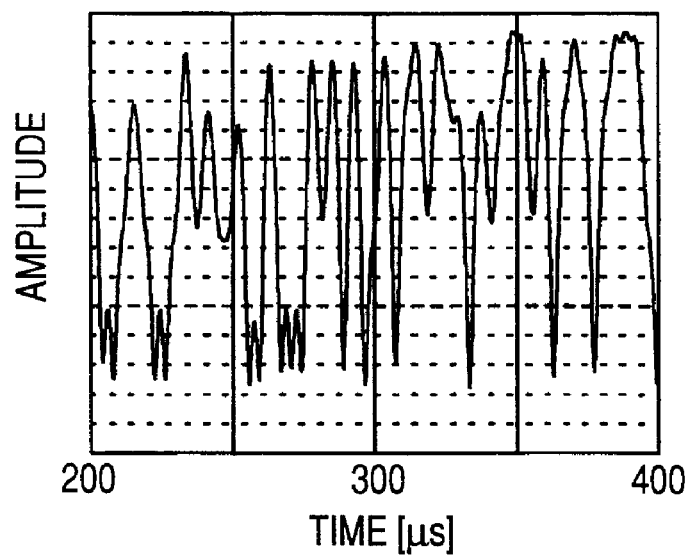
FIG. 26 A view showing an amplitude signal during 8-PSK modulation.

The concept of AM-AM characteristic compensation is that a control voltage value which is to be given as the control voltage of the power amplifier 4 is determined in order to express the amplitude component of a modulated signal by the output of the power amplifier 4. In the case where the amplitude component of a modulated signal such as shown in FIG. 26 is to be expressed, therefore, normalization is performed by multiplying the amplitude component by a predetermined value, and then the reference is made coincident with the output amplitude voltage axis indicated by the ordinate of FIG. 9. The coincidence of the reference means that the maximum value of the amplitude signal is made coincident with the maximum value of the output amplitude of the power amplifier 4. Based on an amplitude values at each predetermined time interval of the signal amplitude after the coincidence of the reference, the control voltage value at which the amplitude value is attained is obtained, or namely the amplitude value is prolonged perpendicularly with the ordinate of FIG. 9, and the control voltage value of the abscissa at the intersection with the characteristic curve is obtained, whereby the control voltage after correction is obtained.

The characteristics (A) show the concept of correction in the case where transient response characteristics are in an overshoot state as in the high output amplitude in FIG. 4. Namely, in the case where the transient characteristics show overshoot characteristics, a process of reducing the output amplitude more than the case of the steady characteristics is conducted, and hence the correction is equivalent to correction according to a characteristic curve in which the inclination is larger than the steady characteristic curve.

Next, the characteristics (B) show the concept of correction in the case where the response converges without exceeding a predetermined value during the transient response period as in the low output amplitude in FIG. 4. Namely, in the case where the response converges without exceeding the predetermined value during the transient response period, a process of amplifying the output amplitude more than the case of the steady characteristics is conducted, and hence the correction is equivalent to correction according to a characteristic curve in which the inclination is smaller than the steady characteristic curve.

In the same manner as the first coefficient selecting portion 15, preferably, the second coefficient selecting portion 35 has a configuration in which a table corresponding to the input signal (|r(t)|) is prepared, and the coefficient information (func2) which is output in accordance with the input signal is switched over, or a configuration in which, in the case where the polar modulating circuit of the invention is used in a transmitting apparatus, a table corresponding to the transmission frequency and the environmental temperature is prepared, and the output coefficient information (func2) is switched over in accordance with transmission frequency information transmitted from the controlling portion of the transmitting apparatus which is not shown, temperature information from a temperature sensor which is not shown, or consumption current information from a circuit which monitors, for example, the consumption current (the collector current and the like) of the power amplifier that is equivalent to the temperature information.

In the third embodiment of the invention, the method of, in order to avoid lowering of the transmission efficiency of a transmitting apparatus, realizing linearization of the output of the power amplifier 4 with respect to a change of the control voltage without branching the output signal from the power amplifier 4 has been described. In the case where lowering of the transmission efficiency of the transmitting apparatus is allowed, or where a circuit for branching the output signal from the power amplifier 4 is already connected to the polar modulating circuit, however, the same effects can be attained also in a configuration where a table corresponding to the transmission level information S1, the transmission frequency, and the environmental temperature, and the temperature sensor are not disposed, and the coefficient information (func2) is adequately switched over while an adjacent-channel leakage power of the output spectrum of the power amplifier 4 is directly monitored by means which is not shown, or a baseband signal after demodulation of the spectrum is monitored, or so as to minimize an error between the baseband signal and the transmission data.

In the above, as an effect of the transient characteristic compensating circuit 34, the method of realizing linearization of the output of the power amplifier with respect to the control voltage by improving the step response characteristics when the control voltage is applied has been described.

Next, a method of simply adjusting the inclination of the AM-AM characteristics of the power amplifier in order to compensate the frequency and temperature characteristics of the power amplifier, and the like will be described.

In the cases where the frequency of the input high-frequency signal of the power amplifier 4 is different, and where the environmental temperature is changed, there is a possibility that, in addition to the transient response characteristics, for example, the inclination itself of the AM-AM characteristics of the power amplifier is changed.

However, the multiplying process of the second amplitude information adjusting portion 33 constituting the transient characteristic compensating circuit 34 is equivalent to adjustment of the inclination of the AM-AM characteristics. Therefore, the process can be applied as a method of adjusting the inclination of the AM-AM characteristics, and has also effects of improving the frequency and temperature characteristics.

Namely, the frequency and temperature characteristics can be improved by a configuration in which the coefficient information (func2) is prepared as a table so as to express changes of the AM-AM characteristics with respect to the transmission frequency and the environmental temperature, and, in the case where the polar modulating circuit of the invention is used in a transmitting apparatus, the coefficient information (func2) is switched over in accordance with transmission frequency information transmitted from the controlling portion of the transmitting apparatus which is not shown, temperature information from a temperature sensor which is not shown, or consumption current information from a circuit which monitors, for example, the consumption current (the collector current and the like) of the power amplifier that is equivalent to the temperature information.

In the case where lowering of the transmission efficiency of the transmitting apparatus is allowed, or where a circuit for branching the output signal from the power amplifier 4 is already connected to the polar modulating circuit, the same effects can be attained also in a configuration where the table corresponding to the transmission frequency and the environmental temperature, and the temperature sensor are not disposed, and the coefficient information (func2) is adequately switched over while an adjacent-channel leakage power of the output spectrum of the power amplifier 4 is directly monitored by means which is not shown, or a baseband signal after demodulation of the spectrum is monitored, or so as to minimize an error between the baseband signal and the transmission data.

Figure 10:
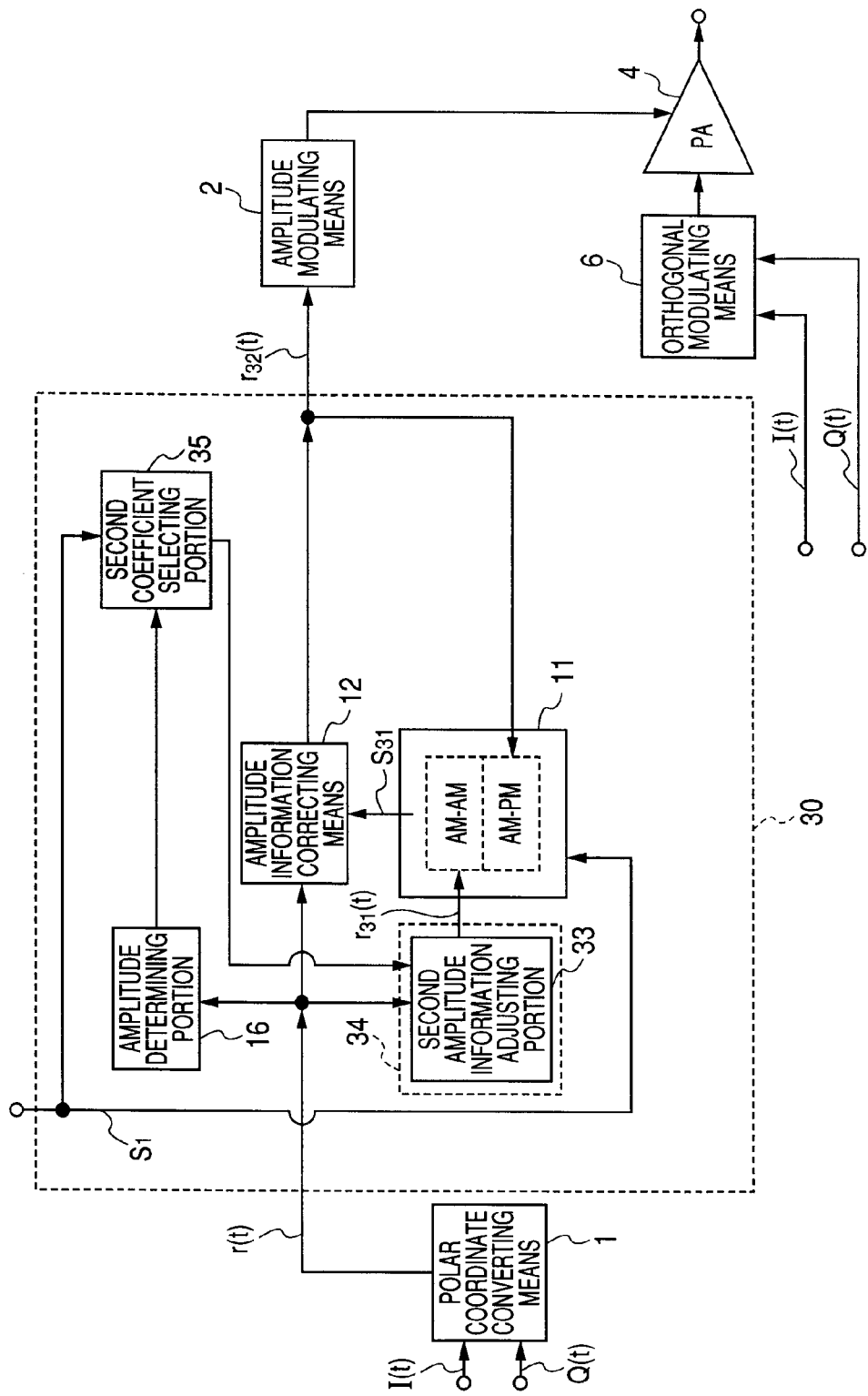
FIG. 10 A view showing a further example of the schematic configuration of the polar modulating circuit of the third embodiment of the invention.

Another example of the polar modulating circuit of the third embodiment of the invention may have the configuration shown in FIG. 10. FIG. 10 is a view showing the other example of the schematic configuration of the polar modulating circuit of the third embodiment of the invention. The polar modulating circuit of this example is configured so that the orthogonal coordinate converting means 5b and the phase information correcting means 17 are removed away from FIG. 8(b), and the input IQ signal of the quadrature modulating means 6 is changed from I32(t), Q32(t) to an IQ signal (I(t), Q(t)) input from the baseband signal generating portion of the transmitting apparatus which is not shown, thereby omitting the phase correction of the phase-modulated signal. Namely, the invention shown by the third embodiment of the invention performs compensation only on a portion of the power amplifier 4 relating to the control voltage.

In the case where the polar modulating circuit of the invention is used in a transmitting apparatus, a DA converter which is not shown is placed between, in FIG. 8(a), stages of the amplitude information correcting means 12 and the amplitude modulating means 2, and stages of the orthogonal coordinate converting means 5 and the phase modulating means 3, between, in FIG. 8(b), stages of the amplitude information correcting means 12 and the amplitude modulating means 2, and stages of the orthogonal coordinate converting means 5b and the quadrature modulating means 6, and between, in FIG. 10, stages of the amplitude information correcting means 12 and the amplitude modulating means 2, and in front of the quadrature modulating means 6.

As described above, according to the third embodiment of the invention, relating to distortion compensation using the AM-AM and AM-PM characteristics in steady characteristics to be stored in the steady characteristic compensating circuit 11, the address designation signal when the phase correction signal is to produced is multiplied by the coefficient information (func2) expressing the transient response, whereby, in the polar modulation system, while suppressing increase of compensation data, amplitude/phase information relating to a modulated signal can be correctly expressed, or namely low-distortion characteristics of the power amplifier can be realized.

In the third embodiment of the invention above, the effect that amplitude information relating to a modulated signal in data transmission is correctly expressed has been described. It is a matter of course that starting characteristics (ramp control) of a power amplifier which performs a burst operation can be stabilized by adjusting the coefficient information (func2) expressing the transient response with respect to the starting time. Therefore, a ramp controlling circuit for a power amplifier may be configured by using the distortion compensating circuit of the third embodiment of the invention.

As described above, in the third embodiment of the invention, the multiplying process conducted by the second amplitude information adjusting portion 33 is equivalent to the process of adjusting the inclination of the characteristic curve. Therefore, it is a matter of course that the same effects are attained also when the multiplying process conducted by the second amplitude information adjusting portion 33 is previously conducted on the data stored in the steady characteristic compensating circuit 11.

Fourth Embodiment

A fourth embodiment of the invention describes a method which cannot be solved by related art 4, and which, in the polar modulation system, compensates a change of the phase characteristics at a signal change point without using a feedback system.

Figure 11:
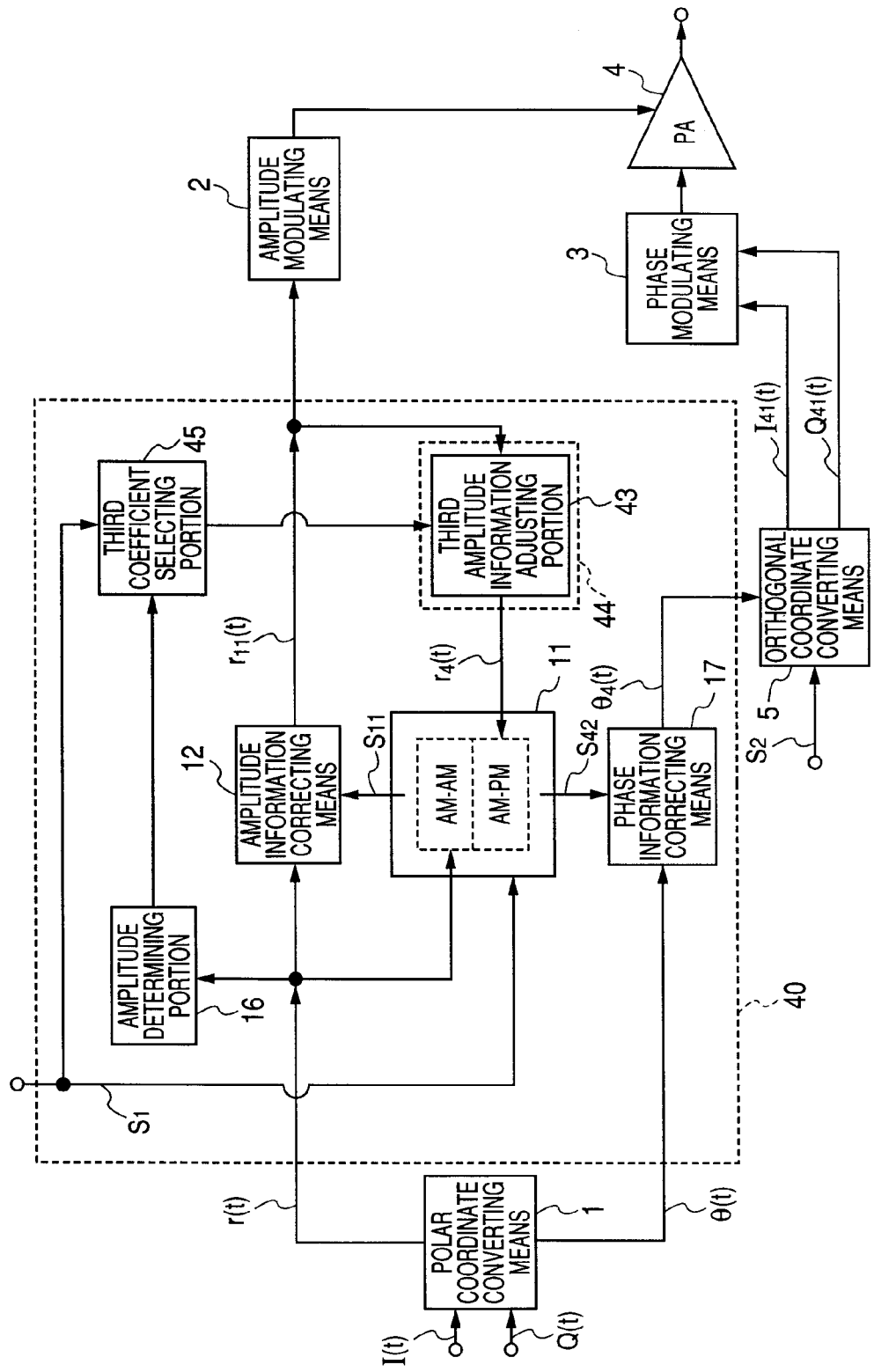
FIG. 11 A view showing an example of a schematic configuration of a polar modulating circuit of a fourth embodiment of the invention.
Figure 12:
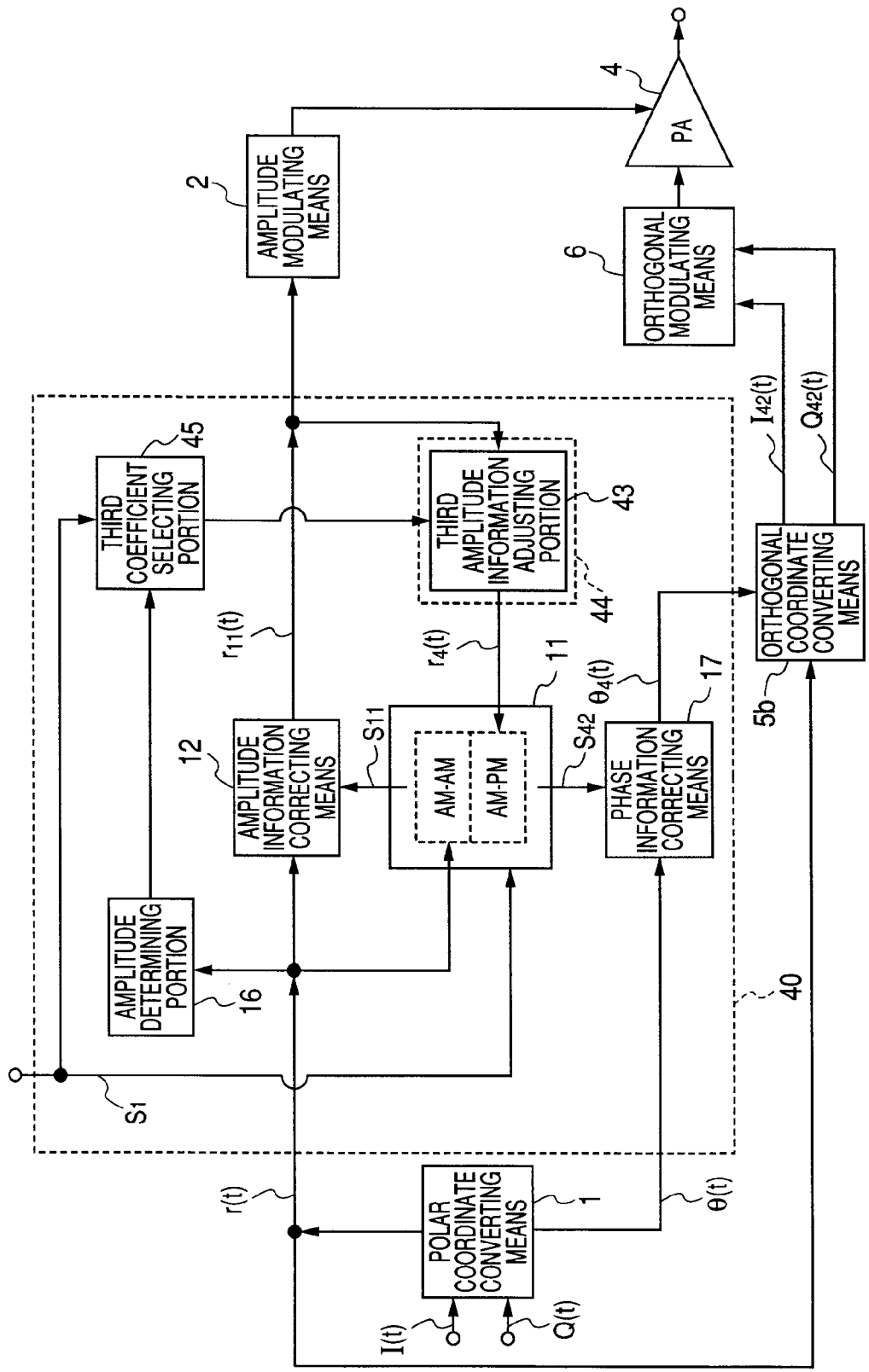
FIG. 12 A view showing another example of the schematic configuration of the polar modulating circuit of the fourth embodiment of the invention.

FIGS. 11 and 12 are views showing a schematic configuration of a polar modulating circuit of the fourth embodiment of the invention. The portions which are duplicated with those of the polar modulating circuit of FIG. 1 or 2 which has been described in the first embodiment of the invention are denoted by the same reference numerals.

As shown in FIGS. 11 and 12, a distortion compensating circuit 40 of the fourth embodiment of the invention comprises a third amplitude information adjusting portion 43, a phase compensating circuit 44 having the third amplitude information adjusting portion 43, and a third coefficient selecting portion 45, in place of the first amplitude information adjusting portion 13, the transient characteristic compensating circuit 14 having the first amplitude information adjusting portion 13, and the first coefficient selecting portion 15 of the distortion compensating circuit 10 of FIG. 1 or 2.

The third amplitude information adjusting portion 43 multiplies the output signal $r11(t)$ from the amplitude information correcting means 12 by predetermined coefficient information (func3) to output amplitude information $r4(t)$.

The third coefficient selecting portion 45 sets the coefficient information (func3) of the third amplitude information adjusting portion 43.

The steady characteristic compensating circuit 11 stores in the memory the AM-AM and AM-PM characteristics in the same data format as the first embodiment of the invention, and outputs a phase correction signal S42 with using the output signal $r4(t)$ from the third amplitude information adjusting portion 43 as an address designation signal. The method of producing the amplitude correction signal S11 is identical with the first embodiment of the invention, and its description is omitted.

The phase information correcting means 17 performs correction on the phase information $\theta(t)$ on the basis of the phase correction signal S42 output from the steady characteristic compensating circuit 11, and outputs phase information $\theta 4(t)$ after correction to the orthogonal coordinate converting means 5 or 5b.

In the same operation as the first embodiment of the invention, the orthogonal coordinate converting means 5 of FIG. 11 outputs $I41(t)$ and $Q41(t)$ to the phase modulating means 3.

In the same operation as the first embodiment of the invention, the orthogonal coordinate converting means 5b of FIG. 12 outputs $I42(t)$ and $Q42(t)$ to the quadrature modulating means 6.

In the case where the polar modulating circuit of the invention is used in a transmitting apparatus, a DA converter which is not shown is placed between, in FIG. 11, stages of the amplitude information correcting means 12 and the amplitude modulating means 2, and stages of the orthogonal coordinate converting means 5 and the phase modulating means 3, and between, in FIG. 12, stages of the amplitude information correcting means 12 and the amplitude modulating means 2, and stages of the orthogonal coordinate converting means 5b and the quadrature modulating means 6.

Next, passing phase characteristics with respect to a control voltage of an amplifier will be described.

Figure 27:
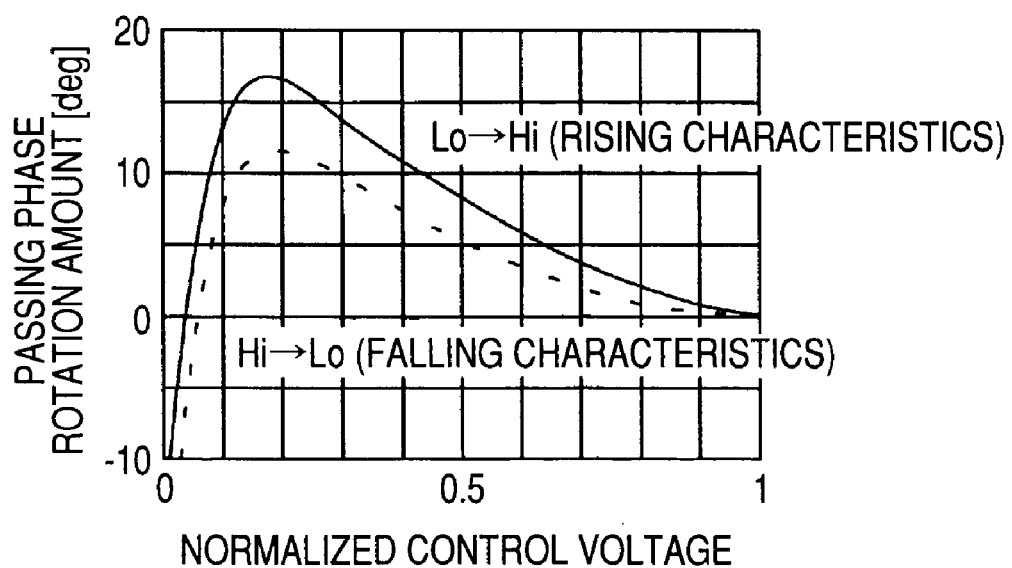
FIG. 27 A view showing passing phase characteristics in a case where a control voltage which is gradually changed (monotonically increased or decreased) with respect to the elapse of time is applied to a power amplifier.

As shown in FIG. 27 which has been described in the background art, depending on the characteristics of the power amplifier 4 and the amplitude modulating means 2, the passing phase characteristics are different in the cases where the control signal is increased, and where the signal is decreased. In order to reduce the correction error, therefore, the phase correction must be performed in consideration of both the rising and falling characteristics.

In order to correct express an modulated signal, when phase correction is executed on the basis of the rising characteristic curve (solid line) in the case where the dynamic range of $r11(t)$ is 0.4 to 1.0 of the normalized control voltage in FIG. 27, for example, phase correction of about 11° is performed between the maximum and minimum values of the control voltage. By contrast, in case of phase correction on the basis of the falling characteristic curve (broken line), correction of about 8° is performed in the same zone. When phase correction referring to the rising characteristic curve is performed in the case where the amplitude of the amplitude information $r(t)$ is in the decreasing direction, a correction error is caused.

As one simple method of reducing the correction error, it is contemplated that the rising and falling characteristic curve are averaged (weighted as required). In the embodiment, in consideration that it is not easy to acquire the rising and falling characteristics, a method of performing correction following the rising and falling characteristics by using the output amplitude and phase characteristics with respect to the control voltage in a steady state will be described.

Figure 13:
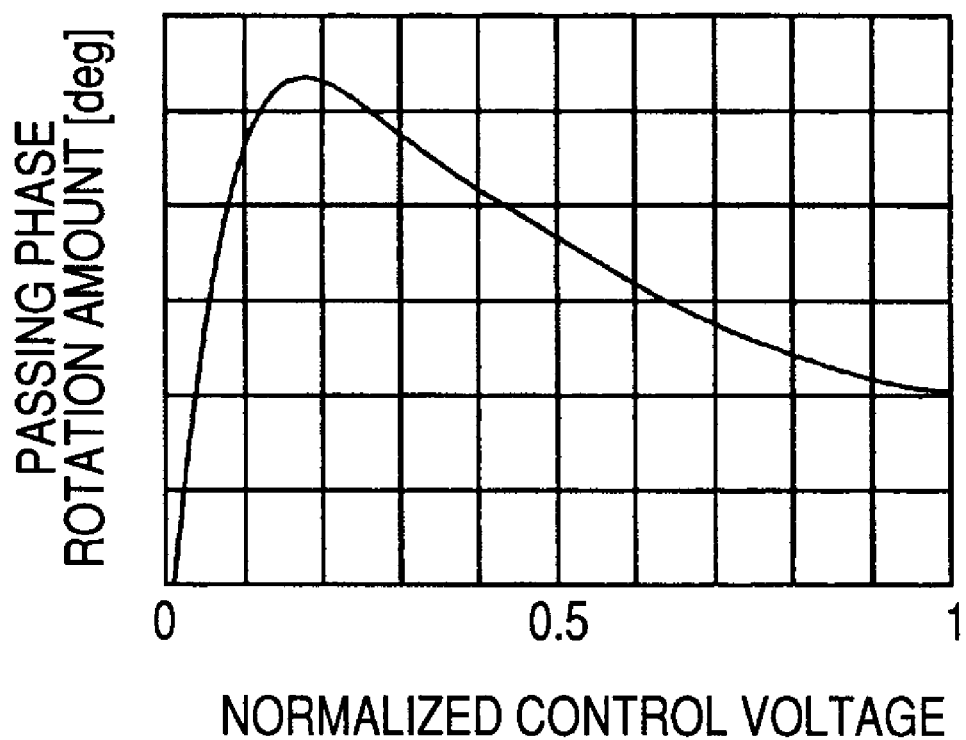
FIG. 13 A view showing passing phase characteristics of a power amplifier with respect to a control voltage (steady state).

FIG. 13 is a view showing passing phase characteristics with respect to the control voltage in a steady state after the control voltage is input. In FIG. 13, the abscissa indicates the normalized control voltage, and the ordinate indicates the passing phase rotation amount. The solid line in the figure shows passing phase characteristics with respect to the control voltage amplitude under conditions that an input high-frequency signal amplitude having a level at which the power amplifier 4 operates in saturation is supplied. The data can be acquired by using, for example, a network analyzer.

When the change rate of the control voltage is lowered, the rising characteristic curve shown in FIG. 27 is made close to the characteristics shown in FIG. 13. In the fourth embodiment of the invention, therefore, description is made with referring to the rising characteristic curve shown by the solid line in FIG. 27 as the characteristic curve of the steady state shown in FIG. 13.

Hereinafter, the operation of the distortion compensating circuit 40 of the fourth embodiment of the invention will be described.

A case where, when the required dynamic range of $r11(t)$ is 0.4 to 1.0 of the normalized control voltage in the same manner as the above example, for example, phase correction is performed by compressing (for example, a compression ratio of 20%) the dynamic range in the direction of the abscissa (control voltage) with reference to the normalized control voltage of 1.0 will be considered.

After compression, the dynamic range is 0.52 to 1.0. The phase correction of 8° is performed between the maximum and minimum values of the control voltage, and the characteristic curve can be made close to the falling characteristic curve. When the coefficient information (func3) is adjusted, therefore, it is possible to, base on the rising characteristic curve, obtain a curve corresponding to averaging, and a curve corresponding to the falling characteristic curve.

In the fourth embodiment of the invention, the third amplitude information adjusting portion 43 performs the above-mentioned compression on the output signal $r11(t)$ output from the amplitude information correcting means 12, and outputs the amplitude information $r4(t)$ after compression as an address designation signal, to the steady characteristic compensating circuit 11. The steady characteristic compensating circuit 11 is configured so as to output the phase correction signal S42 to execute phase correction on the phase information $\theta(t)$ in the phase information correcting means 17.

The reference point (1.0) of normalization of the normalized control voltage of FIGS. 13 and 27 is a control voltage at which the maximum amplitude at a preset transmission level is output. The steady characteristic compensating circuit 11 performs normalization of the control voltage based on the transmission level information S1.

The case where the coefficient information (func3) is constant irrespective of the instantaneous amplitude value of the amplitude information r(t) has been described. When the coefficient information (func3) is adjusted based on |r(t)| output from the amplitude determining portion 16, it is possible to express more correctly the falling characteristic curve from the rising characteristic curve. Preferably, the third coefficient selecting portion 45 is configured so that the coefficient information (func3) corresponding to |r(t)| is previously stored, and the coefficient information (func3) is switched over in accordance with |r(t)|. Also, a configuration in which the coefficient information (func3) corresponding to the transmission level information S1 is previously stored, and the coefficient information (func3) is switched over in accordance with the transmission level information is effective.

When the coefficient information (func3) is switched over in accordance with increase or decrease (Δr(t)) of the amplitude information r(t), it is possible to express more correctly the rising and falling characteristics of the output phase with respect to the control voltage. More preferably, the embodiment is configured so that the coefficient information (func3) corresponding to Δr(t) is previously stored in the third coefficient selecting portion 45, and the coefficient information (func3) is switched over in accordance with Δr(t).

Also in the cases where the frequency of the input high-frequency signal of the power amplifier 4 is different, and where the environmental temperature is changed, there is a possibility that the transient response characteristics are different. Therefore, it is further preferable to have a configuration where a table corresponding to the transmission frequency and the environmental temperature is prepared in the third coefficient selecting portion 45, and the output coefficient information (func3) is switched over in accordance with transmission frequency information which, in the case where the polar modulating circuit of the invention is used in a transmitting apparatus, is transmitted from the controlling portion of the transmitting apparatus which is not shown, temperature information from a temperature sensor which is not shown, or consumption current information from a circuit which monitors, for example, the consumption current (the collector current and the like) of the power amplifier that is equivalent to the temperature information.

In the fourth embodiment of the invention, the method in which, in order to avoid lowering of the transmission efficiency of a transmitting apparatus, the output signal from the power amplifier 4 is not branched has been described. In the case where lowering of the transmission efficiency of the transmitting apparatus is allowed, or where a circuit for branching the output signal from the power amplifier 4 is already connected to the polar modulating circuit, however, the same effects can be attained also in a configuration where a table corresponding to the transmission frequency, and the environmental temperature, and the temperature sensor are not disposed, and the coefficient information (func3) is adequately switched over while an adjacent-channel leakage power of the output spectrum of the power amplifier 4 is directly monitored by means which is not shown, or a baseband signal after demodulation of the spectrum is monitored, or so as to minimize an error between the baseband signal and the transmission data.

As described above, in the distortion compensating circuit of the fourth embodiment of the invention, relating to distortion compensation using the AM-AM and AM-PM characteristics in steady characteristics to be stored in the steady characteristic compensating circuit 11, the address designation signal when the phase correction signal is to produced is multiplied by the coefficient information (func3) expressing the difference of the AM-PM characteristics with respect to rising/falling control signals, whereby, in the polar modulation system, while suppressing increase of compensation data, phase information can be correctly expressed, or namely low-distortion characteristics of the power amplifier can be realized even when a phase change occurs at a signal change point of the modulated signal.

With respect to the delaying means and feedback system which are problems in related art 4, in the fourth embodiment of the invention, the former is unnecessary, and the latter is not essential. In compensation of the AM-PM characteristics at a signal change point, therefore, the circuit scale can be reduced as compared with related art 4.

When the distortion compensation of the fourth embodiment of the invention which uses the coefficient information (func3) expressing the difference of the AM-PM characteristics with respect to rising/falling control signals is applied to FIGS. 1 and 2 of the first embodiment of the invention, FIGS. 6 and 7 of the second embodiment of the invention, and FIGS. 8(a) and 8(b) of the third embodiment of the invention, further low-distortion characteristics of the power amplifier can be realized.

In the fourth embodiment of the invention, the case where a network analyzer is used is described as the method of acquiring data which are origins of the stored data to the steady characteristic compensating circuit 11. However, it is a matter of course that characteristics of the power amplifier 4 may be acquired by other measuring means.

In the fourth embodiment of the invention, the method of adjusting the AM-PM characteristics has been described. The adjustment of the AM-PM characteristics has the same function as that of adjusting synchronization between the amplitude signal and the phase signal. When the coefficient information (func3) is switched over, therefore, the embodiment can be applied also to the adjustment of synchronization between the amplitude signal and the phase signal. In the description of the method of adjusting the AM-PM characteristics, the example in which the required dynamic range for the control voltage is compressed has been used. It is a matter of course that not only a case of compression but also a case of expansion may exist in the adjustment of synchronization.

Fifth Embodiment

A fifth embodiment of the invention describes a method which cannot be solved by related art 4, which, in the polar modulation system, compensates a change of the phase characteristics at a signal change point without using a feedback system, and which is different from the fourth embodiment of the invention.

Figure 14:
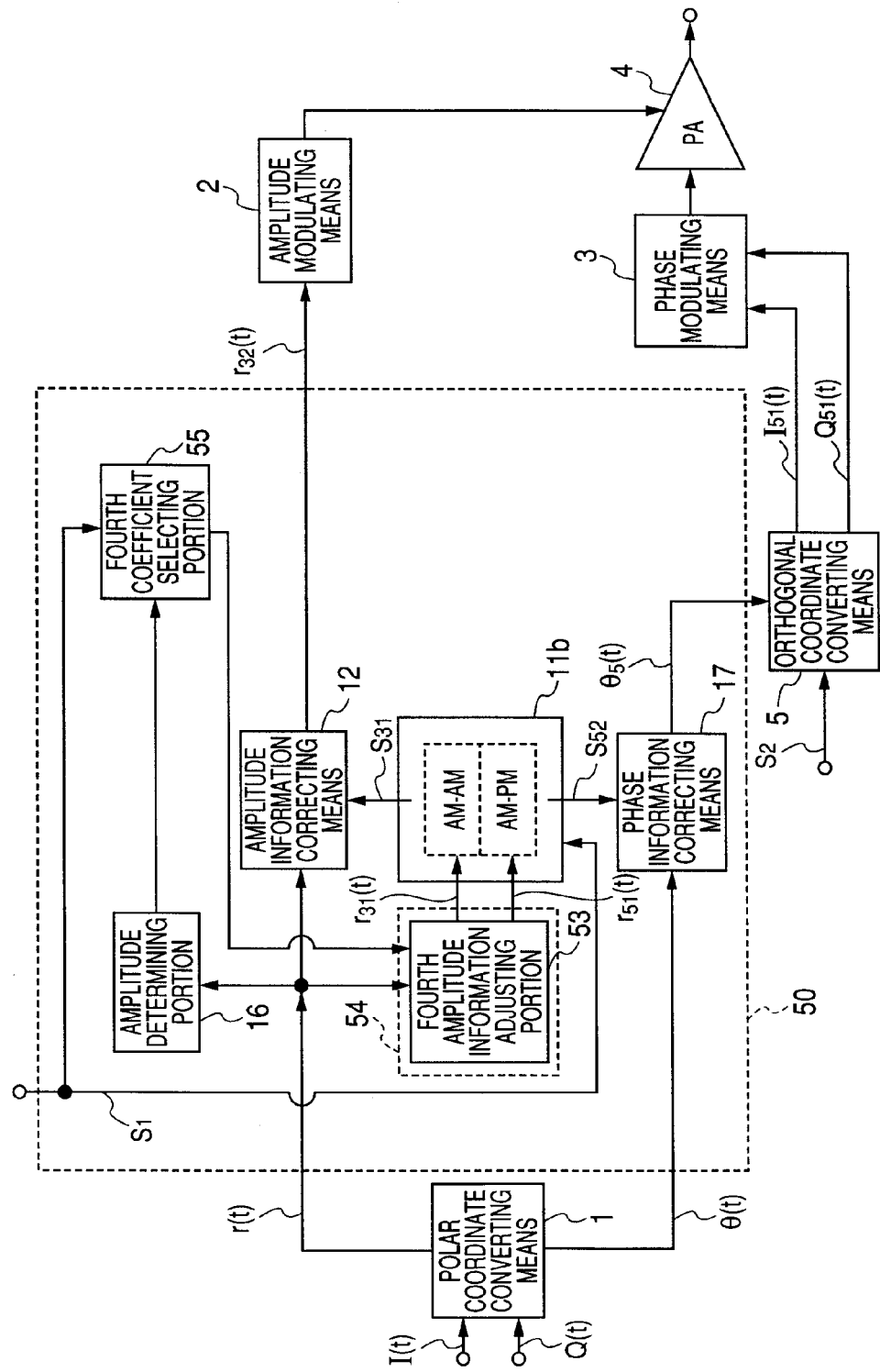
FIG. 14 A view showing an example of a schematic configuration of a polar modulating circuit of a fifth embodiment of the invention.
Figure 15:
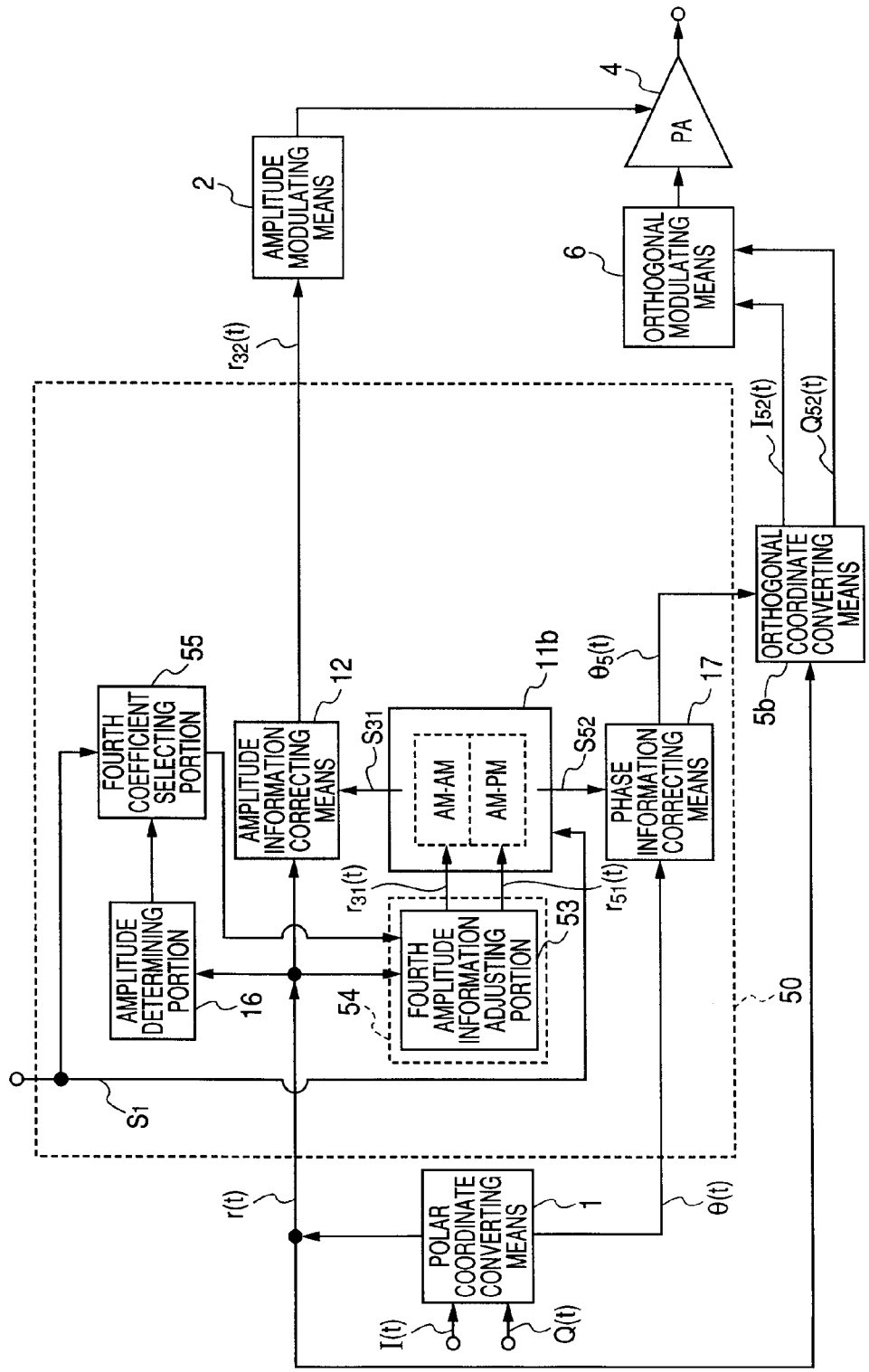
FIG. 15 A view showing another example of the schematic configuration of the polar modulating circuit of the fifth embodiment of the invention.

FIGS. 14 and 15 are views showing a schematic configuration of a polar modulating circuit of the fifth embodiment of the invention. The portions which are duplicated with those of FIGS. 8(a) and 8(b) which have been described in the third embodiment of the invention are denoted by the same reference numerals.

As shown in FIGS. 14 and 15, a distortion compensating circuit 50 of the fifth embodiment of the invention comprises a steady characteristic compensating circuit 11b, a fourth amplitude information adjusting portion 53, a transient characteristic/phase compensating circuit 54 having the fourth amplitude information adjusting portion 53, and a fourth coefficient selecting portion 55, in place of the steady characteristic compensating circuit 11, the second amplitude information adjusting portion 33, the transient characteristic compensating circuit 34 having the second amplitude information adjusting portion 33, and the second coefficient selecting portion 35 in the distortion compensating circuit 30 of FIGS. 8(a) and 8(b).

The fourth amplitude information adjusting portion 53 multiplies the amplitude information r(t) by two predetermined independent coefficient information (func2) and coefficient information (func4) to output amplitude information r31(t) and amplitude information r51(t).

The fourth coefficient selecting portion 55 sets the two independent coefficient information (func2) and coefficient information (func4) of the fourth amplitude information adjusting portion 53.

In the same manner as the steady characteristic compensating circuit 11 of the first embodiment of the invention, the steady characteristic compensating circuit 11b stores, as the AM-AM characteristics, data in the absolute value format of the control voltage with respect to the output signal amplitude, or the predetermined value (data in the format of a difference value) which, after the input control signal amplitude is multiplied or divided by the above-mentioned predetermined value, is normalized with the input control signal so as to attain the absolute value, from output signal amplitude characteristics and passing phase characteristics of a fundamental wave component with respect to the control voltage (steady state) of the power amplifier 4, in the case where an unmodulated one-carrier which can be acquired by using a network analyzer and the like, and which has a constant level (constant value) is input as a high-frequency input signal to the power amplifier 4.

From the output signal amplitude characteristics and passing phase characteristics with respect to the control voltage, the AM-PM characteristics are stored in the format different from the format of the passing phase characteristic data with respect to the control voltage in the steady characteristic compensating circuit 11 of the first embodiment of the invention, or namely in the format of the passing phase characteristic data with respect to the output signal amplitude. This is equal to the case where the abscissa of FIG. 13 is replaced with the output signal amplitude.

The relationships of input and output signals in the steady characteristic compensating circuit 11b output an amplitude correction signal S31 and a phase correction signal S52 while, as address designation signals, using the amplitude information r31(t) and r51(t) output from the fourth amplitude information adjusting portion 53. The steady characteristic compensating circuit 11b performs a process of normalizing the AM-AM and AM-PM characteristics based on the transmission level information S1.

Specifically, based on the maximum transmission power in which the maximum value—the average value (peak factor) of amplitude information corresponding to the modulation system is considered, normalization of an output signal amplitude in stored AM-AM data and AM-PM data is executed on a desired output level (average power), whereby correction is performed for each desired output level. As a result of the normalization, access to AM-AM data and AM-PM data with using the amplitude information r31(t) and r51(t) as an address designation signal is enabled.

The phase information correcting means 17 performs correction on the phase information θ(t) on the basis of the phase compensation signal S52 output from the steady characteristic compensating circuit 11b, and outputs phase information θ5(t) after correction to the orthogonal coordinate converting means 5 or 5b.

In the same operation as the first embodiment of the invention, the orthogonal coordinate converting means 5 of FIG. 14 outputs I51(t) and Q51(t) to the phase modulating means 3.

In the same operation as the first embodiment of the invention, the orthogonal coordinate converting means 5b of FIG. 15 outputs I52(t) and Q52(t) to the quadrature modulating means 6.

A DA converter which is not shown is placed between, in FIG. 14, stages of the amplitude information correcting means 12 and the amplitude modulating means 2, and stages of the orthogonal coordinate converting means 5 and the phase modulating means 3, and between, in FIG. 15, stages of the amplitude information correcting means 12 and the amplitude modulating means 2, and stages of the orthogonal coordinate converting means 5b and the quadrature modulating means 6.

As described above, in the fifth embodiment of the invention, as compared with the third embodiment of the invention, the manner of giving the address designation signal when the phase correction signal is to produced, and the data format of the AM-AM characteristics to be stored into the steady characteristic compensating circuit due to this change are different. Here, only the portions different from those of the third embodiment of the invention will be described, and the description of the common portions is omitted.

The fifth embodiment of the invention describes a method which is different from the fourth embodiment of the invention, and in which the phase correction is performed in consideration of both the rising and falling characteristics in correspondence that, as described in the fourth embodiment of the invention, passing phase characteristics are different in the cases where the control signal is increased, and where the signal is decreased, because of the characteristics of the power amplifier 4 and the amplitude modulating means 2.

In the fifth embodiment of the invention, the configuration in which the amplitude signal r(t) corresponding to the output signal amplitude is obtained, and the r(t) is multiplied by the predetermined constant (func4) to compress the dynamic range of the amplitude signal exerts the same effects as the fourth embodiment of the invention in which the dynamic range of the address designation signal is compressed.

With respect to the delaying means and feedback system which are problems in related art 4, in the fifth embodiment of the invention, the former is unnecessary, and the latter is not essential. In compensation of the AM-PM characteristics at a signal change point, therefore, the circuit scale can be reduced as compared with related art 4.

Next, the compression method in the fifth embodiment of the invention will be specifically described.

In the fourth embodiment of the invention, with reference to the maximum value of the required dynamic range for the normalized control voltage, compression is performed in the direction of the maximum value. In the fifth embodiment of the invention, the normalized control voltage is replaced with the amplitude signal r(t) corresponding to the output signal amplitude. Namely, the amplitude signal r(t) is multiplied by the coefficient information (func4) indicated by Expression (11) so that, with reference to the maximum value of the required dynamic range for the amplitude signal r(t), compression is performed in the direction of the maximum value.

$$\text{func4} < 1 \tag{11}$$

As described above, according to the fifth embodiment of the invention, relating to distortion compensation using the AM-AM and AM-PM characteristics in steady characteristics to be stored in the steady characteristic compensating circuit 11b, the amplitude correction signal and the address designation signal when the phase correction signal is produced are multiplied with the coefficient information (func2) and coefficient information (func4) expressing the transient response and signal change point characteristics, whereby, in the polar modulation system, while suppressing increase of compensation data, amplitude/phase information relating to a modulated signal can be correctly expressed, or namely low-distortion characteristics of the power amplifier can be realized.

In the fifth embodiment of the invention, the effect that amplitude information relating to a modulated signal in data transmission is correctly expressed has been described. It is a matter of course that starting characteristics (ramp control) of a power amplifier which performs a burst operation can be stabilized by adjusting the coefficient information (func2) expressing the transient response with respect to the starting time. Therefore, a ramp controlling circuit for a power amplifier may be configured by using the distortion compensating circuit of the fifth embodiment of the invention.

In the fifth embodiment of the invention, it is a matter of course that the same effects are attained also when the multiplying process conducted by the fourth amplitude information adjusting portion 53 is previously conducted on the data stored in the steady characteristic compensating circuit 11b.

In the fifth embodiment of the invention, the method of adjusting the AM-PM characteristics has been described. The adjustment of the AM-PM characteristics has the same function as that of adjusting synchronization between the amplitude signal and the phase signal. When the coefficient information (func4) is switched over, therefore, the embodiment can be applied also to the adjustment of synchronization between the amplitude signal and the phase signal. In the description of the method of adjusting the AM-PM characteristics, the example in which the required dynamic range for the control voltage is compressed has been used. It is a matter of course that not only a case of compression but also a case of expansion may exist in the adjustment of synchronization.

Sixth Embodiment

A sixth embodiment of the invention shows that a combination of the polar modulating circuit of the first embodiment of the invention and the polar modulating circuit of the fifth embodiment of the invention can be configured.

Figure 16:
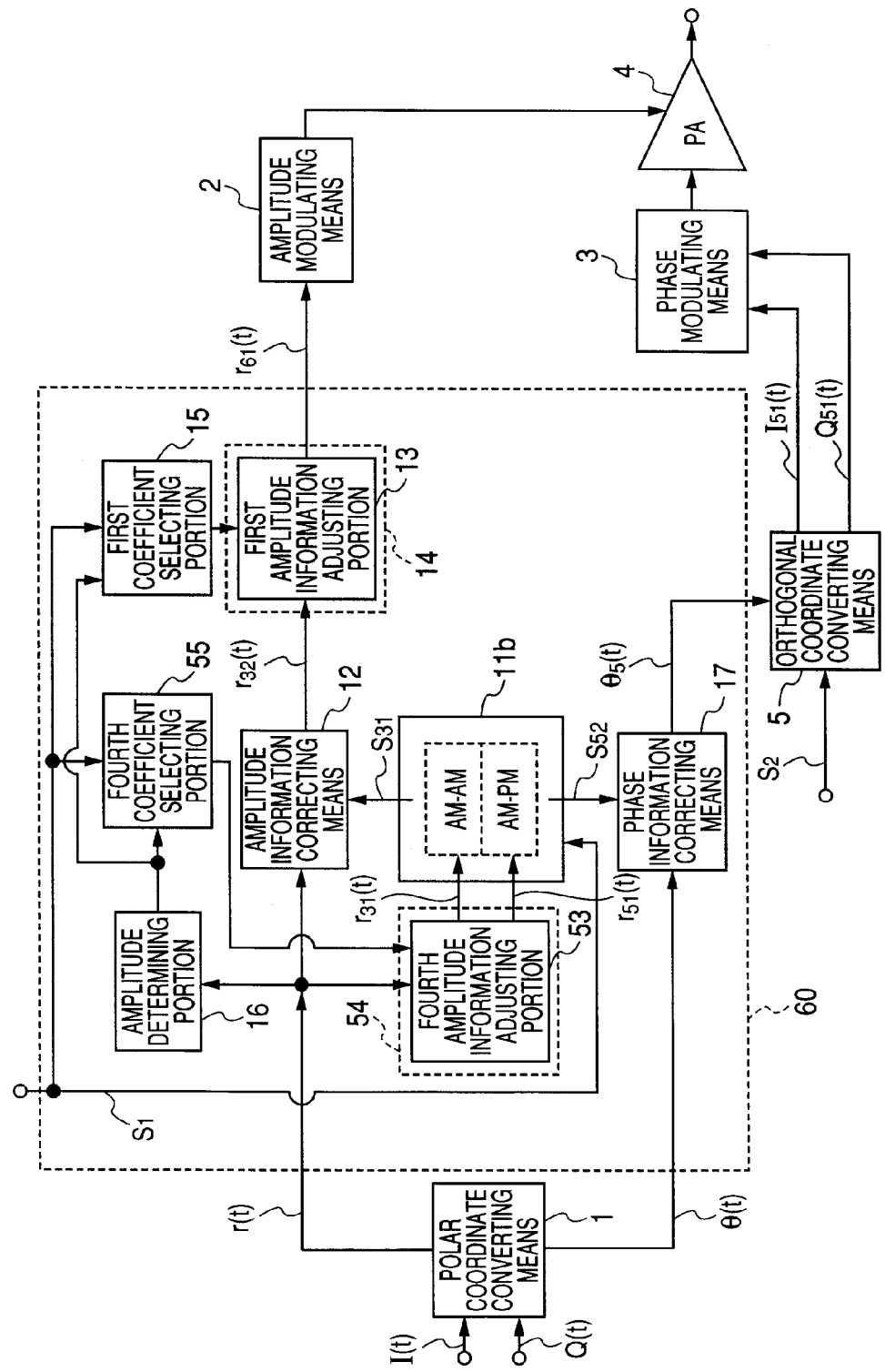
FIG. 16 A view showing an example of a schematic configuration of a polar modulating circuit of a sixth embodiment of the invention.
Figure 17:
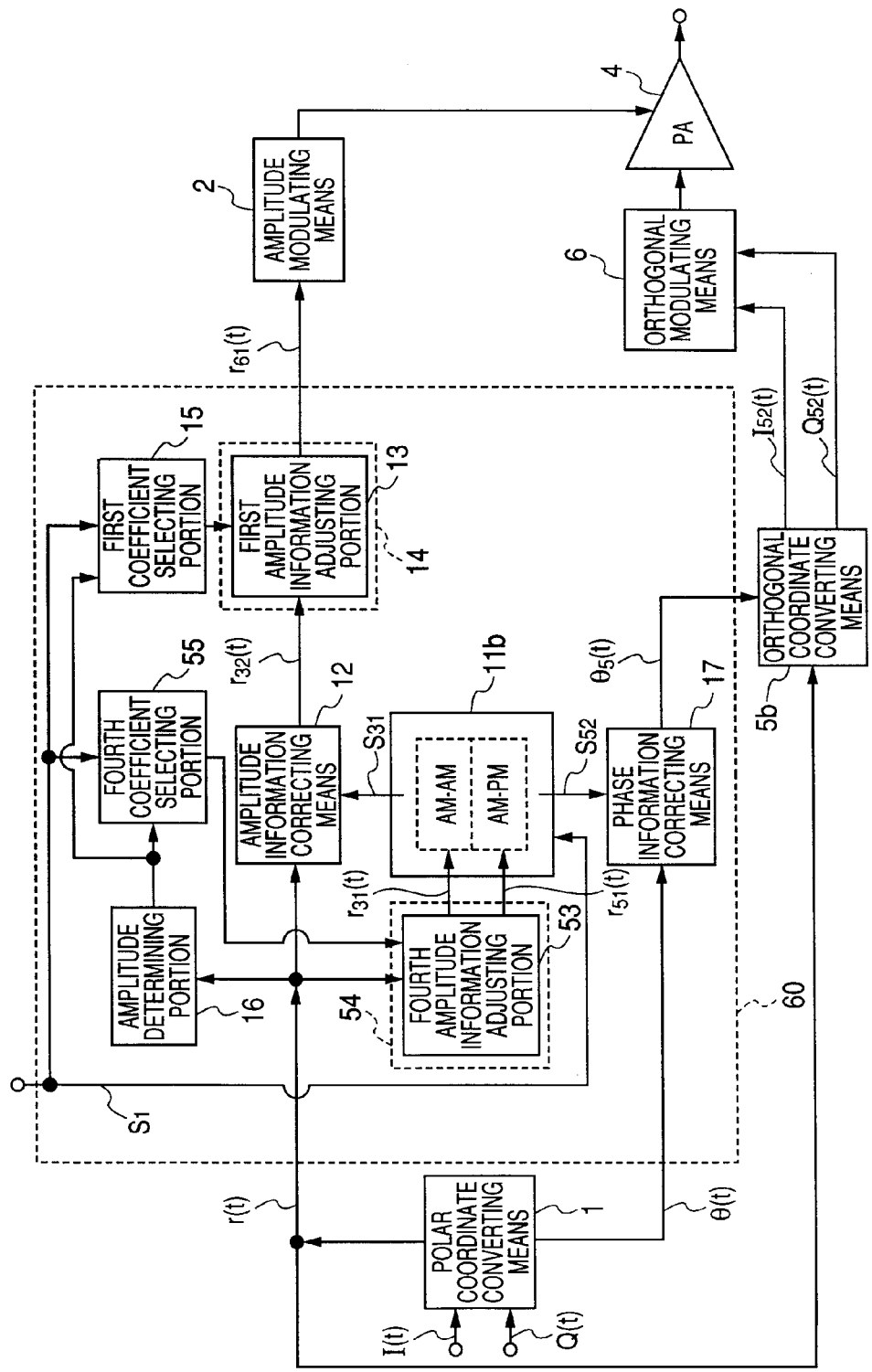
FIG. 17 A view showing another example of the schematic configuration of the polar modulating circuit of the sixth embodiment of the invention.

FIGS. 16 and 17 are views showing a schematic configuration of a polar modulating circuit of the sixth embodiment of the invention. The portions which are duplicated with those of FIGS. 1, 2, 14, and 15 which have been described in the first and fifth embodiments of the invention are denoted by the same reference numerals.

As shown in FIGS. 16 and 17, a distortion compensating circuit 60 of the sixth embodiment of the invention further comprises the first amplitude information adjusting portion 13, the transient characteristic compensating circuit 14 having the first amplitude information adjusting portion 13, and the first coefficient selecting portion 15 which are shown in FIGS. 1 and 2, in addition to the circuit configuration of FIG. 15.

The first amplitude information adjusting portion 13 multiplies the output signal r32(t) from the amplitude information correcting means 12 by predetermined coefficient information (func1b) to output amplitude information r61(t) to the amplitude modulating means 2. The setting of the coefficient information (func1b) is in the same concept as the coefficient information (func1) in the first embodiment of the invention, and its description is omitted.

In the distortion compensating circuit 60, a transient response correction parameter of the AM-AM characteristics of the power amplifier 4 is dispersed into the first amplitude information adjusting portion and the fourth amplitude information adjusting portion, whereby the correction error can be reduced more than the first and fifth embodiments of the invention.

Figure 18:
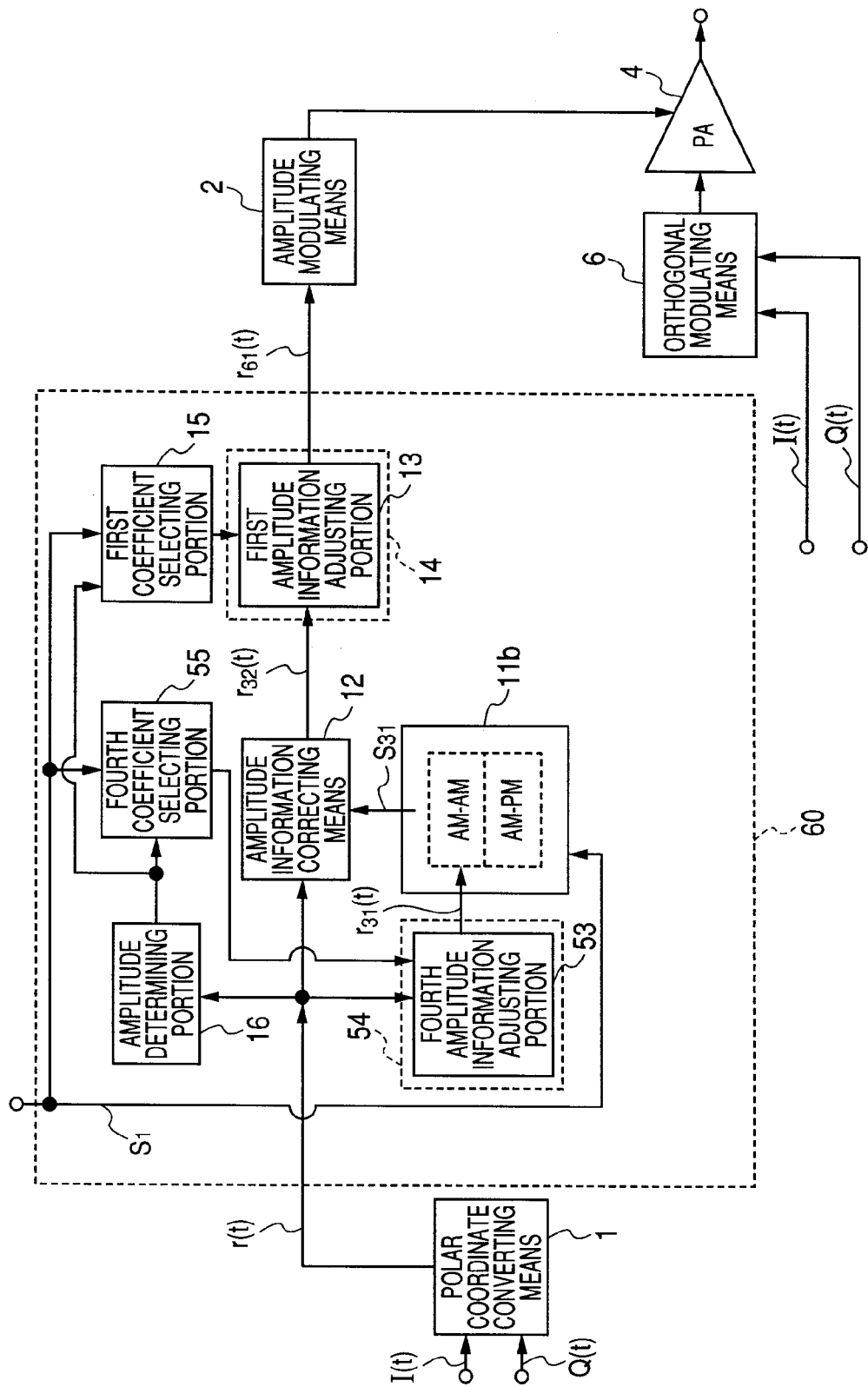
FIG. 18 A view showing a further example of the schematic configuration of the polar modulating circuit of the sixth embodiment of the invention.

Another example of the polar modulating circuit of the sixth embodiment of the invention may have the configuration shown in FIG. 18. FIG. 18 is a view showing the other example of the schematic configuration of the polar modulating circuit of the sixth embodiment of the invention. The polar modulating circuit of the example is configured so that the orthogonal coordinate converting means 5b and the phase information correcting means 17 are removed away from FIG. 17, and the input IQ signal of the quadrature modulating means 6 is changed from I52(t), Q52(t) to an IQ signal (I(t), Q(t)) input from the baseband signal generating portion of the transmitting apparatus which is not shown, thereby omitting the phase correction of the phase-modulated signal.

In the case where the polar modulating circuit of the invention is used in a transmitting apparatus, a DA converter which is not shown is placed between, in FIG. 16, stages of the first amplitude information adjusting portion 13 and the amplitude modulating means 2, and stages of the orthogonal coordinate converting means 5 and the phase modulating means 3, between, in FIG. 17, stages of the first amplitude information adjusting portion 13 and the amplitude modulating means 2, and stages of the orthogonal coordinate converting means 5b and the quadrature modulating means 6, and between, in FIG. 18, stages of the first amplitude information adjusting portion 13 and the amplitude modulating means 2, and in front of the quadrature modulating means 6.

Seventh Embodiment

A seventh embodiment of the invention describes a method which relates to a method of setting the output power level of the power amplifier 4, and which is different from the first to sixth embodiments of the invention.

Figure 19:
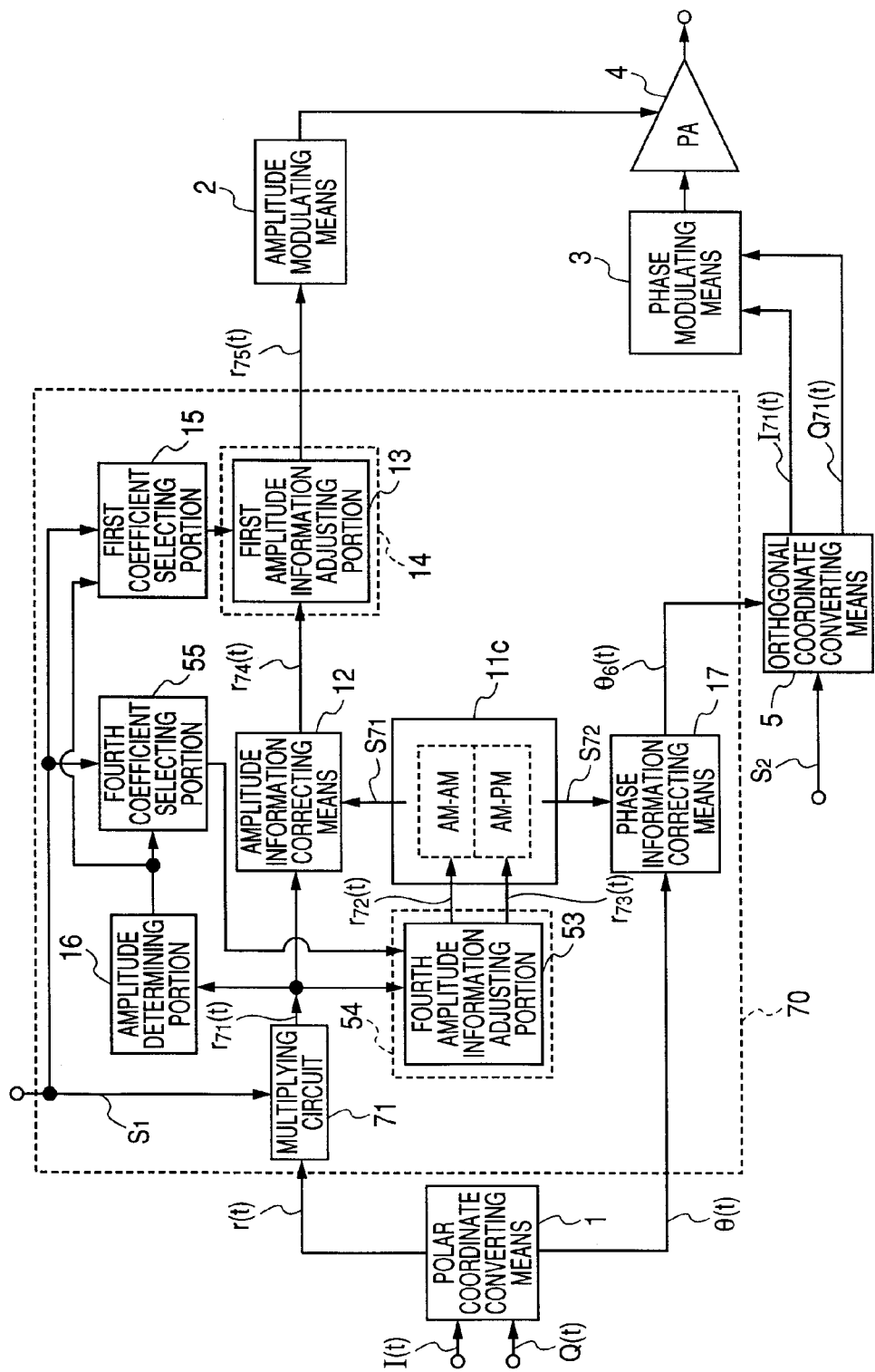
FIG. 19 A view showing an example of a schematic configuration of a polar modulating circuit of a seventh embodiment of the invention.
Figure 20:
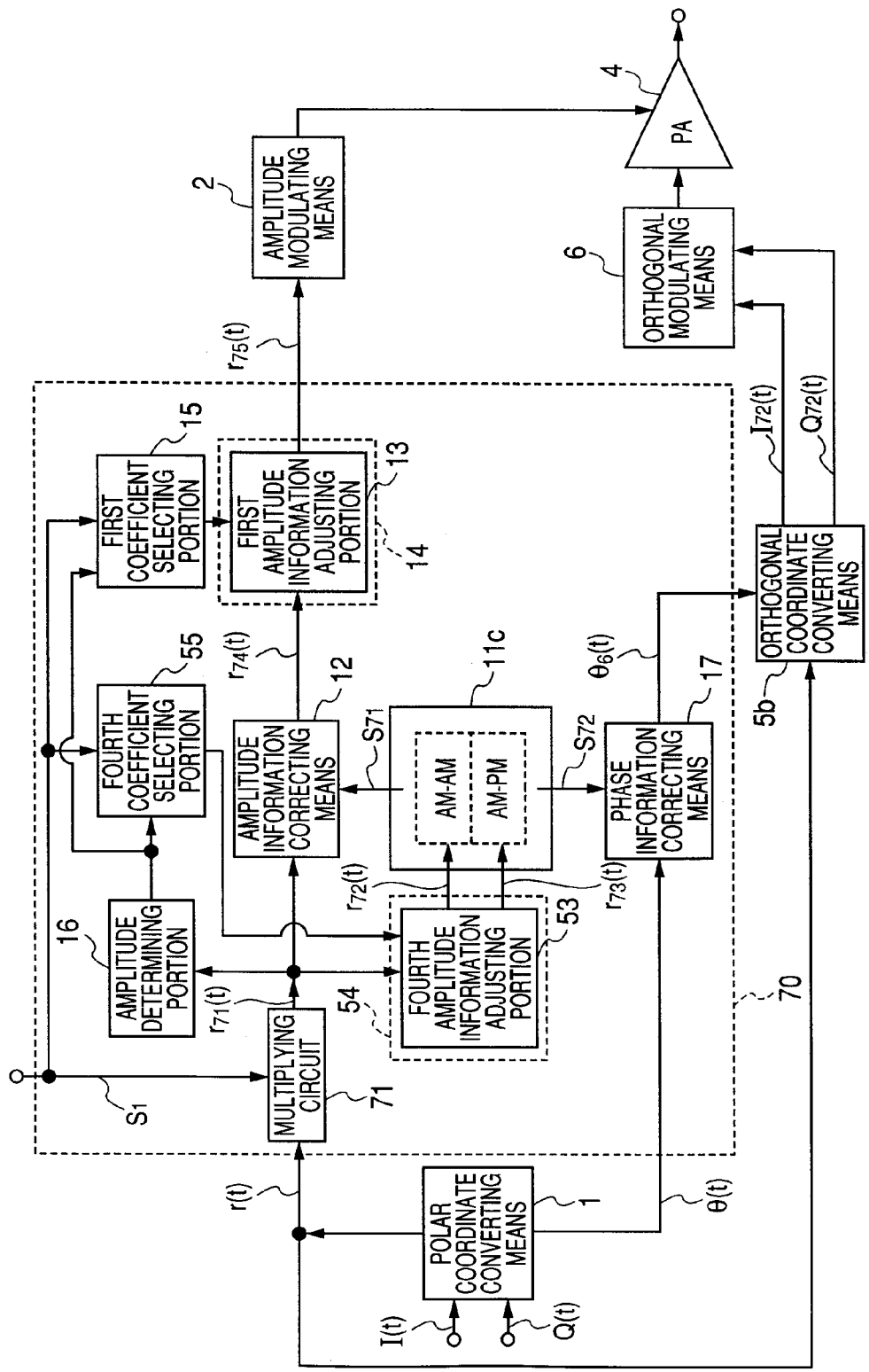
FIG. 20 A view showing another example of the schematic configuration of the polar modulating circuit of the seventh embodiment of the invention.

FIGS. 19 and 20 are views showing a schematic configuration of a polar modulating circuit of the seventh embodiment of the invention. The portions which are duplicated with those of FIGS. 16 and 17 which have been described in the sixth embodiment of the invention are denoted by the same reference numerals.

As shown in FIGS. 19 and 20, a distortion compensating circuit 70 of the seventh embodiment of the invention comprises a steady characteristic compensating circuit 11c in place of the steady characteristic compensating circuit 11b of FIGS. 16 and 17, and further comprises a multiplying circuit 71.

The multiplying circuit 71 obtains a level control coefficient (S1/S0) which is obtained by dividing the transmission level information S1 by a reference value S0 of the transmission level information S1. The level control coefficient is multiplied to the output amplitude information r(t) of the polar coordinate converting means 1 to output amplitude information r71(t) on which the transmission level information is superimposed.

The fourth amplitude information adjusting portion 53 multiplies the amplitude information r71(t) by two predetermined independent coefficient information (func5) and coefficient information (func6) to output amplitude information r72(t) and amplitude information r73(t). The settings of the coefficient information (func5) and the coefficient information (func6) are identical respectively with the setting methods of the coefficient information (func2) and the coefficient information (func4), and their description is omitted.

The steady characteristic compensating circuit 11c sets as a reference of the address designation signal for stored data, the AM-AM and AM-PM characteristics corresponding to the maximum transmission power S0b (when S0 is in dB unit, S0b=S0+3.2 [dB]) in which, for example, a peak factor (for example, 3.2 [dB] in 8-PSK modulation) for each modulation system is considered with respect to the reference value SO of the transmission level information. As data in the same data format as the steady characteristic compensating circuit 11b of the fifth embodiment of the invention, i.e., data in the absolute value format of the control voltage with respect to the output signal amplitude, as the AM-AM characteristics, or a predetermined value (data in the format of a difference value) which, after the input control signal amplitude is multiplied or divided by the above-mentioned predetermined value, is normalized with the input control signal so as to attain the absolute value are stored in a memory. Furthermore, as the AM-PM characteristics, data in the format of the passing phase characteristic data with respect to the output signal amplitude are stored in the memory. The relationships of input and output signals in the steady characteristic compensating circuit 11c output an amplitude correction signal S71 and a phase correction signal S72 while, as address designation signals, using r72(t) and r73(t) output from the fourth amplitude information adjusting portion 53.

The amplitude information correcting means 12 performs correction on the amplitude information r71(t) output from the multiplying circuit 71, on the basis of the amplitude correction signal S71 output from the steady characteristic compensating circuit 11c, and outputs amplitude information r74(t)

The first amplitude information adjusting portion 13 multiplies the amplitude information r74(t) output from the amplitude information correcting means 12 by predetermined coefficient information (func1c) to output amplitude information r75(t). The setting of the coefficient information (func1c) is in the same concept as the coefficient information (func1) in the first embodiment of the invention, and its description is omitted.

The amplitude determining portion 16 has functions of calculating an instantaneous amplitude value (|r71(t)|) of the amplitude information r71(t) sampled at constant intervals, and setting a predetermined threshold based on the plural instantaneous amplitude values and determining increase or decrease (Δr71(t)) of the amplitude information r71(t) from a previous sampling timing.

The phase information correcting means 17 performs correction on the phase information θ(t) on the basis of the phase correction signal S72 output from the steady characteristic compensating circuit 11, and outputs phase information θ5(t) after correction to the orthogonal coordinate converting means 5 or 5b.

In the same operation as the first embodiment of the invention, the orthogonal coordinate converting means 5 of FIG. 19 outputs I71(t) and Q71(t) to the phase modulating means 3.

In the same operation as the first embodiment of the invention, the orthogonal coordinate converting means 5b of FIG. 20 outputs I72(t) and Q72(t) to the quadrature modulating means 6.

As described above, the seventh embodiment of the invention describes the method of setting the output level of the power amplifier 4, and particularly the method which is different from the method of setting the output level in the first to sixth embodiments of the invention. Specifically, in the first to fourth embodiments of the invention and the fifth and sixth embodiments of the invention, the steady characteristic compensating circuit 11 or 11b obtains the maximum transmission power in which the maximum value—the average value (peak factor) of amplitude information for each modulation system is considered, from the desired output level (average power) corresponding to the transmission level information S1, and normalization of the stored data with reference to the maximum transmission power is executed, whereby correction is performed for each desired output level. By contrast, the seventh embodiment of the invention is different in that data themselves which are to be stored in the steady characteristic compensating circuit 11c are configured in consideration of the power control, and distortion compensation at a desired output level is performed by using amplitude information (r72(t), r73(t)) on which the transmission level information using the level control coefficient is superimposed, as the address designation signal.

Figure 21:
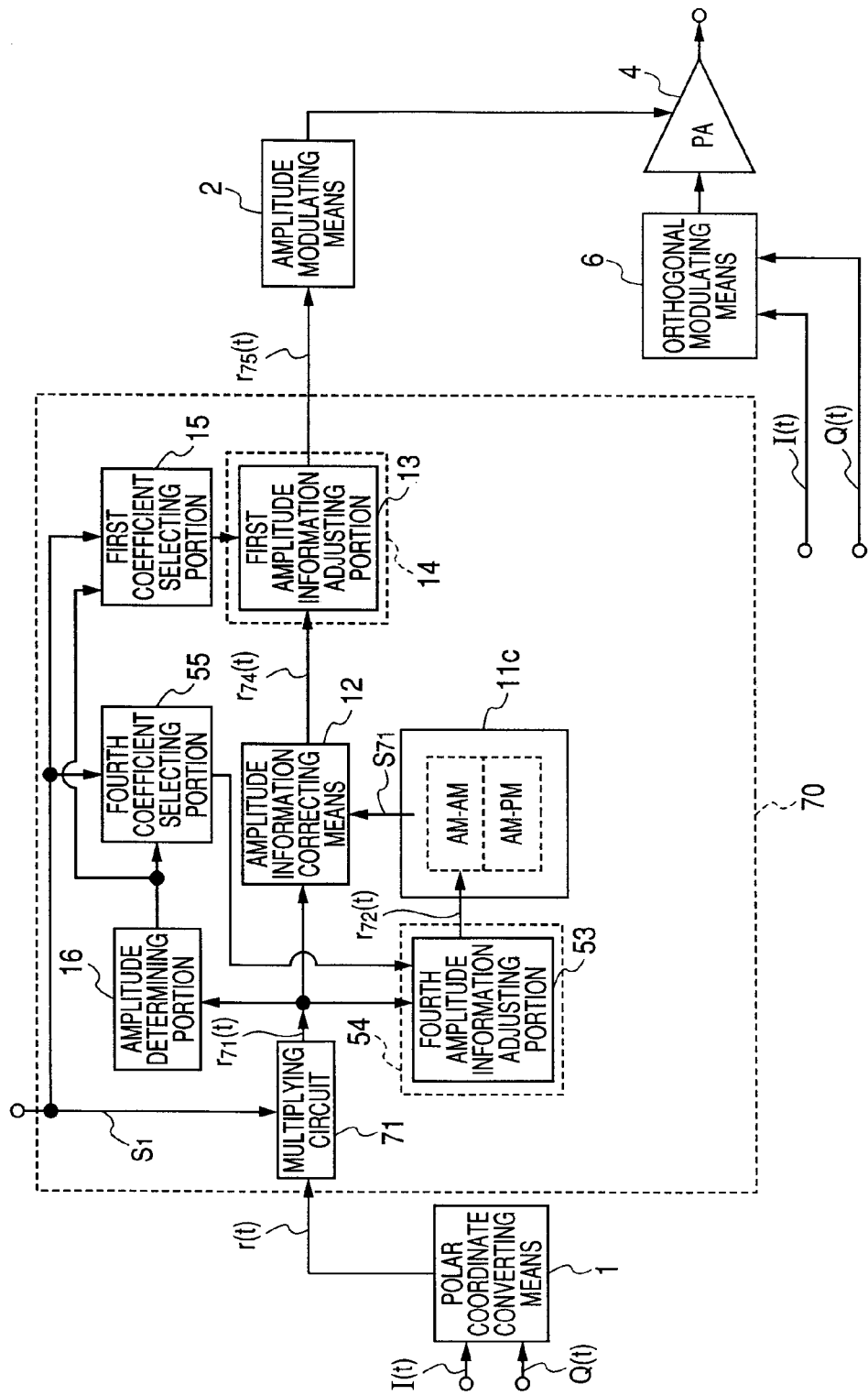
FIG. 21 A view showing a further example of the schematic configuration of the polar modulating circuit of the seventh embodiment of the invention.

Another example of the polar modulating circuit of the seventh embodiment of the invention may have the configuration shown in FIG. 21. FIG. 21 is a view showing the other example of the schematic configuration of the polar modulating circuit of the seventh embodiment of the invention. The polar modulating circuit of the example is configured so that the orthogonal coordinate converting means 5b and the phase information correcting means 17 are removed away from FIG. 20, and the input IQ signal of the quadrature modulating means 6 is changed from I72(t), Q72(t) to an IQ signal (I(t), Q(t)) input from the baseband signal generating portion of the transmitting apparatus which is not shown, thereby omitting the phase correction of the phase-modulated signal.

In the case where the polar modulating circuit of the invention is used in a transmitting apparatus, a DA converter which is not shown is placed between, in FIG. 19, stages of the first amplitude information adjusting portion 13 and the amplitude modulating means 2, and stages of the orthogonal coordinate converting means 5 and the phase modulating means 3, between, in FIG. 20, stages of the first amplitude information adjusting portion 13 and the amplitude modulating means 2, and stages of the orthogonal coordinate converting means 5b and the quadrature modulating means 6, and between, in FIG. 21, stages of the first amplitude information adjusting portion 13 and the amplitude modulating means 2, and in front of the quadrature modulating means 6.

Eighth Embodiment

An eighth embodiment of the invention describes a method of improving the control accuracy which is shown in related art 5, or which is a problem in the output linearizing technique during a low-output power in a power amplifier.

Figure 22:
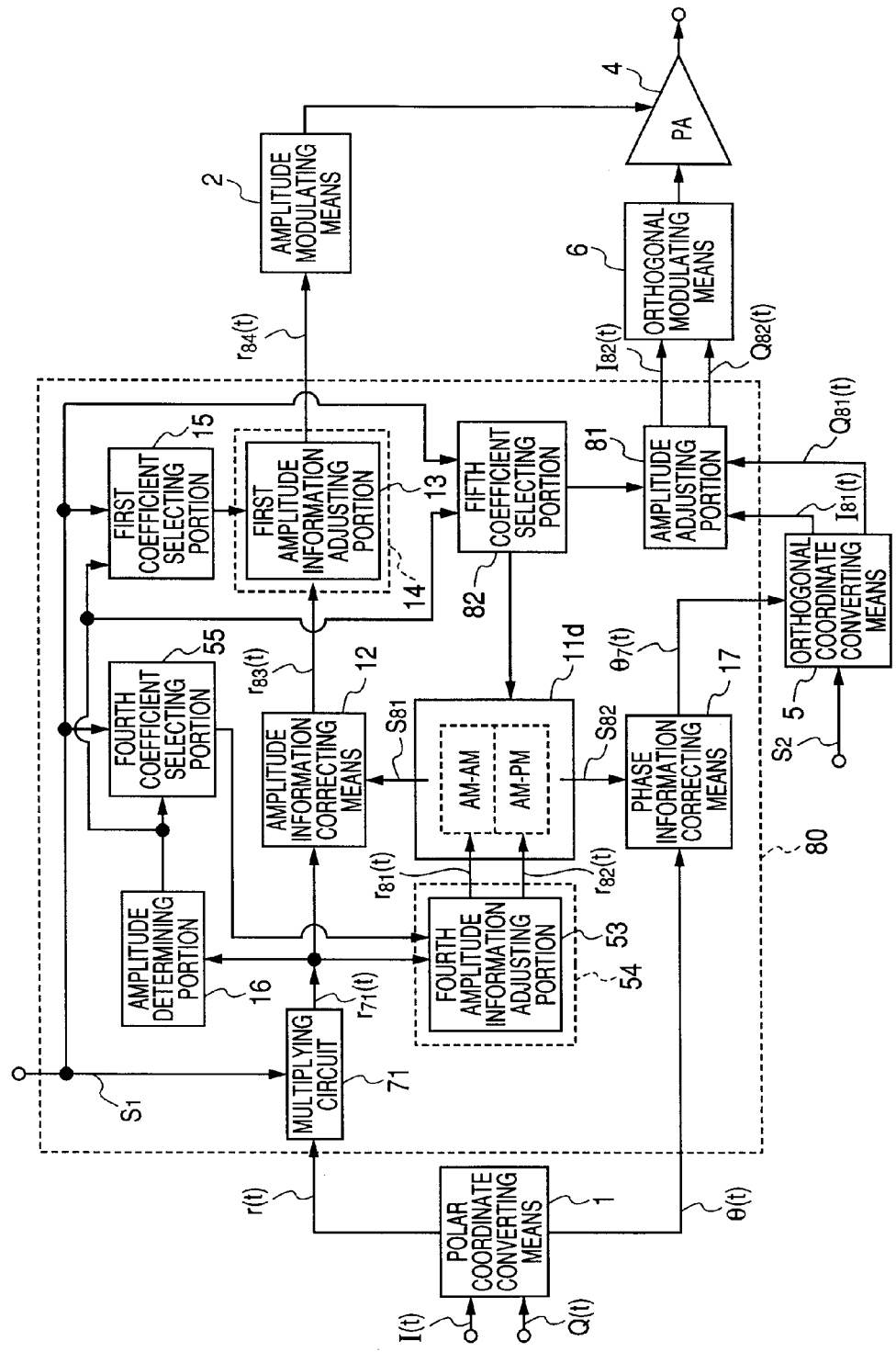
FIG. 22 A view showing an example of a schematic configuration of a polar modulating circuit of an eighth embodiment of the invention.
Figure 23:
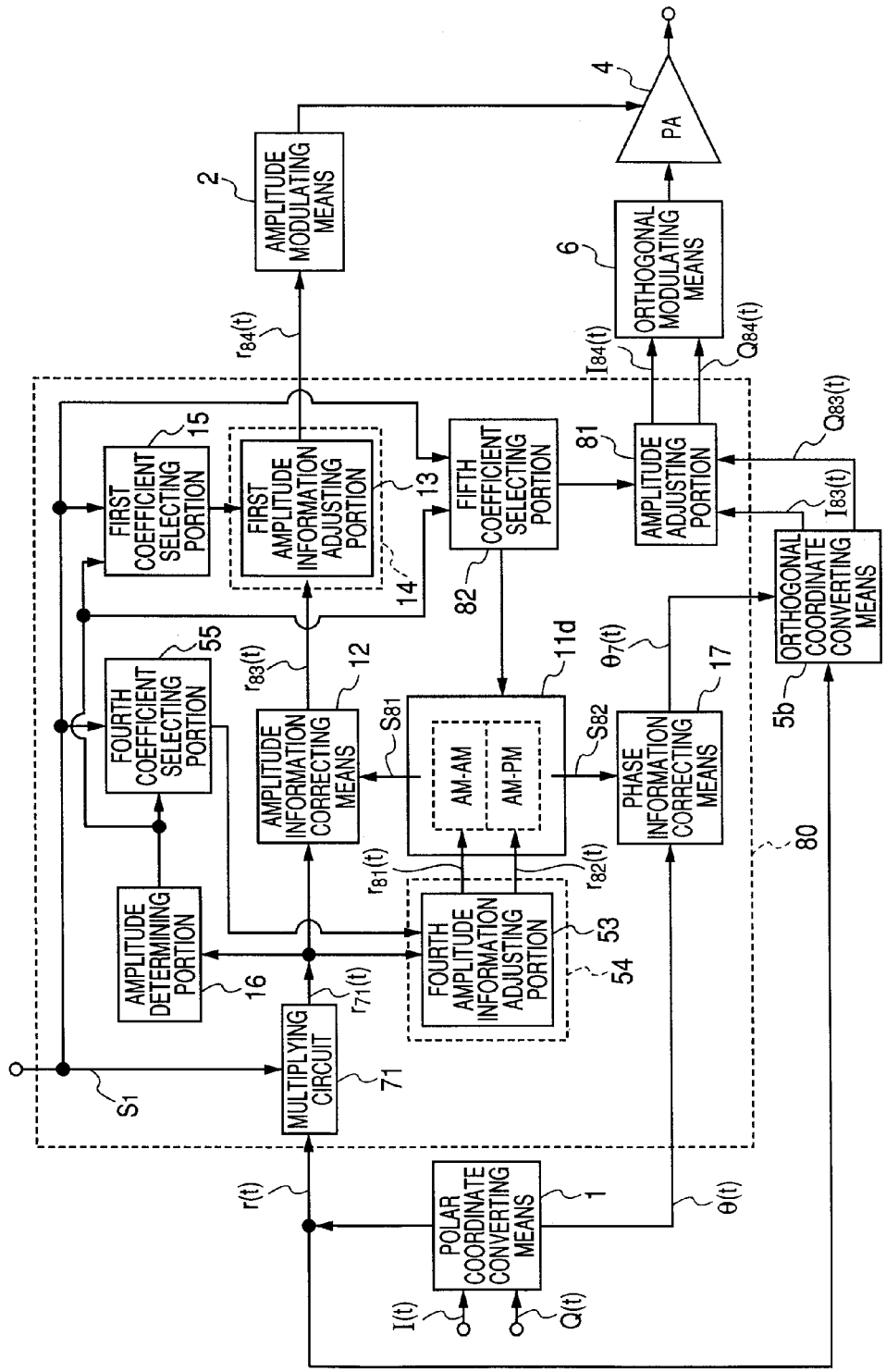
FIG. 23 A view showing another example of the schematic configuration of the polar modulating circuit of the eighth embodiment of the invention.

FIGS. 22 and 23 are views showing a schematic configuration of a polar modulating circuit of the eighth embodiment of the invention. The portions which are duplicated with those of FIGS. 19 and 20 which have been described in the seventh embodiment of the invention are denoted by the same reference numerals.

As shown in FIGS. 22 and 23, a distortion compensating circuit 80 of the eighth embodiment of the invention comprises a steady characteristic compensating circuit 11d in place of the steady characteristic compensating circuit 11c of FIG. 20, and further comprises an amplitude adjusting portion 81 and a fifth coefficient selecting portion 82.

The eighth embodiment of the invention describes a method of simply reducing the input signal amplitude in accordance with reduction of the output signal amplitude of the power amplifier 4.

The amplitude adjusting portion 81 multiplies the amplitude of the output IQ signal from the orthogonal coordinate converting means 5 or 5b by predetermined coefficient information (func10), and outputs the IQ signal in which the amplitude is adjusted.

The fifth coefficient selecting portion 82 sets the coefficient information (func10) of the amplitude adjusting portion 81, and transmits the coefficient information to the steady characteristic compensating circuit 11d.

The quadrature modulating means 6 performs quadrature modulation based on the IQ signal output from the amplitude adjusting portion 81.

Transmission level information S1 is transmission level information of the power amplifier 4 which, in the case where the polar modulating circuit of the invention is used in a transmitting apparatus, is transmitted from a controlling portion of the transmitting apparatus which is not shown. The information is input into the multiplying circuit 71 and the first, fourth, and fifth coefficient selecting portions 15, 55, 82.

The steady characteristic compensating circuit 11d stores in a memory compensation data which are produced based on the AM-AM and AM-PM characteristics that are acquired in plural input high-frequency signal amplitudes, in the same data format as the steady characteristic compensating circuit 11b of the fifth embodiment of the invention, i.e., as the AM-AM characteristics, data in the absolute value format of the control voltage with respect to the output signal amplitude, or a predetermined value (data in the format of a difference value) which, after the input control signal amplitude is multiplied or divided by the above-mentioned predetermined value, is normalized with the input control signal so as to attain the absolute value, and stores in the memory passing phase characteristic data with respect to the output signal amplitude as the AM-PM characteristics.

Based on the coefficient information (func10) from the fifth coefficient selecting portion 82, the amplitude of the input high-frequency signal to the power amplifier 4 during transmission operation is determined, data which are acquired at an adequate amplitude value are selected from the AM-AM and AM-PM characteristics which are acquired at plural input high-frequency signal amplitudes, and compensation is performed. The relationships of input and output signals in the steady characteristic compensating circuit 11d output an amplitude correction signal S81 and a phase correction signal S82 while, as address designation signals, using r81(t) and r82(t) output from the fourth amplitude information adjusting portion 53.

When the amplitude of the input IQ signal of the quadrature modulating means 6 is controlled, it is possible to control the output power of the quadrature modulating means 6, i.e., the input power of the power amplifier 4. When the output power of the power amplifier 4 is to be lowered, therefore, the fifth coefficient selecting portion 82 transmits coefficient information (func10(l)) which is smaller than coefficient information (func10(h)) during high output, to the amplitude adjusting portion 81 on the basis of the transmission level information S1 which is a parameter for controlling the power. In the amplitude adjusting portion 81, the output signal from the orthogonal coordinate converting means 5 or 5b is multiplied by the coefficient information, and the resulting signal is transmitted to the quadrature modulating means 6.

Simultaneously with switching of the coefficient information (func10), the steady characteristic compensating circuit 11d selects one data group from data groups which have the same amplitude of the input high-frequency signal of the power amplifier 4 during data acquisition.

Figure 24:
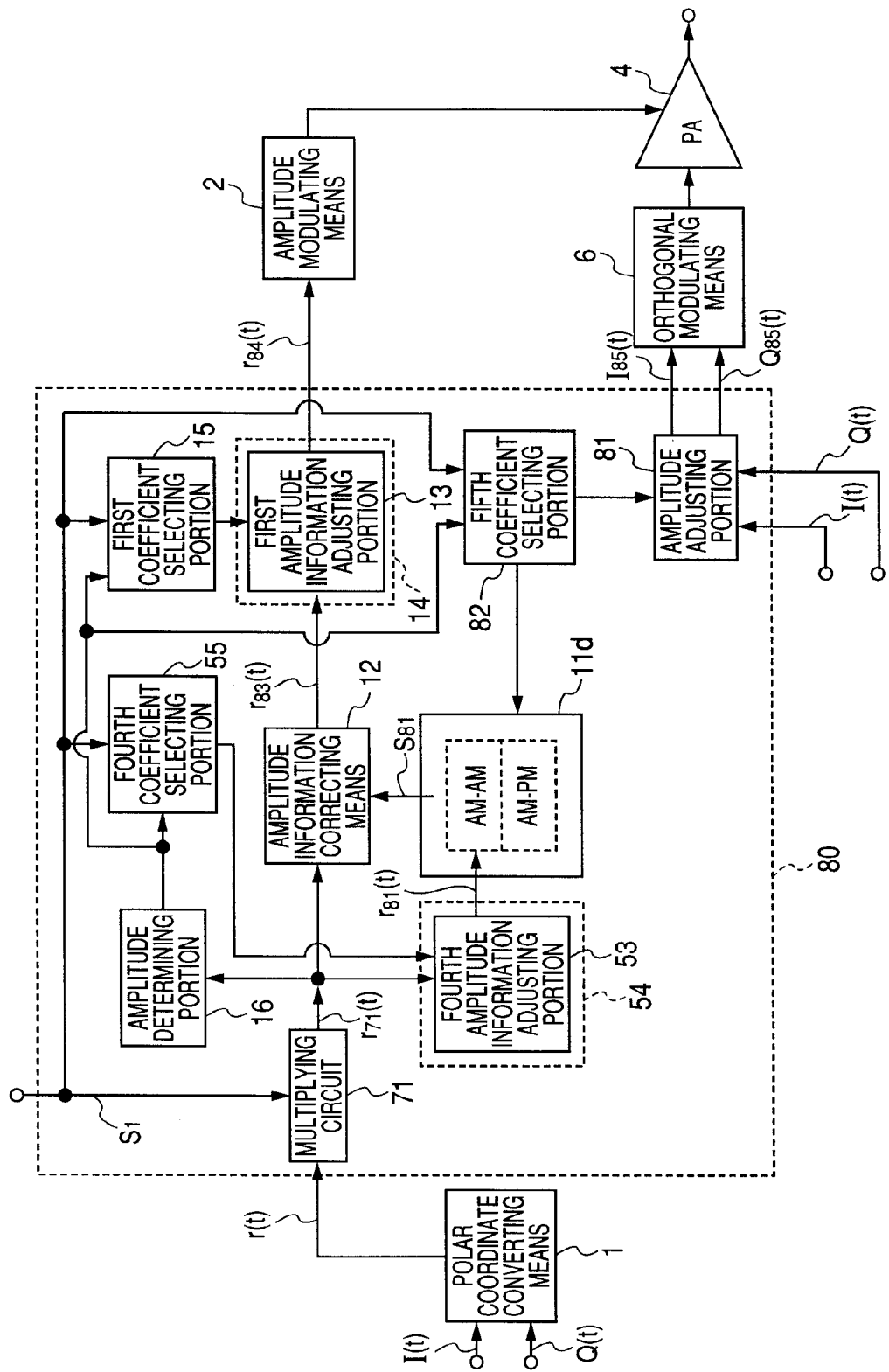
FIG. 24 A view showing a further example of the schematic configuration of the polar modulating circuit of the eighth embodiment of the invention.

Another example of the polar modulating circuit of the eighth embodiment of the invention may have the configuration shown in FIG. 24. FIG. 24 is a view showing the other example of the schematic configuration of the polar modulating circuit of the eighth of the invention. The polar modulating circuit of the example is configured so that the orthogonal coordinate converting means 5b and the phase information correcting means 17 are removed away from FIG. 23, and the input IQ signal of the quadrature modulating means 6 is changed from I84(t), Q84(t) to I85(t), Q85(t) in which an IQ signal (I(t), Q(t)) input from the baseband signal generating portion of the transmitting apparatus which is not shown is multiplied by the coefficient information (func10) in the amplitude adjusting portion 81, thereby omitting the phase correction of the phase-modulated signal.

In the case where the polar modulating circuit of the invention is used in a transmitting apparatus, a DA converter which is not shown is placed between, in FIG. 22, stages of the first amplitude information adjusting portion 13 and the amplitude modulating means 2, and stages of the amplitude adjusting portion 81 and the quadrature modulating means 6, between, in FIG. 23, stages of the first amplitude information adjusting portion 13 and the amplitude modulating means 2, and stages of the amplitude adjusting portion 81 and the quadrature modulating means 6, and between, in FIG. 24, stages of the first amplitude information adjusting portion 13 and the amplitude modulating means 2, and stages of the amplitude adjusting portion 81 and the quadrature modulating means 6.

As described above, in the eighth embodiment of the invention, the configuration in which the signal amplitude of the baseband is multiplied by the predetermined coefficient information (func10), and the coefficient information is switched over can reduce the amplitude of the input signal to the power amplifier 4 in accordance with reduction of the output signal amplitude of the power amplifier 4. Simultaneously with the switching, compensation data to be referred are switched over. According to the configuration, the timing of switching over a parameter during the power control can be set to a synchronizing timing, and the control can be simplified. Furthermore, the calculating process is conducted in a digital signal processing portion, and the embodiment does not have amplitude controlling means by a high-frequency band circuit which is the problem of related art 5. Therefore, a highly accurate control is enabled.

In the eighth embodiment of the invention, the method in which, in order to avoid lowering of the transmission efficiency of a transmitting apparatus, the output signal from the power amplifier 4 is not branched has been described. In the case where lowering of the transmission efficiency of the transmitting apparatus is allowed, or where a circuit for branching the output signal from the power amplifier 4 is already connected to the polar modulating circuit, and in the case where an error is caused in the amplitude of the input high-frequency signal of the power amplifier 4 during acquisition of the compensation data of the power amplifier 4 stored in the steady characteristic compensating circuit 11d, and during transmission operation, the coefficient information (func10) is finely adjusted while an adjacent-channel leakage power of the output spectrum of the power amplifier 4 is directly monitored by means which is not shown, or a baseband signal after demodulation of the spectrum is monitored, or so as to minimize an error between the baseband signal and the transmission data, whereby the compensation accuracy can be improved.

Ninth Embodiment

The ninth embodiment of the invention describes a method of reducing noises output from a transmitting apparatus.

Figure 25:
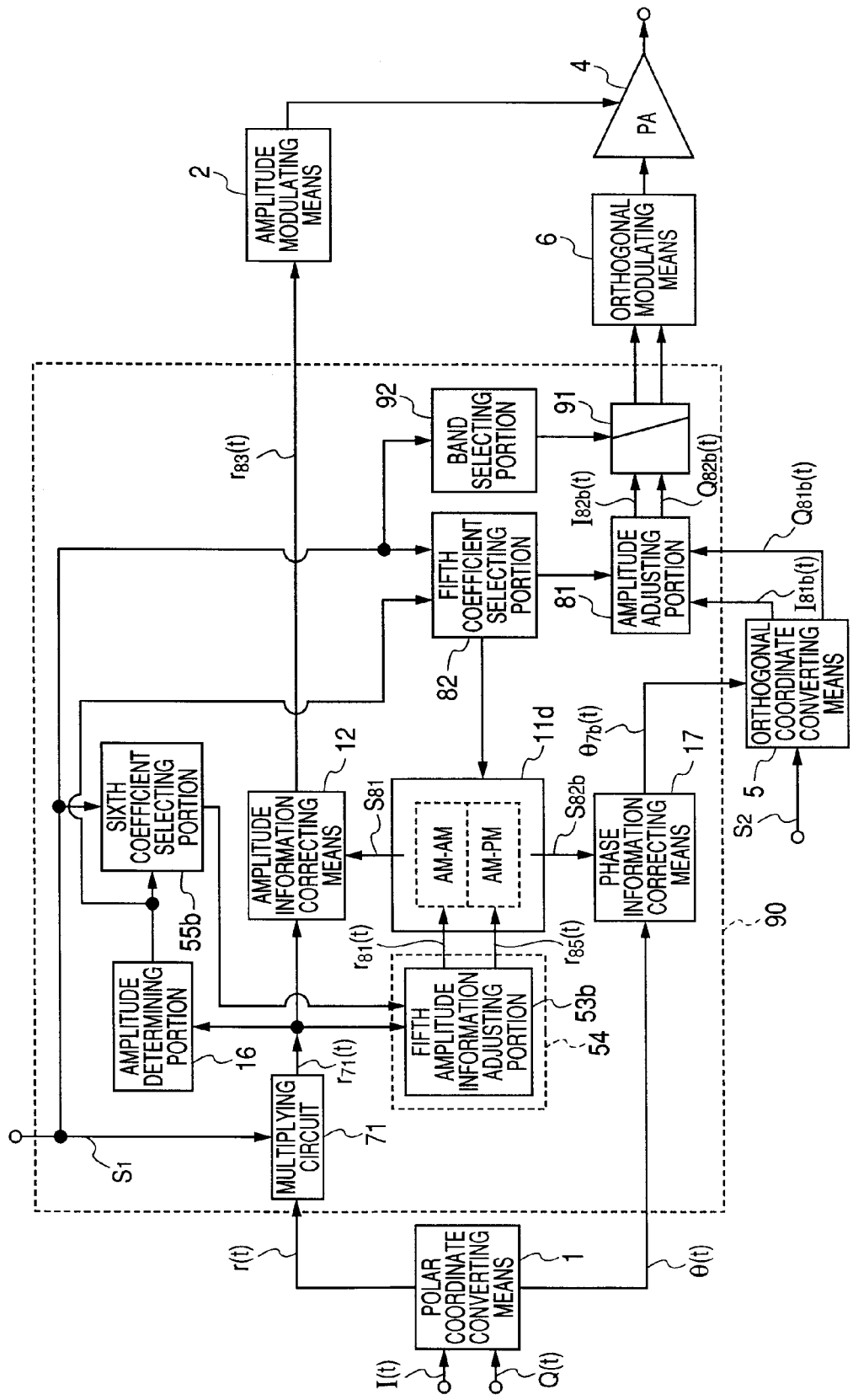
FIG. 25 A view showing a schematic configuration of a polar modulating circuit of a ninth embodiment of the invention.

FIG. 25 is a view showing a schematic configuration of a polar modulating circuit of the ninth embodiment of the invention. As shown in FIG. 25, in the polar modulating circuit of the ninth embodiment of the invention, the first amplitude information adjusting portion 13, the transient characteristic compensating circuit 14 having the first amplitude information adjusting portion 13, and the first coefficient selecting portion 15 are removed away from FIG. 22 of the eighth embodiment of the invention, and the circuit has a fifth amplitude information adjusting portion 53b and a sixth coefficient selecting portion 55b in place of the fourth amplitude information adjusting portion 53 and the fourth coefficient selecting portion 55 of FIG. 22, and a distortion compensating circuit 90 which further comprises a low-pass filter 91 and a band selecting portion 92. The description of the portions which are duplicated with those of the contents described in the eighth embodiment of the invention is omitted.

The fifth amplitude information adjusting portion 53b multiplies the amplitude information r71(t) by two predetermined independent coefficient information (func5) and coefficient information (func6b) to output amplitude information r81(t) and amplitude information r91(t). The method of setting the coefficient information (func5) has been described in the seventh embodiment of the invention, and its description is omitted. The method of setting the coefficient information (func6b) will be described later.

The sixth coefficient selecting portion 55b sets the two independent coefficient information (func5) and coefficient information (func6b) of the fifth amplitude information adjusting portion 53b.

The relationships of input and output signals in the steady characteristic compensating circuit 11d output an amplitude correction signal S81 and a phase correction signal S82b while, as address designation signals, using r81(t) and r91(t) output from the fifth amplitude information adjusting portion 53b.

The phase information correcting means 17 performs correction on the phase information θ(t) on the basis of the phase correction signal S82b output from the steady characteristic compensating circuit 11b, and outputs phase information θ7b(t) after correction to the orthogonal coordinate converting means 5.

In the same operation as the first embodiment of the invention, the orthogonal coordinate converting means 5 outputs I81b(t) and Q81b(t) to the amplitude adjusting portion 81.

In the same operation as the eighth embodiment of the invention, the amplitude adjusting portion 81 produces an IQ signal (I82b(t), Q82b(t)), and outputs the signal to the low-pass filter 91.

The low-pass filter 91 is a low-pass filter having a variable cutoff frequency (hereinafter, abbreviated to fc), changes the fc in accordance with a control signal from the band selecting portion 92, and outputs an IQ signal in which a frequency component of the attenuation band is removed from the IQ signal (I82b(t), Q82b(t)), to the quadrature modulating means 6.

On the basis of the transmission level information S1, the band selecting portion 92 transmits the control signal for changing the fc of the low-pass filter 91, to the low-pass filter 91.

In the case where the polar modulating circuit of the invention is used in a transmitting apparatus, a DA converter which is not shown is placed between, in FIG. 25, stages of the amplitude information correcting means 12 and the amplitude modulating means 2, and stages of the low-pass filter 91 and the quadrature modulating means 6.

Next, the operation of the thus configured distortion compensating circuit 90 will be described.

Prior to the description of the operation, problems which may possibly occur in the case where the amplitude of the input IQ signal of the quadrature modulating means 6 is reduced will be described.

For example, for uplink transmission of a mobile station in the GSM system, there is an absolute value regulation relating to the radiation power level of an unwanted signal to the downlink reception band of a mobile station. This regulation is an item to which attention is usually paid as a reception-band noise regulation in design of a transmitting portion of a mobile station.

In a transmitting apparatus in which the quadrature modulation system is employed, as shown in JP-A-2003-152563, a low-pass filter is placed in a front stage of the quadrature modulating means 6, and high-frequency noises are removed away from noises which are superimposed on the quadrature IQ signal till the DA converter, whereby reception-band noises can be reduced. In a transmitting apparatus in which the polar modulation system is employed, by contrast, because a quadrature IQ signal is separated into an amplitude signal and a phase signal, the required band width is four times or more as compared with a usual baseband IQ signal, and the fc of the low-pass filter 91 which is set for reducing reception-band noises is higher than that of a transmitting apparatus in which the quadrature modulation system is employed.

In the quadrature modulating means 6, the amplitude of an input baseband IQ signal must be optimized so as to satisfy the reception-band noise regulation, the adjacent-channel leakage power regulation, and the modulation accuracy. Specifically, because a cause for adding noises to noises which are removed away by a digital filter can be reduced, and influence of quantization noises in the DA converter can be reduced, the larger amplitude of the input baseband IQ signal input to the quadrature modulating means 6 is better. By contrast, in order to improve the adjacent-channel leakage power and the modulation accuracy, the lower amplitude of the baseband IQ signal is more preferable. Therefore, the amplitude of the baseband IQ signal is set to a value which is the maximum level in a range which can satisfy the adjacent-channel leakage power regulation.

In the case where optimization is executed for transmission at the maximum power, when the amplitude if the baseband IQ signal of the quadrature modulating means 6 is reduced during transmission at a low output power, the apparatus is used at an operating point which is deviated from the optimum point. Because the cause for adding noises to noises which are removed away by a digital filter is increased, and quantization noises in the DA converter are increased, there is a possibility that the level of reception-band noises is increase although the output level of a desired signal is reduced. In a transmitting portion of a mobile station in which the margin for the reception-band noise regulation is small, if an uplink transmission power control is executed, the reception-band noise regulation cannot be satisfied.

Therefore, the distortion compensating circuit 90 of the ninth embodiment of the invention has a configuration in which, during transmission at an output power that is lower than that of transmission at the maximum output power, the fc of the low-pass filter 91 is lowered, and the demerit in the case where the amplitude of the baseband IQ signal is reduced during a low output power is eliminated. Specifically, the band selecting portion 92 compares S1(max) during the maximum transmission level with the transmission level information S1. If the difference between S1(max) and S1 is smaller than a predetermined threshold, the band selecting portion transmits a control signal of fc(1) to the low-pass filter 91 to set the fc of the low-pass filter to fc(1). By contrast, if the difference between S1(max) and S1 is equal to or larger than the predetermined threshold, the band selecting portion transmits a control signal of fc(2) which is smaller than fc(1) to the low-pass filter 91 to set the fc of the low-pass filter to fc(2).

When the fc of the filter placed in a phase signal passage is changed, the synchronization between the amplitude signal and the phase signal is lost, and both the modulation accuracy and the adjacent-channel leakage power are impaired. Therefore, the ninth embodiment of the invention further has a configuration where the method of adjusting the AM-PM characteristics which has been described in the fifth embodiment of the invention is used as a synchronization adjusting method.

Next, the synchronization adjusting method will be specifically described together with the method of setting the coefficient information (func6b).

The same threshold as that by which the band selecting portion 92 switches over the fc of the low-pass filter 91 is set. The sixth coefficient selecting portion 55b compares S1(max) during the maximum transmission level with the transmission level information S1. If the difference between S1(max) and S1 is smaller than the predetermined threshold, coefficient information (func6b(1)) is transmitted to the fifth amplitude information adjusting portion 53b.

By contrast, if the difference between S1(max) and S1 is equal to or larger than the predetermined threshold, coefficient information (func6b(2)) which is different from the coefficient information (func6b(1)) is transmitted to the fifth amplitude information adjusting portion 53b.

As described above, when the coefficient information which is to be multiplied with the address designation signal for the AM-PM characteristics is switched over in the fifth amplitude information adjusting portion 53b, it is possible to adjust phase information. As a result, the synchronization between the amplitude signal and the phase signal is adjusted.

In the ninth embodiment of the invention, the amplitude adjusting portion 81 is a digital multiplying circuit, and the low-pass filter 91 is a digital filter. However, it is a matter of course that, even when the amplitude adjusting portion 81 is configured so as to, for example, adjust an output DC value of a DA converter or to be a reliable attenuator realized by an analog circuit, or when the low-pass filter 91 is an analog filter, the same effects are attained.

Finally, it is a matter of course that, when the nine embodiments of the invention are mutually combined, more accurate compensation is enabled.

When the polar modulating circuit described in the embodiments is formed on, for example, a silicon semiconductor substrate, the circuit can be configured as an integrated circuit.

When the IQ signal of the baseband signal generating portion which produces an arbitrary IQ signal is input to the polar coordinate converting means 1, and the output of the power amplifier 4 is connected to the antenna, the polar modulating circuit described in the embodiments can be configured as a transmitting apparatus.

While the invention has been described in detail and referring to the specific embodiments, it is obvious to those skilled in the art that various changes and modifications may be applied without departing the sprit and scope of the invention.

The application is based on Japanese Patent Application (No. 2004-191342) filed Jun. 29, 2004, Japanese Patent Application (No. 2004-361591) filed Dec. 14, 2004, and Japanese Patent Application (No. 2005-132398) filed Apr. 28, 2005, and their disclosure is incorporated herein by reference.

INDUSTRIAL APPLICABILITY

The distortion compensating circuit of the invention has an effect that, in the polar modulation system, while suppressing increase of compensation data and increase of the circuit scale, a modulated signal can be correctly expressed, or low-distortion characteristics of a power amplifier can be realized, and is useful in a ramp controlling circuit, a polar modulating circuit, a transmitting apparatus, etc.

The invention claimed is:

1. A polar modulating circuit comprising:
 a polar coordinate converting portion which produces an amplitude signal from a baseband quadrature signal that is produced from transmission data;
 a distortion compensation processing portion comprising:
 a memory portion which stores predistortion distortion compensating process data for a predetermined amplitude correcting process and outputs an amplitude correction signal with respect to the amplitude signal based on the amplitude signal; and
 an amplitude information adjusting portion which adjusts an amplitude of the amplitude signal, and which performs adjustment of the amplitude of the amplitude signal after the amplitude correcting process or an amplitude signal for referring an amplitude correcting process address of the memory portion;
 an amplitude modulating portion which produces an amplitude-modulated signal based on an amplitude signal after the predetermined amplitude correcting process is executed in the distortion compensation processing portion;
 a phase modulating portion which produces a phase-modulated signal in a radio-frequency band based on a signal having at least a phase component of the baseband quadrature signal; and
 an amplifying portion into which the phase-modulated signal is input as an input high-frequency signal and the amplitude-modulated signal is input as a control signal, thereby producing transmission data in the radio-frequency band.

2. The polar modulating circuit according to claim 1,
 wherein the polar coordinate converting portion produces a phase signal from the baseband quadrature signal and outputs the phase signal to the distortion compensation processing portion,
 wherein the memory portion further stores predistortion distortion compensating process data for a predetermined phase correcting process and outputs a phase correction signal with respect to the phase signal based on the amplitude signal, and
 wherein the distortion compensation processing portion further comprises a phase compensating circuit which performs adjustment of the amplitude of the amplitude signal for referring a phase correcting process address of the memory portion.

3. The polar modulating circuit according to claim 1, wherein the distortion compensation processing portion further comprises:
 a phase compensating circuit which adjusts an amplitude of an input signal which is input to the amplifying portion.

4. The polar modulating circuit according to claim 3,
 wherein the polar coordinate converting portion produces a phase signal from the baseband quadrature signal and outputs the phase signal to the distortion compensation processing portion, wherein, in the distortion compensation processing section, the memory portion further stores predistortion distortion compensating process data for a predetermined phase correcting process and outputs a phase correction signal with respect to the phase signal based on the amplitude signal, and wherein the phase compensating circuit adjusts an amplitude of the phase signal after execution of a predetermined phase correcting process by the phase correction signal output from the memory portion and outputs the phase signal to the phase modulating portion after the amplitude adjustment.

5. The polar modulating circuit according to claim 1, wherein the amplitude information adjusting portion is a multiplying circuit which multiplies a predetermined coefficient, and wherein the polar modulating circuit further comprises a coefficient selecting portion which sets the coefficient to be multiplied in the multiplying circuit.

6. The polar modulating circuit according to claim 2, wherein the phase compensating circuit is a calculating circuit which multiplies or adds a predetermined coefficient, and wherein the polar modulating circuit further comprises a coefficient selecting portion which sets the coefficient to be calculation-processed in the calculating circuit.

7. The polar modulating circuit according to claim 5, wherein the polar modulating circuit further comprises an amplitude determining portion which calculates an instantaneous amplitude value of the amplitude signal sampled at constant intervals, and wherein the coefficient selecting portion switches over the coefficient in accordance with the instantaneous amplitude value.

8. The polar modulating circuit according to claim 7, wherein the amplitude determining portion further comprises a function of setting a predetermined threshold based on the plural instantaneous amplitude values and determining increase or decrease of the amplitude signal from a previous sampling timing, and wherein the coefficient selecting portion sets the coefficient in accordance with increase or decrease of the amplitude signal determined by the amplitude determining portion.

9. The polar modulating circuit according to claim 5, wherein the coefficient selecting portion switches over the coefficient in accordance with a transmission output power.

10. The polar modulating circuit according to claim 5, wherein the coefficient selecting portion switches over the coefficient in accordance with a frequency of an input signal of the amplifying portion.

11. The polar modulating circuit according to claim 5, wherein the polar modulating circuit further comprises an environmental temperature detecting portion, and wherein the coefficient selecting portion switches over the coefficient in accordance with a detection signal output from the environmental temperature detecting portion.

12. The polar modulating circuit according to claim 3, wherein the phase compensating circuit performs amplitude adjustment in accordance with a transmission output power.

13. The polar modulating circuit according to claim 3, wherein the phase compensating circuit performs amplitude adjustment in accordance with a frequency of an input signal of the amplifying portion.

14. The polar modulating circuit according to claim 3, wherein the polar modulating circuit further comprises an environmental temperature detecting portion, and wherein the phase compensating circuit performs amplitude adjustment in accordance with a detection signal output from the environmental temperature detecting portion.

15. The polar modulating circuit according to claim 11, wherein the environmental temperature detecting portion is a consumption current detecting portion of the amplifying portion.

16. The polar modulating circuit according to claim 11, wherein the environmental temperature detecting portion is a temperature sensor.

17. The polar modulating circuit according to claim 1, wherein the memory portion stores inverse characteristics of output signal characteristics with respect to a control voltage value in a steady state of the amplifying portion into which an input high-frequency signal of a predetermined amplitude and a predetermined control voltage are input.

18. The polar modulating circuit according to claim 1, wherein the memory portion stores an approximation polynomial of inverse characteristics of output signal characteristics with respect to a control voltage value in a steady state of the amplifying portion into which an input high-frequency signal of a predetermined amplitude and a predetermined control voltage are input.

19. An integrated circuit on which a polar modulating circuit according to claim 1 is mounted.

20. A transmitting apparatus comprising a polar modulating circuit according to claim 1.

21. A transmitting apparatus comprising an integrated circuit according to claim 19.

22. The polar modulating circuit according to claim 4, wherein the phase compensating circuit is a calculating circuit which multiplies or adds a predetermined coefficient, and wherein the polar modulating circuit further comprises a coefficient selecting portion which sets the coefficient to be calculation-processed in the calculating circuit.

23. The polar modulating circuit according to claim 22, wherein the polar modulating circuit further comprises an amplitude determining portion which calculates an instantaneous amplitude value of the amplitude signal sampled at constant intervals, and wherein the coefficient selecting portion switches over the coefficient in accordance with the instantaneous amplitude value.

24. The polar modulating circuit according to claim 23, wherein the amplitude determining portion further comprises a function of setting a predetermined threshold based on the plural instantaneous amplitude values and determining increase or decrease of the amplitude signal from a previous sampling timing, and wherein the coefficient selecting portion sets the coefficient in accordance with increase or decrease of the amplitude signal determined by the amplitude determining portion.

25. The polar modulating circuit according to claim 22, wherein the coefficient selecting portion switches over the coefficient in accordance with a transmission output power.

26. The polar modulating circuit according to claim 22, wherein the coefficient selecting portion switches over the coefficient in accordance with a frequency of an input signal of the amplifying portion.

27. The polar modulating circuit according to claim 22, wherein the polar modulating circuit further comprises an environmental temperature detecting portion, and wherein the coefficient selecting portion switches over the coefficient in accordance with a detection signal output from the environmental temperature detecting portion.

28. The polar modulating circuit according to claim 27, wherein the environmental temperature detecting portion is a consumption current detecting portion of the amplifying portion.

29. The polar modulating circuit according to claim 27, wherein the environmental temperature detecting portion is a temperature sensor.

30. The polar modulating circuit according to claim 14, wherein the environmental temperature detecting portion is a consumption current detecting portion of the amplifying portion.

31. The polar modulating circuit according to claim 14, wherein the environmental temperature detecting portion is a temperature sensor.

32. The polar modulating circuit according to claim 5, wherein the polar modulating circuit further comprises an amplitude determining portion which calculates an instantaneous amplitude value of the amplitude signal sampled at constant intervals, and
wherein the coefficient selecting portion switches over the coefficient in accordance with the instantaneous amplitude value.

33. The polar modulating circuit according to claim 32, wherein the amplitude determining portion further comprises a function of setting a predetermined threshold based on the plural instantaneous amplitude values and determining increase or decrease of the amplitude signal from a previous sampling timing, and
wherein the coefficient selecting portion sets the coefficient in accordance with increase or decrease of the amplitude signal determined by the amplitude determining portion.

34. The polar modulating circuit according to claim 5, wherein the coefficient selecting portion switches over the coefficient in accordance with a transmission output power.

35. The polar modulating circuit according to claim 5, wherein the coefficient selecting portion switches over the coefficient in accordance with a frequency of an input signal of the amplifying portion.

36. The polar modulating circuit according to claim 5, wherein the polar modulating circuit further comprises an environmental temperature detecting portion, and
wherein the coefficient selecting portion switches over the coefficient in accordance with a detection signal output from the environmental temperature detecting portion.

37. The polar modulating circuit according to claim 36, wherein the environmental temperature detecting portion is a consumption current detecting portion of the amplifying portion.

38. The polar modulating circuit according to claim 36, wherein the environmental temperature detecting portion is a temperature sensor.

39. A polar modulating method comprising:
a step of producing an amplitude signal from a baseband quadrature signal that is produced from transmission data;
a step of outputting an amplitude correction signal with respect to the amplitude signal based on the amplitude signal by using a predistortion distortion compensating process data for a predetermined amplitude correcting process;
a step of adjusting the amplitude of an amplitude signal after the amplitude correcting process or an amplitude signal for referring an amplitude correcting process address of the memory step;
a step of producing an amplitude-modulated signal based on the amplitude signal;
a step of producing a phase-modulated signal in a radio-frequency band based on a signal having at least a phase component of the baseband quadrature signal; and
a step of inputting the phase-modulated signal as an input high-frequency signal and inputting the amplitude-modulated signal as a control signal, thereby producing transmission data in the radio-frequency band.

* * * * *

UNITED STATES PATENT AND TRADEMARK OFFICE
CERTIFICATE OF CORRECTION

PATENT NO.         : 7,535,310 B2
APPLICATION NO. : 11/569970
DATED              : May 19, 2009
INVENTOR(S)       : Yoshito Shumizu and Noriaki Saito It is certified that error appears in the above-identified patent and that said Letters Patent is hereby corrected as shown below:

In Column 35, line 61, please delete "compensation" and insert therefor --correction--.

In Column 39, line 5, please delete "SO" and insert therefor --S0--.

Signed and Sealed this

Twenty-fifth Day of August, 2009

David J. Kappos
*Director of the United States Patent and Trademark Office*